(12) United States Patent
Buchwald et al.

(10) Patent No.: US 6,995,594 B2
(45) Date of Patent: *Feb. 7, 2006

(54) PHASE INTERPOLATOR DEVICE AND METHOD

(75) Inventors: Aaron W. Buchwald, Newport Coast, CA (US); Myles Wakayama, Laguna Niguel, CA (US); Michael Le, Irvine, CA (US); Jurgen Van Engelen, Aliso Viejo, CA (US); Xicheng Jiang, Irvine, CA (US); Hui Wang, Irvine, CA (US); Howard A. Baumer, Laguna Hills, CA (US); Avanindra Madisetti, Coto De Caza, CA (US)

(73) Assignee: Broadcom Corporation, Irvine, CA (US)

( * ) Notice: Subject to any disclaimer, the term of this patent is extended or adjusted under 35 U.S.C. 154(b) by 26 days.

This patent is subject to a terminal disclaimer.

(21) Appl. No.: 10/855,392

(22) Filed: May 28, 2004

(65) Prior Publication Data

US 2004/0212416 A1    Oct. 28, 2004

Related U.S. Application Data

(63) Continuation of application No. 10/346,210, filed on Jan. 17, 2003, which is a continuation of application No. 09/844,266, filed on Apr. 30, 2001.

(60) Provisional application No. 60/200,813, filed on Apr. 28, 2000.

(51) Int. Cl.
    *H03H 11/16* (2006.01)
(52) U.S. Cl. ...................... 327/248; 327/361
(58) Field of Classification Search ............... 327/248, 327/250, 231, 233–235, 355, 361
    See application file for complete search history.

(56) References Cited

U.S. PATENT DOCUMENTS 5,396,224 A    3/1995    Dukes et al. .......... 340/825.49

(Continued)

FOREIGN PATENT DOCUMENTS

EP    0 483 439    5/1992

(Continued)

OTHER PUBLICATIONS

Buchwald, A. and Martin, K., "Integrated Fiber-Optic Receivers," Kluwer Academic Publishers, 1994 (entire book submitted).

(Continued)

*Primary Examiner*—Timothy P. Callahan
*Assistant Examiner*—Cassandra Cox
(74) *Attorney, Agent, or Firm*—Sterne, Kessler, Goldstein & Fox P.L.L.C.

(57) ABSTRACT

A high-speed serial data transceiver includes multiple receivers and transmitters for receiving and transmitting multiple analog, serial data signals at multi-gigabit-per-second data rates. Each receiver includes a timing recovery system for tracking a phase and a frequency of the serial data signal associated with the receiver. The timing recovery system includes a phase interpolator responsive to phase control signals and a set of reference signals having different predetermined phases. The phase interpolator derives a sampling signal, having an interpolated phase, to sample the serial data signal. The timing recovery system in each receiver independently phase-aligns and frequency synchronizes the sampling signal to the serial data signal associated with the receiver. A receiver can include multiple paths for sampling a received, serial data signal in accordance with multiple time-staggered sampling signals, each having an interpolated phase.

10 Claims, 38 Drawing Sheets

U.S. PATENT DOCUMENTS

| | | | |
|---|---|---|---|
| 5,485,490 A | 1/1996 | Leung et al. | 375/371 |
| 5,550,546 A | 8/1996 | Noneman et al. | 342/13 |
| 5,554,945 A | 9/1996 | Lee et al. | 327/105 |
| 5,614,855 A | 3/1997 | Lee et al. | 327/158 |
| 5,650,954 A | 7/1997 | Minuhin | 708/819 |
| 5,703,905 A | 12/1997 | Langberg | 375/232 |
| 5,757,857 A | 5/1998 | Buchwald | 375/271 |
| 5,768,268 A | 6/1998 | Kline et al. | 370/330 |
| 5,822,143 A | 10/1998 | Cloke et al. | 360/65 |
| 5,881,107 A | 3/1999 | Termerinac et al. | 375/279 |
| 5,881,108 A | 3/1999 | Herzberg et al. | 375/296 |
| 5,945,862 A | 8/1999 | Donnelly et al. | 327/278 |
| 5,949,820 A | 9/1999 | Shih et al. | 375/229 |
| 5,966,415 A | 10/1999 | Bliss et al. | 375/350 |
| 6,002,279 A | 12/1999 | Evans et al. | 327/144 |
| 6,005,445 A | 12/1999 | Katakura | 331/34 |
| 6,009,534 A | 12/1999 | Chiu et al. | 313/503 |
| 6,038,269 A | 3/2000 | Raghavan | 375/340 |
| 6,122,336 A | 9/2000 | Anderson | 375/371 |
| 6,134,268 A | 10/2000 | McCoy | 375/229 |
| 6,329,859 B1 | 12/2001 | Wu | 327/291 |
| 6,359,486 B1 | 3/2002 | Chen | 327/231 |
| 6,397,048 B1 | 5/2002 | Toda | 455/131 |
| 6,404,525 B1 | 6/2002 | Shimomoura et al. | 398/82 |
| 6,498,694 B1 | 12/2002 | Shah | 360/46 |
| 6,509,773 B2 | 1/2003 | Buchwald et al. | 327/248 |
| 6,621,862 B1 | 9/2003 | Dabell | 375/229 |
| 6,791,388 B2 | 9/2004 | Buchwald et al. | 327/248 |
| 2002/0012152 A1 | 1/2002 | Agazzi et al. | 359/189 |
| 2002/0034222 A1 | 3/2002 | Buchwald et al. | 375/232 |
| 2002/0039395 A1 | 4/2002 | Buchwald et al. | 375/355 |
| 2002/0044617 A1 | 4/2002 | Buchwald et al. | 375/355 |
| 2002/0044618 A1 | 4/2002 | Buchwald et al. | 375/355 |
| 2002/0080898 A1 | 6/2002 | Agazzi et al. | 375/355 |
| 2003/0086515 A1 | 5/2003 | Trans et al. | 375/346 |

FOREIGN PATENT DOCUMENTS

| | | |
|---|---|---|
| EP | 0 515 074 | 11/1992 |
| EP | 0 805 447 A2 | 11/1997 |
| EP | 0 909 035 | 4/1999 |
| EP | 1 006 697 | 6/2000 |
| EP | 1 139 619 | 10/2001 |
| WO | WO 01/29991 | 4/2001 |
| WO | WO 01/54317 | 7/2001 |
| WO | WO 01/65788 | 9/2001 |
| WO | WO 01/84702 | 11/2001 |
| WO | WO 01/84724 | 11/2001 |
| WO | WO 02/13424 | 2/2002 |
| WO | WO 02/071616 | 9/2002 |

OTHER PUBLICATIONS

Sidiropoulos, S. and Horowitz, M., "A Semidigital Dual Delay-Locked Loop," IEEE Journal of Solid-State Circuits, IEEE, vol. 32, No. 11, Nov. 1997, pp. 1683-1692.

Copy of International Search Report issued Jan. 24, 2002, for Appln. No. PCT/US01/13613, 7 pages.

Copy of International Search Report issued Apr. 11, 2002, for Appln. No. PCT/US01/13637, 2 pages.

Black, Jr., W. and Hodges, D., "Time Interleaved Converter Arrays," IEEE Journal of Solid-State Circuits, IEEE, vol. SC-15, No. 6, Dec. 1980, pp. 1022-1029.

Conroy, C. et al., "An 8-b 85-MS/s Parallel Pipeline A/D Converter in 1-$\mu$m CMOS," IEEE Journal of Solid-State Circuits, IEEE, vol. 28, No. 4, Apr. 1993, pp. 447-454.

Dally, W. and Poulton, J., "Transmitter Equalization for 4Gb/s Signalling," Proceedings of Hot Interconnects IV, Palo Alto, CA, 1996, 10 pages.

Ellersick, W. et al., "A Serial-Link Transceiver Based on 8GSample/s A/D and D/A Converters in 0.25$\mu$m CMOS," IEEE International Solid-State Circuits Conference, IEEE, 2001, p. 58-59 and 430.

Ellersick, W. et al., "GAD: A 12/GS/s CMOS 4-bit A/D Converter for an Equalized Multi-Level Link," Symposium on VLSI Circuits Digest of Technical Papers, 1999, pp. 49-52.

Eklund, J-E. and Gustafsson, F., "Digital Offset Compensation of Time-Interleaved ADC Using Random Chopper Sampling," IEEE International Symposium on Circuits and Systems, IEEE, May 28-31, 2000, pp. III-447 thru III-450.

Fu, D. et al., "A Digital Background Calibration Technique for Time-Interleaved Analog-to-Digital Converters," IEEE Journal of Solid-State Circuits, IEEE, vol. 33, No. 12, Dec. 1998, pp. 1904-1911.

Guizani, M. and Al-Ali, A., "PC-Compatible Optical Data Acquisition Unit," Instrumentation and Measurement Technology Conference, IEEE, May 10-12, 1994, pp. 1099-1102.

Jenq, Y.-C., "Digital Spectra of Nonuniformly Sampled Signals: A Robust Sampling Time Offset Estimation Algorithm for Ultra High-Speed Waveform Digitizers Using Interleaving" Transactions on Instrumentation and Measurement, IEEE, vol. 39, No. 1, Feb. 1990, pp. 71-75.

Mason, R. and Taylor, J.T., "High-Speed Electro-Optic Analogue to Digital Converters," IEEE International Symposium on Circuits and Systems, IEEE, 1993, pp. 1081-1084.

Niewczas, P. et al., "Error Analysis of an Optical Current Transducer Operating with a Digital Signal Processing System," IEEE Transactions on Instrumentation and Measurement, IEEE, vol. 49, No. 6, Dec. 2000, pp. 1254-1259.

Petraglia, A. and Mitra, S., "Analysis of Mismatch Effects Among A/D Converters in a Time-Interleaved Waveform Digitizer," IEEE Transactions on Instrumentation and Measurement, IEEE, vol. 40, No. 5, Oct. 1991, pp. 831-835.

Sauer-Greff, W. et al., Maximum-Likelihood Sequence Estimation of Nonlinear Channels in High-Speed Optical Fiber Systems, Apr. 6, 2001, Retrieved from the Internet at http://www.ftw.at/Dokumente/010406a.pdf, 29 pages.

Williamson, R.C. et al., "Effects of Crosstalk in Demultiplexers for Photonic Analog-to-Digital Converters," Journal of Lightwave Technology, IEEE, vol. 19, No. 2, Feb. 2001, pp. 230-236.

Yang, C-K., Design Techniques for High-Speed Chip-to-Chip Links, Retrieved from the Internet at http://web.doe.carleton.ca/courses/97578/topic5/Tutorial_SerialLink.pdf, 31 pages.

Yang, C-K. et al., "A Serial-Link Transceiver Based on 8-Gsamples/s A/D and D/A Converters in 0.25$\mu$m CMOS," IEEE Journal of Solid-State Circuits, IEEE, vol. 36, No. 11, Nov. 2001, pp. 1684-1692.

Zuoxi, T., "Implementation of a Digital Multibeam Receiver Based on TMS320C80 for Laser Optoacoustic Remote Sensing," Proceedings of ICSP2000, IEEE, 2000, pp. 2082-2084.

Agazzi, O. and Lenosky, T., Algorithm to Postprocess Measured Data, IEEE 802.3ae Equalization Ad Hoc Group, Jan. 10, 2001, 11 pages.

Agazzi, O., A Link Model for Equalized Optical Receivers, IEEE 802.3ae Equalization Ad Hoc Group, Mar. 11, 2001, 30 pages.

Agazzi, O. et al., *DSP-Based Equalization for Optical Channels: Feasibility of a VLSI Implementation*, IEEE 802.3ae, New Orleans, Sep. 12-14, 2000, 39 pages.

Agazzi, O. et al., *Interim Observations on Multimode Optical Channels*, IEEE 802.3ae—Equalization Ad Hoc, Tampa, Nov. 5, 2000, 29 pages.

Agazzi, O. et al., *Measurements of DMD-Challenged Fibers at 3.125Gb/s*, IEEE 802.3ae Equalization Ad Hoc, Jan. 10, 2001, 33 pages.

Agazzi, O. and Lenosky, T., "Measurement of Non-Stationarity of 10 Gb/s Multimode Fiber Links," Nov. 24, 2000, 5 pages.

Agazzi, O., *10 Gb/s PMD Using PAM-5 Modulation*, IEEE 802.3, Dallas, Jan. 18-20, 2000, 19 pages.

Agazzi, O. et al., *10 Gb/s PMD Using PAM-5 Trellis Coded Modulation*, IEEE 802.3, Alburquerque, Mar. 6-10, 2000, 38 pages.

Bhatt, V., *Equalization Ad Hoc Concluding Report*, IEEE P802-3ae Plenary, Mar. 2001, 12 pages.

Bingham, J.A.C., "Multicarrier Modulation for Data Transmission: An Idea Whose Time Has Come," *IEEE Communications Magazine*, IEEE, vol. 28, No. 5, pp. 5-8 and 11-14.

Chiddix, J. et al., "AM Video on Fiber in CATV Systems: Need and Implementation," *IEEE Journal on Selected Areas in Communications*, IEEE, vol. 8, No. 7, Sep. 1990, pp. 1229-1239.

Darcie, T., "Subcarrier Multiplexing for Lightwave Networks and Video Distribution Systems," *IEEE Journal on Selected Areas in Communications*, IEEE, vol. 8, No. 7, Sep. 1990, pp. 1240-1248.

Fettweis, G., "High-Rate Viterbi Processor: A Systolic Array Solution," *IEEE Journal on Selected Areas in Commmunications*, IEEE, vol. 8, No. 8, Oct. 1990, pp. 1520-1534.

Fettweis, G., "Parallel Viterbi Algorithm Implementation: Breaking the ACS-Bottleneck," *IEEE Transactions on Communications*, IEEE, vol. 37, No. 8, Aug. 1989, pp. 785-790.

Forney, Jr., G.D., "The Viterbi Algorithm," *Proceedings of the IEEE*, IEEE, vol. 61, No. 3, Mar. 1973, pp. 268-278.

Frazier, H., *IEEE 802.3 Higher Speed Study Group*, IEEE 802.3 HSSG, Kauai, Hawaii, Nov. 9, 1999, 24 pages.

Giaretta, G. and Lenosky, T., *Adaptive Equalization of DMD Challenged Multimode Fiber at 1300 nm*, IEEE P802.3ae Plenary, Mar. 11, 2001, 10 pages.

Hatamian, M. et al., "Design Considerations for Gigabit Ethernet 1000Base-T Twisted Pair Transceivers," *IEEE 1998 Custom Integrated Circuits Conference*, IEEE, 1998, pp. 335-342.

Isaacs, M et al., *Measurements of Fiber Responses at 5 Gb/s Data Rate Using 850nm VCSELs*, IEEE 802.3ae Equalization Ad Hoc, Mar. 11, 2001, 18 pages.

Kanno, N. and Ito, K., "Fiber-Optic Subcarrier Multiplexing Video Transport Employing Multilevel QAM," *IEEE Journal on Selected Areas in Communications*, IEEE, vol. 8, No. 7, Sep. 1990, pp. 1313-1319.

Kasper, B.L., "Equalization of Multimode Optical Fiber Systems," *The Bell System Technical Journal*, American Telephone and Telegraph Company, vol. 61, No. 7, Sep. 1982, pp. 1367-1388.

Kasturia, S. and Winters, J., "Techniques for High-Speed Implementation of Nonlinear Cancellation," *IEEE Journal on Selected Areas in Communications*, IEEE, vol. 9, No. 5, Jun. 1991, pp. 711-717.

Lenosky, T., *A Unified Method of Calculating PMD-induced Pulse Broadening*, IEEE 802.3ae Equalization Ad Hoc Meeting, Tampa, Florida, Nov. 5, 2000, 8 pages.

Lenosky, T. and Giaretta, G., *Five Gb/s Multimode DMD at 850 nm: Real-Time Data and Equalizer Simulations*, Finisar Corporation, Mar. 11, 2001, 13 pages.

Lenosky, T. et al., *Measurements of DMD-Challenged Fibers at 850nm and 2Gb/s Data Rate*, IEEE 802.3ae—Equalization Ad Hoc Group, Jan. 10, 2001, 21 pages.

Lenosky, T. et al., *Measurements of DMD-Challenged Fibers at 1310nm and 1 Gb/s Data Rate*, IEEE 802.3ae—Equalization Ad Hoc Group, Jan. 10, 2001, 21 pages.

Liu, M-K. and Modestou, P., "Multilevel Signaling and Pulse Shaping for Spectrum Efficiency in Subcarrier Multiplexing Transmission," *IEEE Journal of Lightwave Technology*, IEEE, vol. 12, No. 7, pp. 1239-1246.

Olshansky, R. et al., "Subcarrier Multiplexed Coherent Lightwave Systems for Video Distribution," *IEEE Journal on Selected Areas in Communications*, IEEE, vol. 8, No. 7, Sep. 1990, pp. 1268-1275.

Olshansky, R. et al., "Subcarrier Multiplexed Lightwave Systems for Broadband Distribution," *IEEE Journal of Lightwave Technology*, IEEE, vol. 7, No. 9, Sep. 1989, pp. 1329-1341.

Otte, S. and Rosenkranz, W., "A Decision Feedback Equalizer for Dispersion Compensation in High Speed Optical Transmission Systems," *International Conference on Transparent Optical Networks*, IEEE, 1999, pp. 19-22.

Parhi, K. et al., *Parallel Implementation of the DSP Functions of the PAM-5 10Gb/s Transceiver*, IEEE 802.3ae Task Force, Mar. 2000, 12 pages.

Peral, E. et al., *Measurements of time variation in DMD-challenged multimode fiber at 1310nm for 10GE equalizer applications*, IEEE P802.3ae Equalization Ad Hoc, IEEE, Mar. 2001, 19 pages.

Personick, S.D., "Baseband Linearity and Equalization in Fiber Optic Digital Communication Systems," *Bell System Technical Journal*, American Telephone and Telegraph Company, vol. 52, No. 7, Sep. 1973, pp. 1175-1194.

Personick, S.D., "Receiver Design for Digital Fiber Optic Communication Systems, I," *Bell System Technical Journal*, American Telephone and Telegraph Company, vol. 52, No. 6, Jul.-Aug. 1973, pp. 843-874.

Personick, S.D., "Receiver Design for Digital Optic Systems," *National Telecommunications Conference*, IEEE, Atlanta, Georgia, Nov. 26-28, 1973, vol. 1, pp. 8E-1-8E-4.

Vorenkamp, P. et al., *Analog Interface for 10-Gb/s Ethernet*, IEEE 802.3ae Task Force, Mar. 2000, 13 pages.

Winters, J. and Gitlin, R., "Electrical Signal Processing Techniques in Long-Haul Fiber-Optic Systems," *IEEE Transactions on Communications*, IEEE, vol. 38, No. 9, Sep. 1990, pp. 1439-1453.

Winters, J. et al., "Reducing the Effects of Transmission Impairments in Digital Fibert Optic Systems," *IEEE Communications Magazine*, IEEE, Jun. 1993, pp. 68-76.

*Progress Report on Equalization of Multimode Fibers*, IEEE 802.3ae Ad Hoc Group on Equalization, Jan. 12, 2001, 16 pages.

Alderrou, D. et al., *XAUI/XGXS Proposal*, IEEE 802.3ae Task Force, May 23-25, 2000, 28 pages.

Winters, J.H. and Gitlin, R., "Electrical Signal Processing Techniques in Long-Haul, Fibert-Optic Systems," *IEEE International Conference on Communications*, IEEE, vol. 1, Apr. 16-19, 1990, pp. 0397-0403.

FIG. 6B

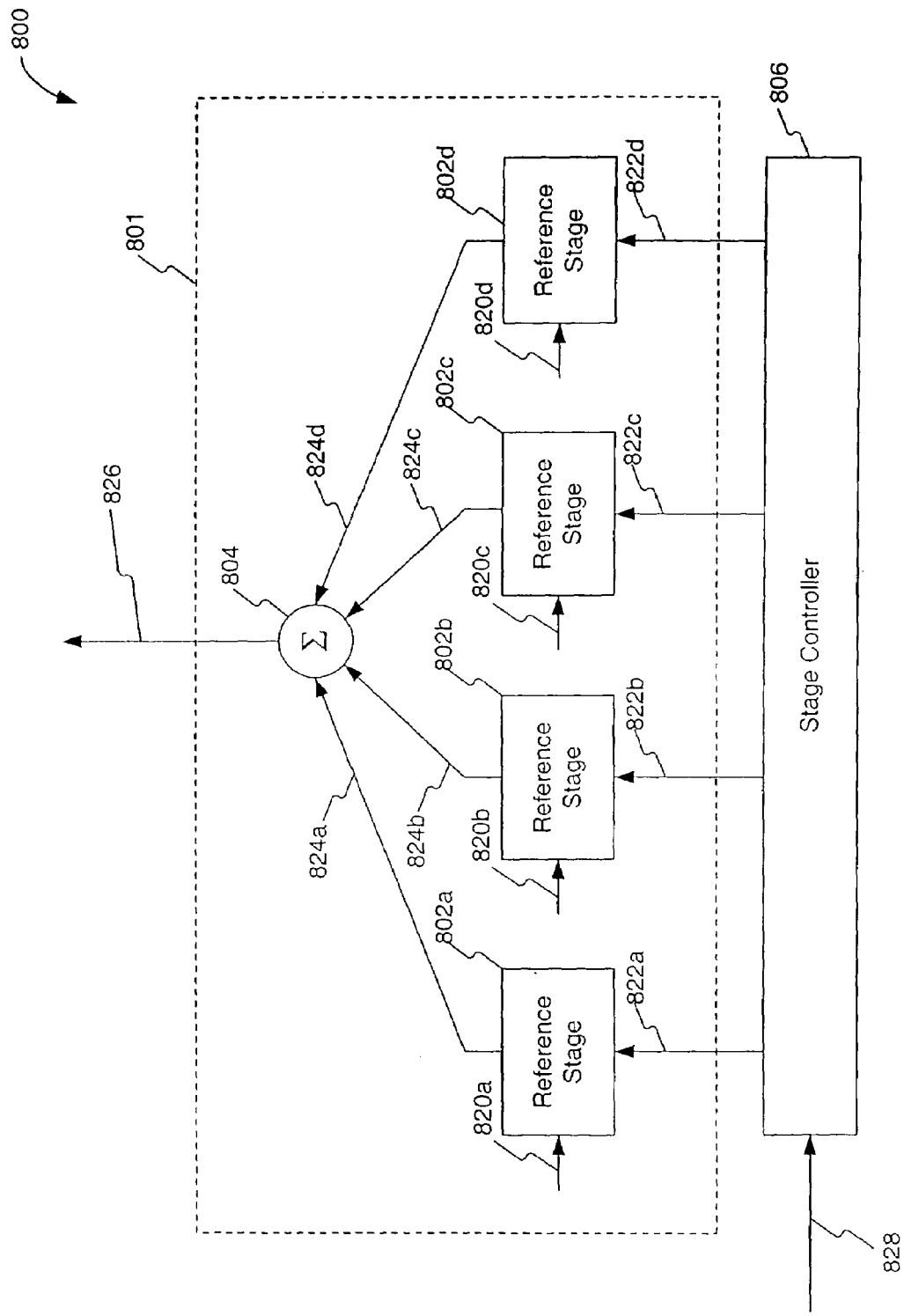

PHASE INTERPOLATOR DEVICE AND METHOD

CROSS-REFERENCES TO RELATED APPLICATIONS

This application is a continuation of U.S. Non-Provisional application Ser. No. 10/346,210, filed Jan. 17, 2003, entitled "Phase Interpolator Device and Method," which is a continuation of U.S. Non-Provisional application Ser. No. 09/844,266, filed Apr. 30, 2001, entitled "Phase Interpolator Device and Method," which claims priority to U.S. Provisional Application No. 60/200,813, filed Apr. 28, 2000, entitled "High-Speed Serial Transceiver," all of which are incorporated herein by reference in their entireties.

BACKGROUND OF THE INVENTION

1. Field of the Invention

The present invention relates generally to data transceivers.

2. Background Art

A communication device including a transmitter and a receiver is known as a transceiver. Known transceivers can transmit and receive data signals. There are demands on such transceivers to transmit and receive such data signals with low error rates and at ever increasing data rates, to reduce power dissipation, cost, and size. Therefore, there is a general need for a transceiver capable of satisfying such demands.

It is desirable to integrate transceiver circuits on an integrated circuit (IC) chip to reduce size and power dissipation of the transceiver. The circuits on the IC chip typically operate in accordance with timing signals. However, oscillators used to generate such timing signals have disadvantages, including typically large sizes, high power dissipation, and deleterious electromagnetic radiative properties (that is, the oscillators tend to radiate electromagnetic interference across the IC chip). Also, oscillators used in communication devices often need to be tunable in both phase and frequency and in response to rapidly changing signals. This requires complex oscillator circuitry. Moreover, multiple oscillators on a common IC chip are subjected to undesired phenomena, such as phase and/or frequency injection locking, whereby one oscillator can deleteriously influence the operation of another oscillator.

Therefore, there is a general need to integrate transceiver circuits on an IC chip. There is a related need to reduce the number and complexity of oscillators constructed on the IC chip, to thereby avoid or substantially reduce all of the above-mentioned disadvantages associated with such oscillators.

To reliably process a received data signal, a receiver typically needs to match its operating characteristics with the characteristics of the received data signal. For example, in the case of baseband data transmissions, the receiver can derive a sampling signal, and then use the sampling signal to sample the received data signal at sample times that produce optimal data recovery. In this way, data recovery errors can be minimized.

Precision timing control techniques are required to achieve and maintain such optimal sampling times, especially when the received data signals have high data rates, such as multi-gigabit-per-second data rates. Such timing control includes control of the phase and frequency of a sampling signal used to sample the received data signal.

As the received data signal rate increases into the multi-gigabit-per-second range, the difficulty in effectively controlling sampling processes in the receiver (such as controlling phase and frequency characteristics of the sampling signal) correspondingly increases. For example, semiconductor circuits, such as complementary metal oxide semiconductor (CMOS) circuits, are often unable to operate at sufficiently high frequencies to optimally control the sampling processes. For example, it becomes increasingly difficult at such high received signal data rates to provide sufficiently short time delays usable for controlling sampling phases of the sampling signal.

Accordingly, there is a need for systems and techniques in a data receiver that provide effective sampling of high data rate signals. There is a related need to reduce the number of circuit components required to provide such effective data signal sampling, thereby reducing cost, size, and power dissipation in the data receiver.

BRIEF SUMMARY OF THE INVENTION

I. Phase Interpolator

The present invention is directed to a phase interpolation system. The phase interpolation system includes a stage controller adapted to produce a plurality of stage control signals, and a plurality of reference stages that are each adapted to convert one of a plurality of reference signals into a corresponding component signal. Each reference stage performs this conversion in response to a respective one of the stage control signals. Each of the component signals has a distinct phase that is determined by the corresponding reference signal phase.

The phase interpolation system also includes a combining node that is adapted to combine (e.g., sum) the component signals into an output signal having an interpolated phase.

Each of the plurality of reference stages may include a conversion module and one or more scaling modules. The conversion module is adapted to convert the corresponding reference signal into the corresponding component signal according to a scaling factor. The one or more scaling modules are adapted to adjust the scaling factor in response to a value of the corresponding stage control signal.

Each of the stage control signals may include a plurality of binary control subsignals. In this embodiment, the value of each stage control signal is the sum of the corresponding binary control signals. Each of these subsignals may be received by one of a plurality of scaling modules. As a result, the scaling factor of the respective reference stage increases with the value of the corresponding stage control signal.

In a specific implementation, four reference stages are each adapted to convert one of four reference signals into a corresponding component signal in response to a respective one of the stage control signals. These four reference signals each have one of four phases that are separated at substantially 90 degrees intervals.

The conversion module of each reference stage may include a transconductance device, such as a field effect transistor (FET).

The output signal as well as each of the reference and component signals may be differential signals.

The stage controller may be a phase control signal rotator adapted to adjust the plurality stage control signals such that the output signal is phase aligned with a serial data signal.

Without the use of conventional techniques, such as time-delays, the phase interpolator advantageously provides output signal phases that span a complete rotation of 360 degrees.

II. Timing Recovery System

A receiver of the present invention includes a timing recovery system to recover timing information from a received serial data signal. The receiver uses such recovered timing information to compensate for frequency and phase offsets that can occur between the received serial data signal and a receiver sampling signal used to sample the serial data signal. The timing recovery module of the present invention recovers/extracts phase and frequency information from the received serial data signal. The timing recovery module derives the sampling signal using the phase and frequency information. The timing recovery module phase aligns and frequency synchronizes the sampling signal with the serial data signal to enable the receiver to optimally sample the serial data signal.

The timing recovery system of the present invention includes a phase interpolator. The phase interpolator derives a sampling signal having an interpolated phase in response to 1) phase control inputs derived by the timing recovery system, and 2) a set of reference signals derived from a master timing signal. The timing recovery system causes the interpolator to align the interpolated phase of the sampling signal with the serial data signal phase. In addition, the timing recovery system can cause the interpolator to rotate the interpolated phase of the sampling signal at a controlled rate to synchronize the sampling signal frequency to the serial data signal frequency.

The present invention advantageously simplifies a master oscillator used to generate the master timing signal (mentioned above) because the phase interpolator, not the oscillator, tunes the phase and frequency of the sampling signal. In other words, the master oscillator need not include complex phase and frequency tuning circuitry, since the need for such functionality is met using the timing recovery system. Additionally, multiple, independent timing recovery systems can operate off of a single, common master timing signal, and thus, a single master oscillator. This advantageously reduces to one the number of master oscillators required in a multiple receiver (that is, channel) environment on an IC chip. In such a multiple receiver environment, each of the multiple independent timing recovery systems (and interpolators) can be associated with each one of the multiple receivers. Each timing recovery system can track the phase and frequency of an associated one of multiple receive data signals, thus obviating the need for more than one oscillator.

In one embodiment, the present invention is directed to a system for recovering timing information from a serial data signal. The system comprises a phase interpolator adapted to produce a timing signal having an interpolated phase responsive to a plurality of phase control signals. The system further comprises a phase controller adapted to derive a rotator control signal based on a phase offset between the received data signal and the timing signal. The system further comprises a phase control signal rotator adapted to rotate the plurality of phase control signals and correspondingly the interpolated phase of the timing signal in response to the rotator control signal. The phase controller is adapted to cause the phase control signal rotator to rotate the plurality of phase control signals and correspondingly the interpolated phase of the timing signal in a direction to reduce the phase offset between the received data signal and the timing signal. The rotator control signal is one of a phase-advance, a phase-retard, and a phase-hold signal. The phase control signal rotator rotates the plurality of phase controls signals in a first direction to advance the interpolated phase of the timing signal in response to the phase-advance signal, rotates the plurality of phase controls signals in a second direction to retard the interpolated phase in response to the phase-retard signal, and prevents the plurality of phase control signals and correspondingly the interpolated phase from rotating in response to the phase-hold signal.

In another embodiment, the present invention is directed to a method of recovering timing information from a serial data signal. The method comprises deriving a timing signal having an interpolated phase in response to a plurality of phase control signals, deriving a rotator control signal based on a phase offset between the received data signal and the timing signal, and rotating the plurality of phase control signals and correspondingly the interpolated phase of the timing signal in response to the rotator control signal.

In still another embodiment, the present invention is directed to a system for recovering timing information from a serial data signal. The system comprises a phase interpolator adapted to derive a sampling signal having an interpolated phase based on a plurality of control signals. The system further comprises a controller coupled to the phase interpolator. The controller includes a phase error processor adapted to derive an estimate of a frequency offset between the sampling signal and the serial data signal. The controller causes the phase interpolator to rotate the interpolated phase of the sampling signal at a rate corresponding to the frequency offset so as to reduce the frequency offset between the sampling signal and the serial data signal.

In yet another embodiment, the present invention is directed to a method of recovering timing information from a serial data signal. The method comprises deriving a sampling signal having an interpolated phase, estimating a frequency offset between the sampling signal and the serial data signal, and rotating the interpolated phase of the sampling signal at a rate corresponding to the frequency offset, thereby reducing the frequency offset between the sampling signal and the serial data signal. The method also comprises repetitively rotating the interpolated phase of the sampling signal through a range of phases spanning ° at the rate corresponding to the frequency offset. The method also comprises rotating the interpolated phase of the sampling signal in a direction of increasing phase to decrease a frequency of the sampling signal when the frequency of the sampling signal is greater than a frequency of the serial data signal, and rotating the interpolated phase of the sampling signal in a direction of decreasing phase to increase a frequency of the sampling signal when the frequency of the sampling signal is less than the frequency of the serial data signal.

III. High-Speed Serial Data Transceiver

The present invention provides a multiple-receiver transceiver (also referred to as a multi-channel transceiver), on an IC chip. This is also referred to herein as a multi-channel communication device, on an IC chip. The communication device advantageously includes only a single master timing generator (that is, oscillator module), to reduce power consumption, size, part count and complexity, and avoid problems associated with multiple oscillator architectures, such as those described above. Each receiver in the communication device can process (that is, recover data from) a respective received, analog serial data signal having a multi-gigabit-per-second data rate. Each receiver is associated with an independently operating timing recovery system, including a phase interpolator, for phase and frequency tracking the respective received, analog serial data signal.

In an embodiment, the present invention is directed to a communication device on an IC chip. The communication device comprises a master signal generator adapted to generate a master timing signal, and a receive-lane adapted to receive an analog serial data signal. The receive-lane includes a sampling signal generator adapted to generate multiple time-staggered sampling signals based on the master timing signal, and multiple data paths each adapted to sample the serial data signal in accordance with a corresponding one of the time-staggered sampling signals. The multiple data paths thereby produce multiple time-staggered data sample streams. The communication device also includes a data demultiplexer module adapted to time-deskew and demultiplex the multiple time-staggered data streams. The serial data signal has a multi-gigabit symbol rate. Each of the time-staggered sampling signals, and correspondingly, each of the time-staggered data sample streams, has a data rate below the multi-gigabit symbol rate. The data demultiplexer is adapted to produce a demultiplexed data sample stream representative of the serial data signal having the multi-gigabit symbol rate.

In another embodiment, the present invention is directed to a method in a communication device. The method comprises generating a master timing signal, and generating multiple time-staggered sampling signals based on the master timing signal. The method further comprises sampling a received, analog serial data signal in accordance with each of the multiple time-staggered sampling signals, thereby producing multiple time-staggered data sample streams. The method further comprises time-deskewing the multiple time-staggered data streams to produce multiple time-deskewed data streams, and demultiplexing the multiple time-deskewed data streams.

In yet another embodiment, the present invention is directed to a communication device on an IC chip. The device is configured to receive multiple, analog serial data signals. The device comprises a master timing generator adapted to generate a master timing signal. The device also includes multiple receive-lanes, each configured to receive an associated one of the multiple serial data signals. Each receive-lane includes a phase interpolator adapted to produce a sampling signal having an interpolated phase, and a data path adapted to sample and quantize the associated serial data signal in accordance with the sampling signal. The device also includes an interpolator control module coupled to each receive-lane. The interpolator control module is adapted to cause the phase interpolator in each receive-lane to rotate the interpolated phase of the sampling signal in the receive-lane at a rate corresponding to a frequency offset between the sampling signal and the serial data signal associated with the receive-lane, so as to reduce the frequency offset between the sampling signal and the serial data signal.

In an even further embodiment, the present invention is directed to a method in a communication device configured to receive multiple serial data signals. The method comprises generating a master timing signal, and deriving multiple sampling signals based on the master timing signal. Each of the multiple sampling signals is associated with one of the multiple serial data signals and each of the sampling signals has an interpolated phase. The method further comprises sampling and quantizing each of the multiple serial data signals according to the associated one of the sampling signals. The method also comprises rotating the interpolated phase of each sampling signal at a rate corresponding to a frequency offset between the sampling signal and the serial data signal associated with the receive-lane so as to reduce the frequency offset between the sampling signal and the serial data signal. The method also comprises rotating each interpolated sampling signal phase independently of the other one or more interpolated sampling signal phases.

Terminology

The sampling signal (mentioned above) and the serial data signal are considered "phase-aligned" when their respective phases are such that the sampling signal causes the serial data signal to be sampled at or acceptably near an optimum sampling time for sampling the serial data signal.

"Frequency synchronized" or "frequency matched" means the frequencies of the sampling signal and serial data signal are related to one another such that the sampling signal and the serial data signal do not tend to "drift" in time relative to one another. For example, once initially phase-aligned, the sampling signal and the serial data signal will remain phase-aligned over time as long as the sampling signal and the serial data signal are frequency synchronized. An exemplary frequency matching condition corresponds to when the frequency of the serial data signal is an integer multiple (that is, one, two, etc.) of the frequency of the sampling signal.

When the sampling signal and the serial data signal are "frequency offset" from one another, the two signals are not frequency synchronized. "Nulling" such a frequency offset causes the sampling and serial data signals to be frequency synchronized.

The above defined terms "phase-aligned," "frequency synchronized," "frequency matched," "frequency offset," and "nulling" shall be construed to be consistent with their usage in the following description.

BRIEF DESCRIPTION OF THE DRAWINGS/FIGURES

The present invention will be described with reference to the accompanying drawings. In the drawings, like reference numbers generally indicate identical, functionally similar, and/or structurally similar elements. The drawing in which an element first appears is indicated by the leftmost digit(s) in the reference number.

Figure 4A:
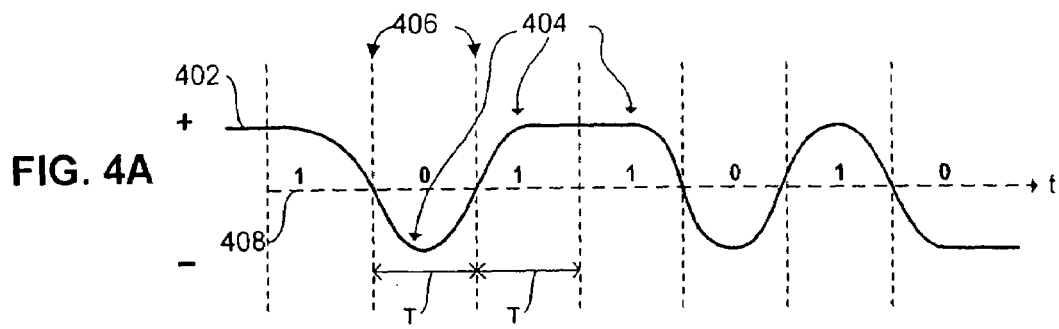
FIG. 4A is an illustration of an example analog serial data signal waveform.
Figure 4B:
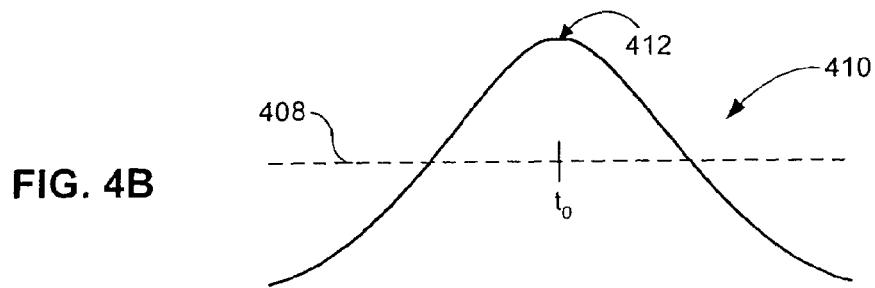
FIG. 4B is an illustration of an example symbol of the serial data signal of FIG. 4A.
Figure 4C:
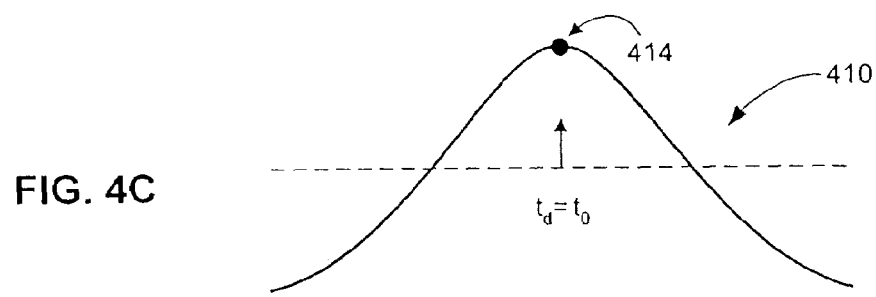
Figure 4D:
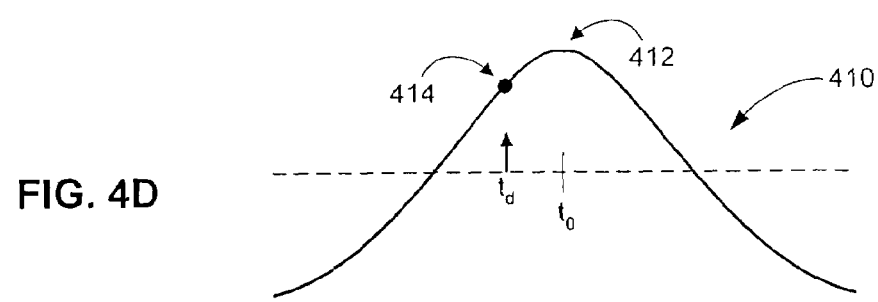
Figure 4E:
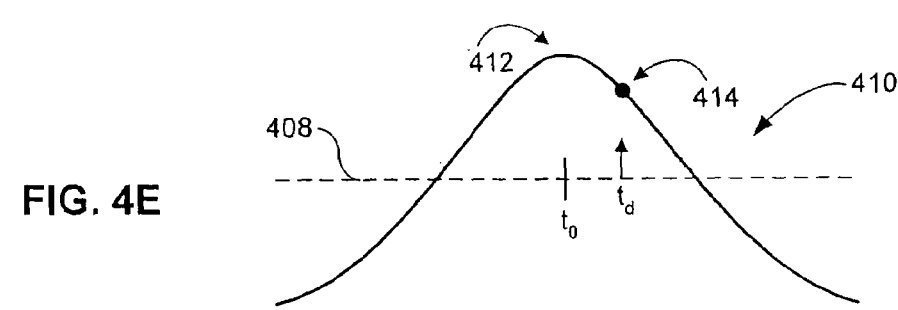

FIGS. 4C, 4D, and 4E are illustrations of three different data sampling time scenarios.

Figure 5A:
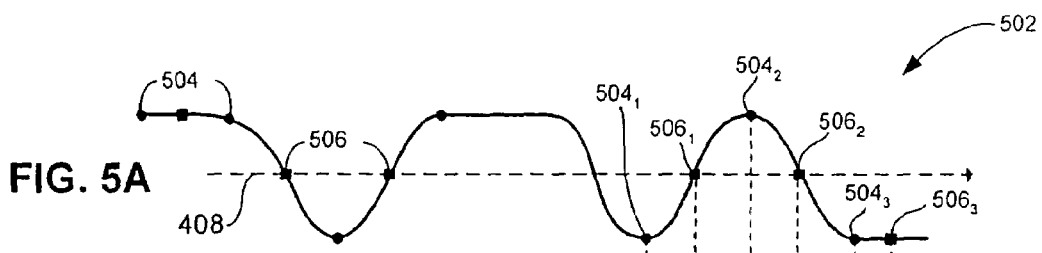

FIG. 5A is a sampled waveform corresponding to the waveform of FIG. 4A.

Figure 5B:
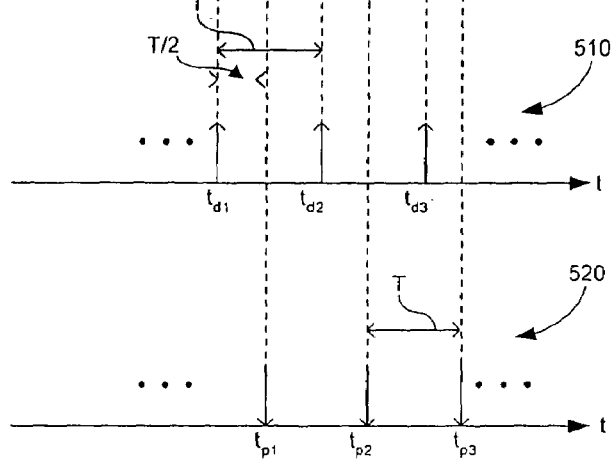
Figure 5C:
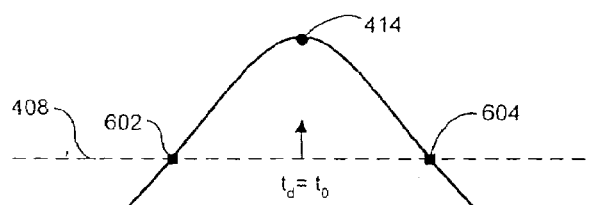

FIGS. 5B and 5C are example illustrations of data and phase sample time lines.

Figure 6A:
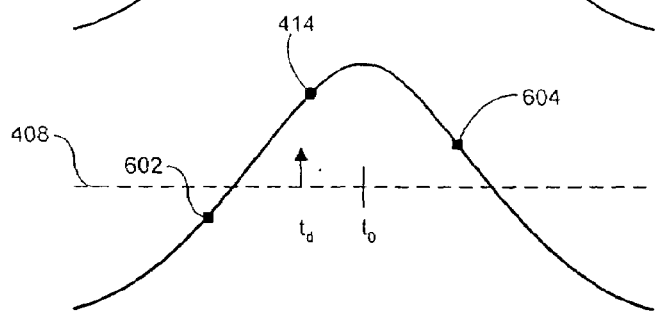
Figure 6C:
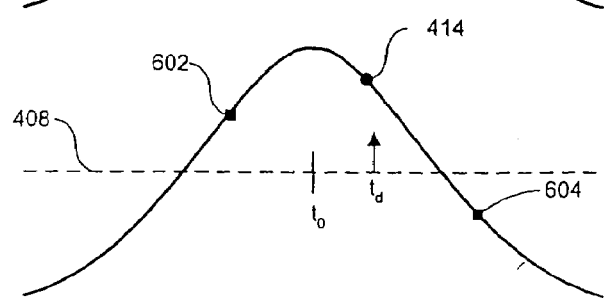

FIGS. 6A, 6B, and 6C are illustrations of three different sampling time scenarios.

Figure 7:
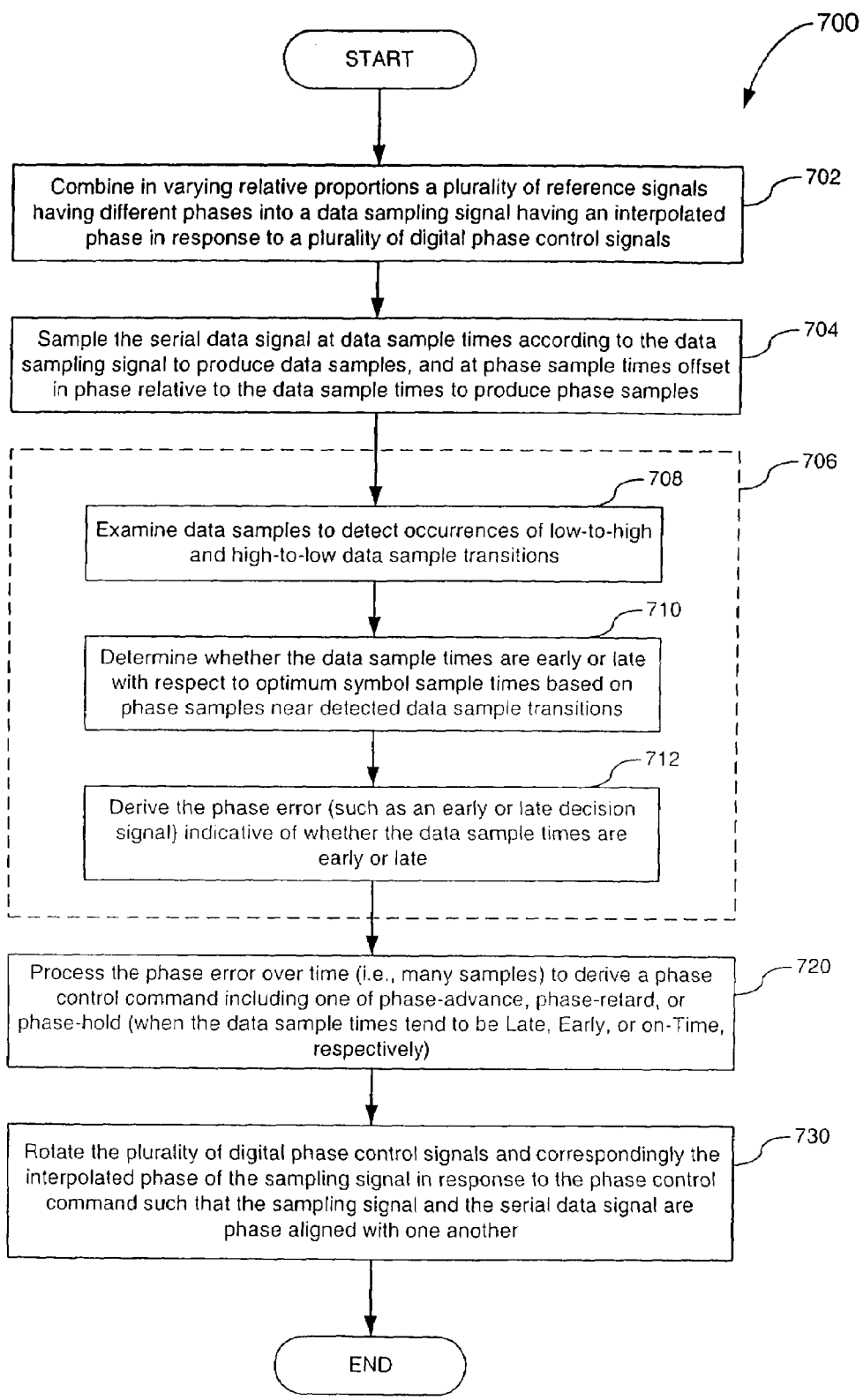

FIG. 7 is a flow diagram of an example method of recovering timing information from a serial data signal.

Figure 7A:
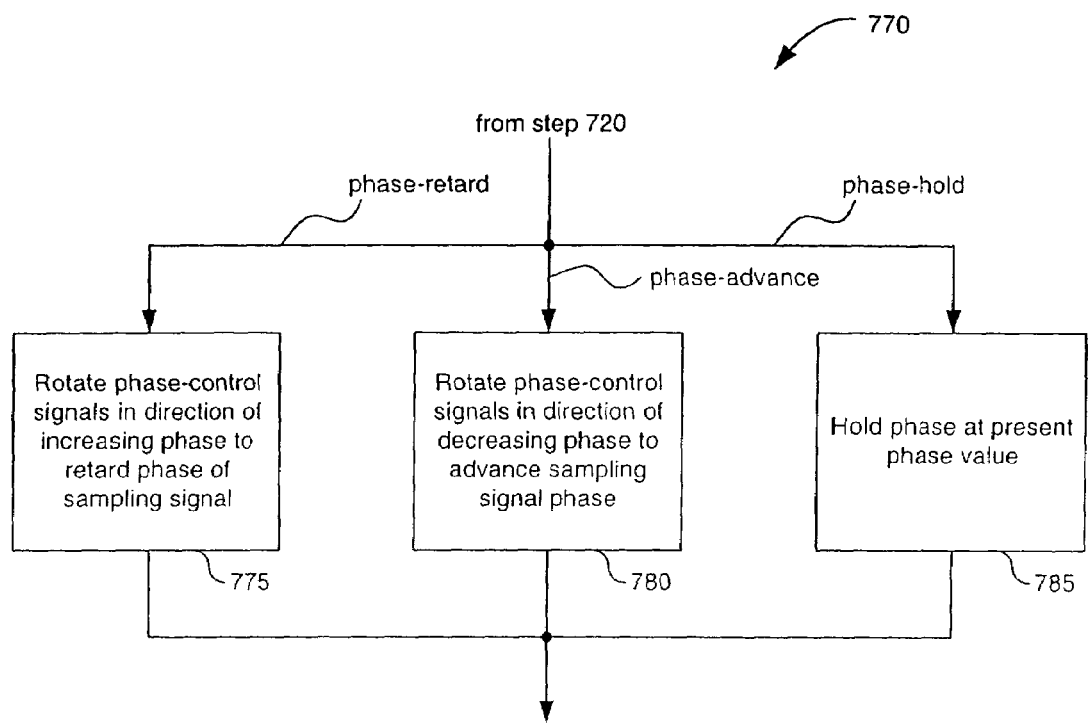

FIG. 7A is a flow chart of an example method expanding on a phase rotating step of the method of FIG. 7.

FIG. 8 is a block diagram of a phase interpolation environment.

Figure 9:
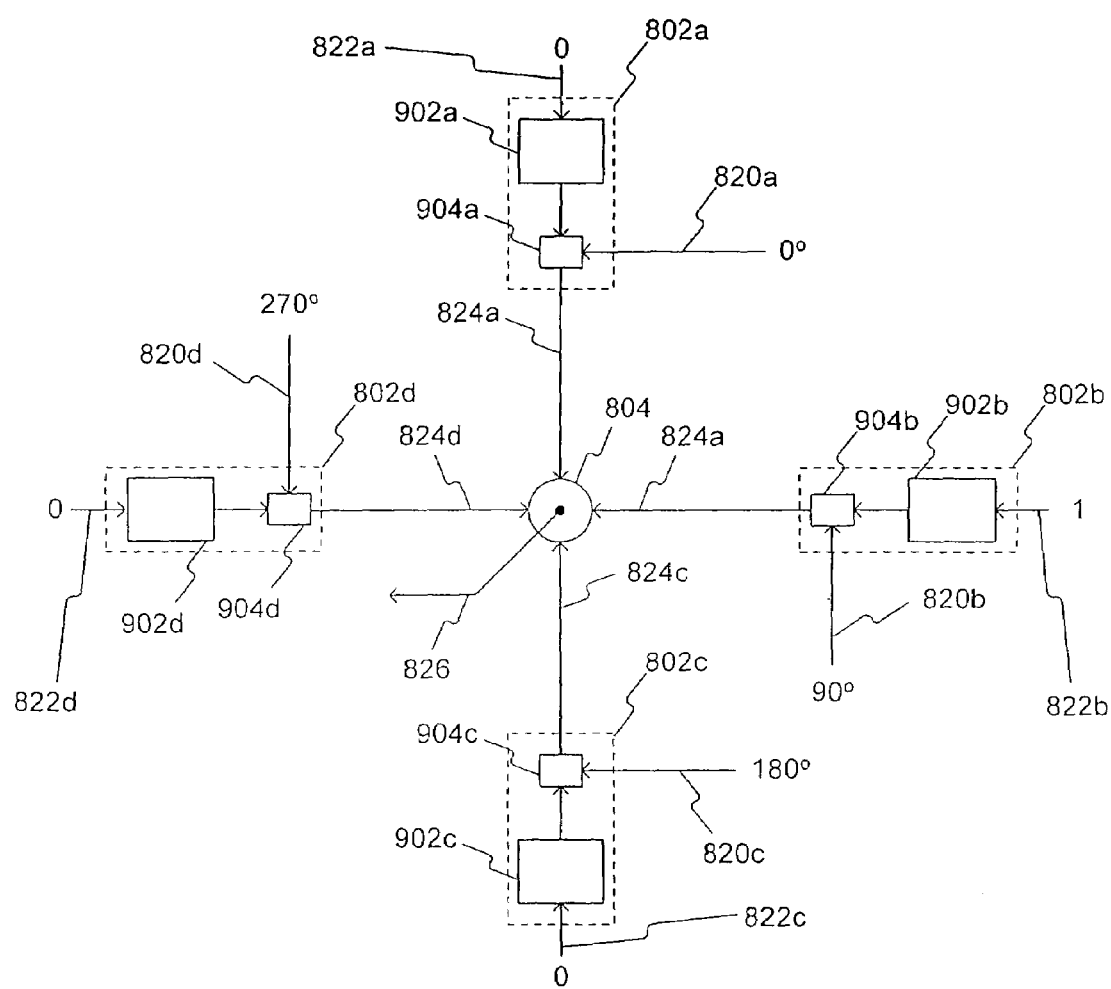

FIG. 9 is a block diagram of a first phase interpolator implementation.

Figure 10:
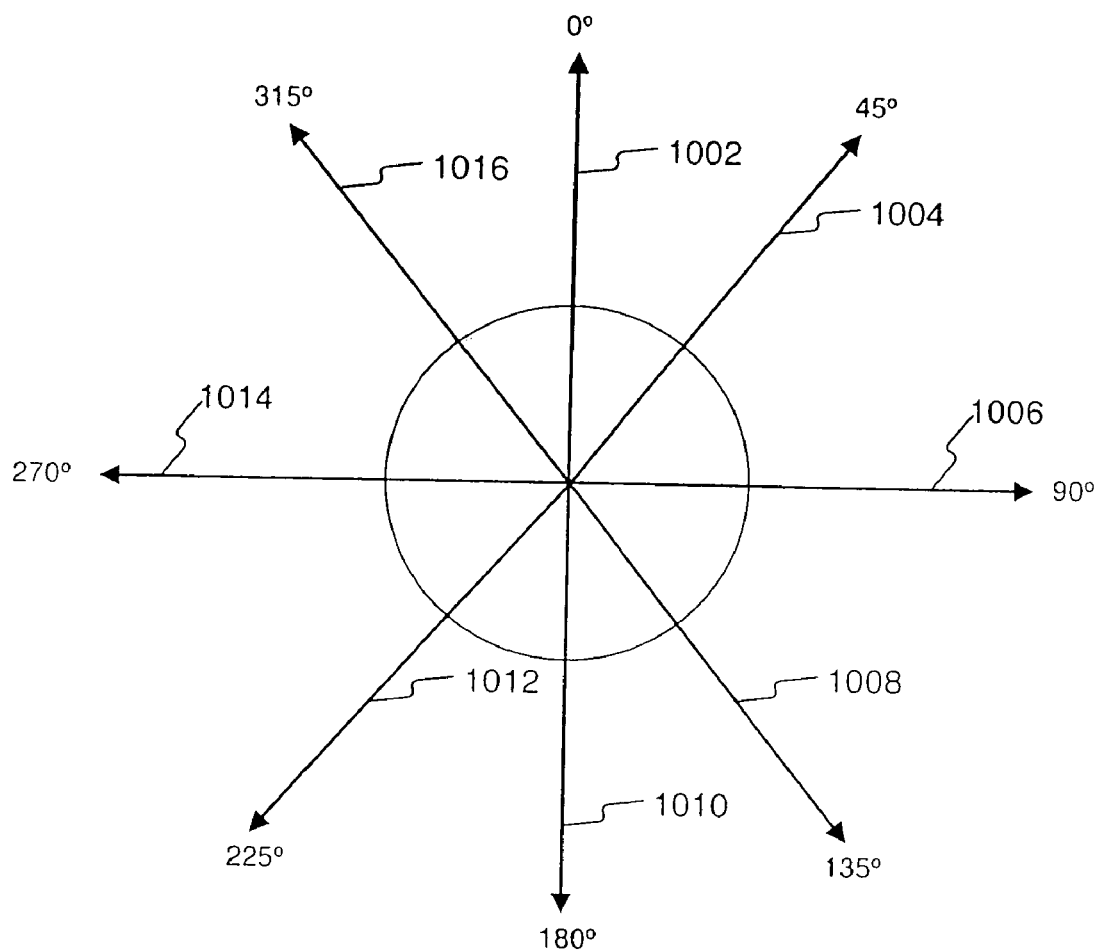

FIG. 10 is a phasor diagram.

Figure 11:
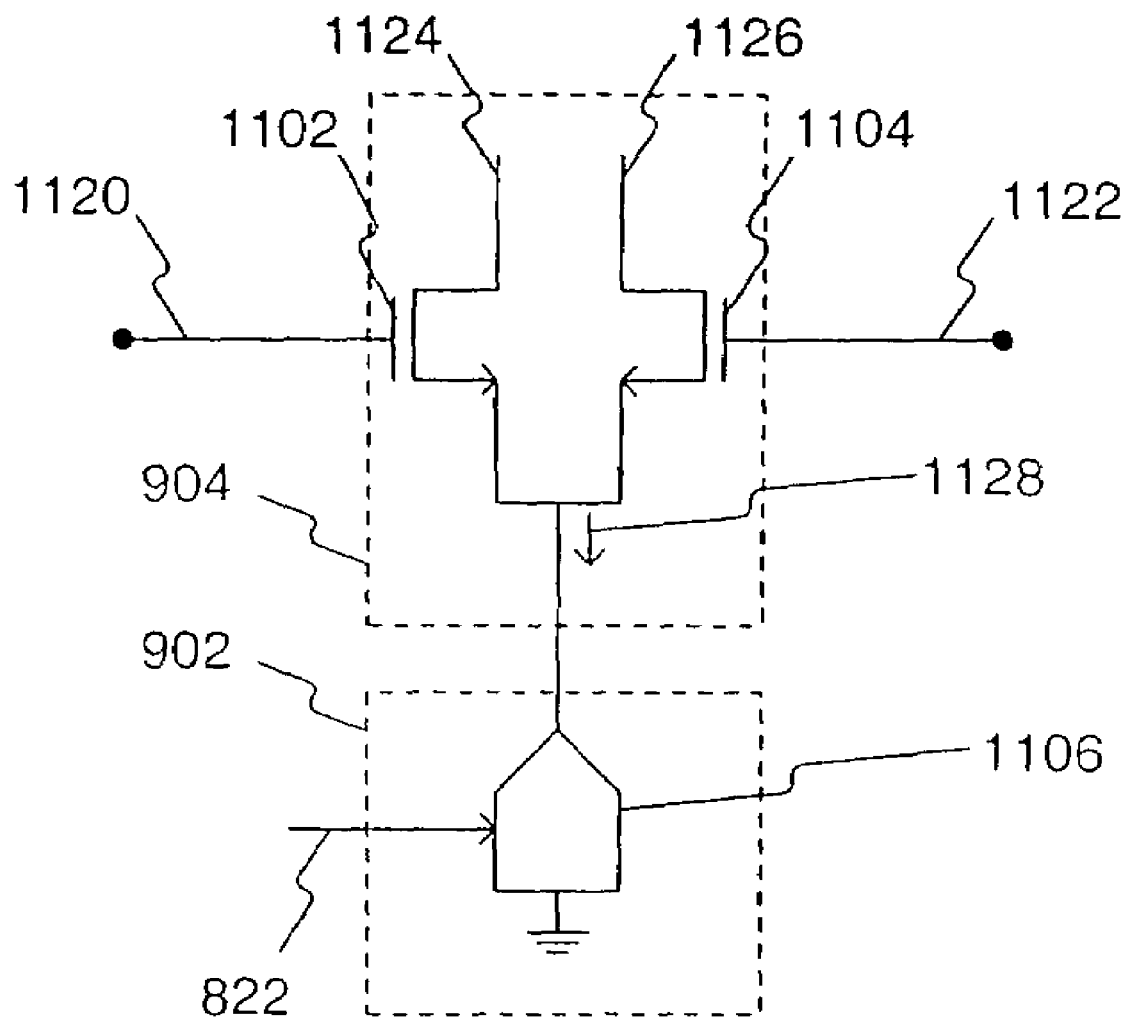

FIG. 11 is a schematic of a reference stage circuit that receives a binary control signal.

Figure 12:
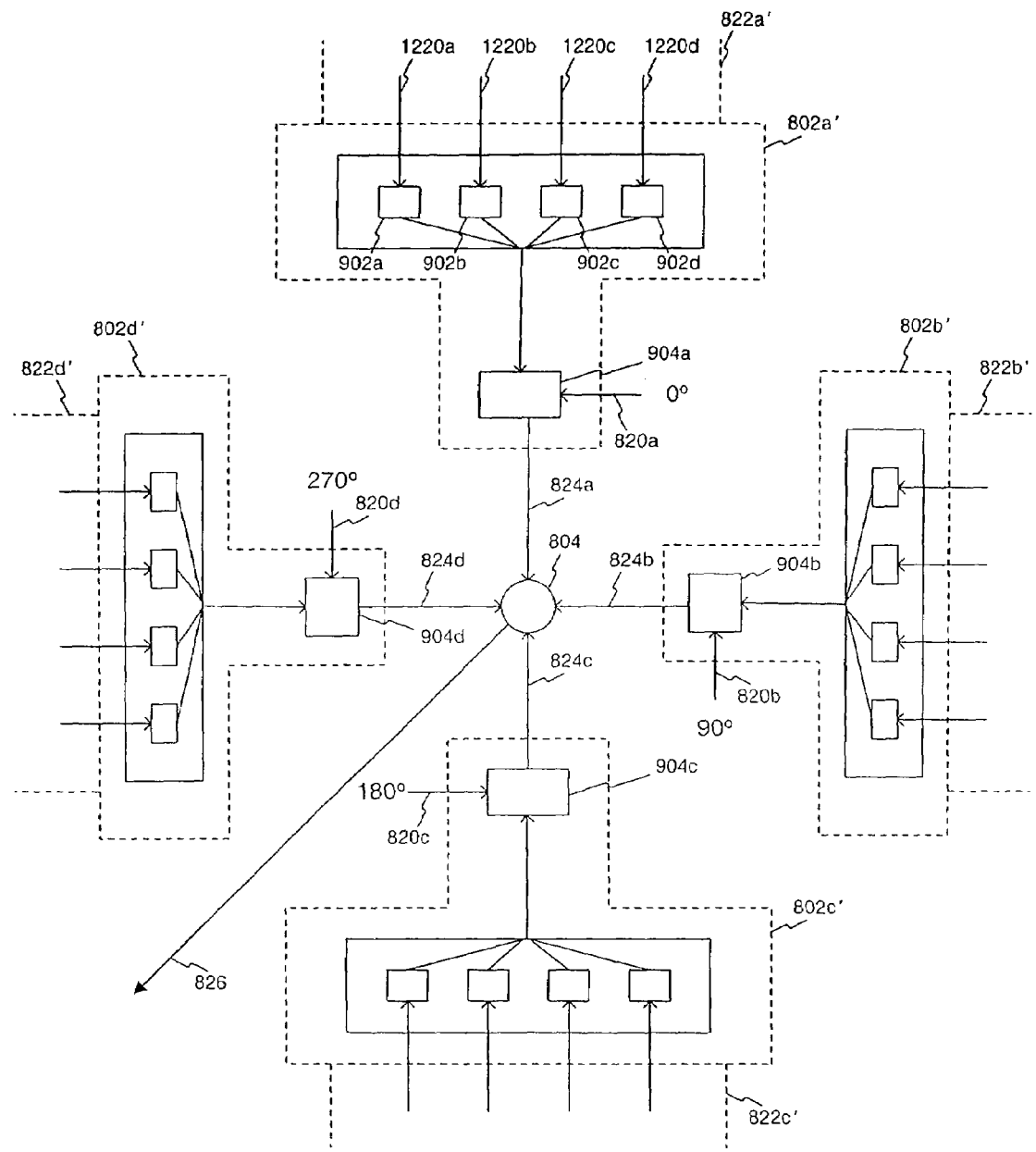

FIG. 12 is a block diagram of a second phase interpolator implementation.

Figure 13:
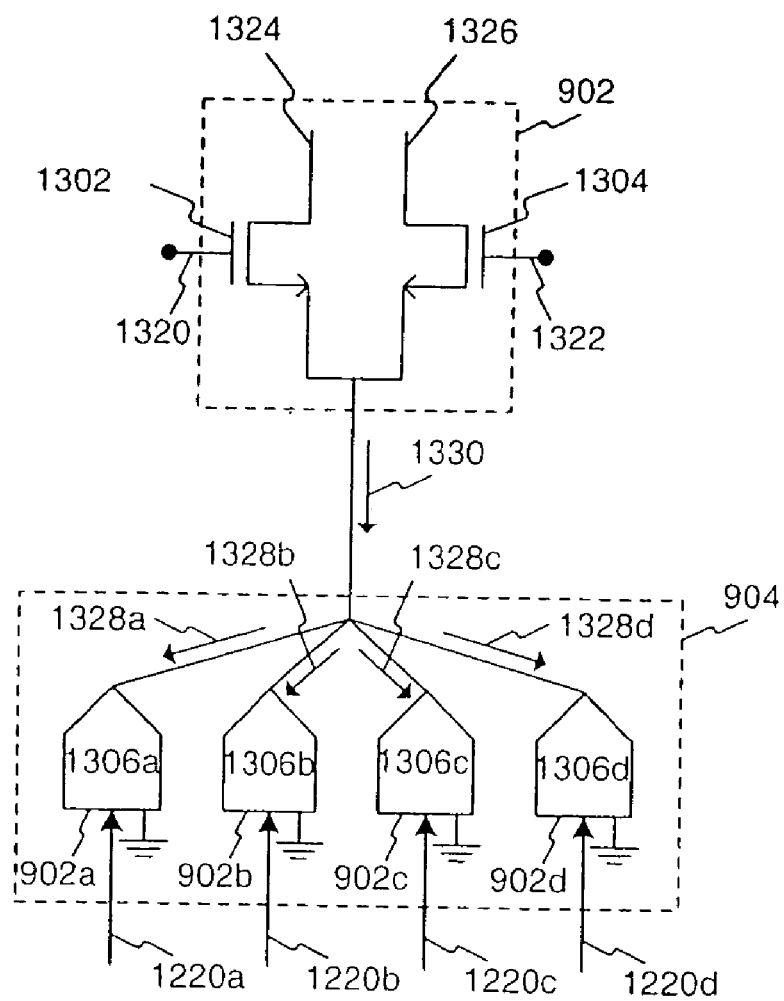

FIG. 13 is a schematic of a reference stage circuit that receives a control signal having multiple binary subsignals.

Figure 14A:
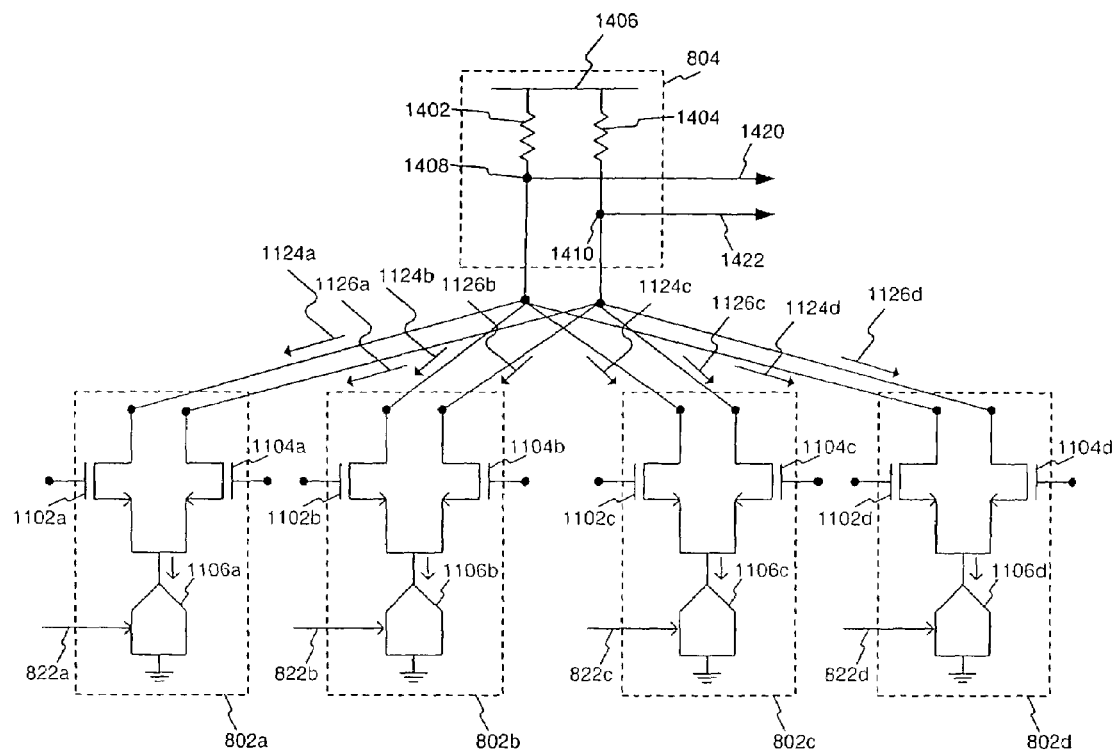
Figure 14B:
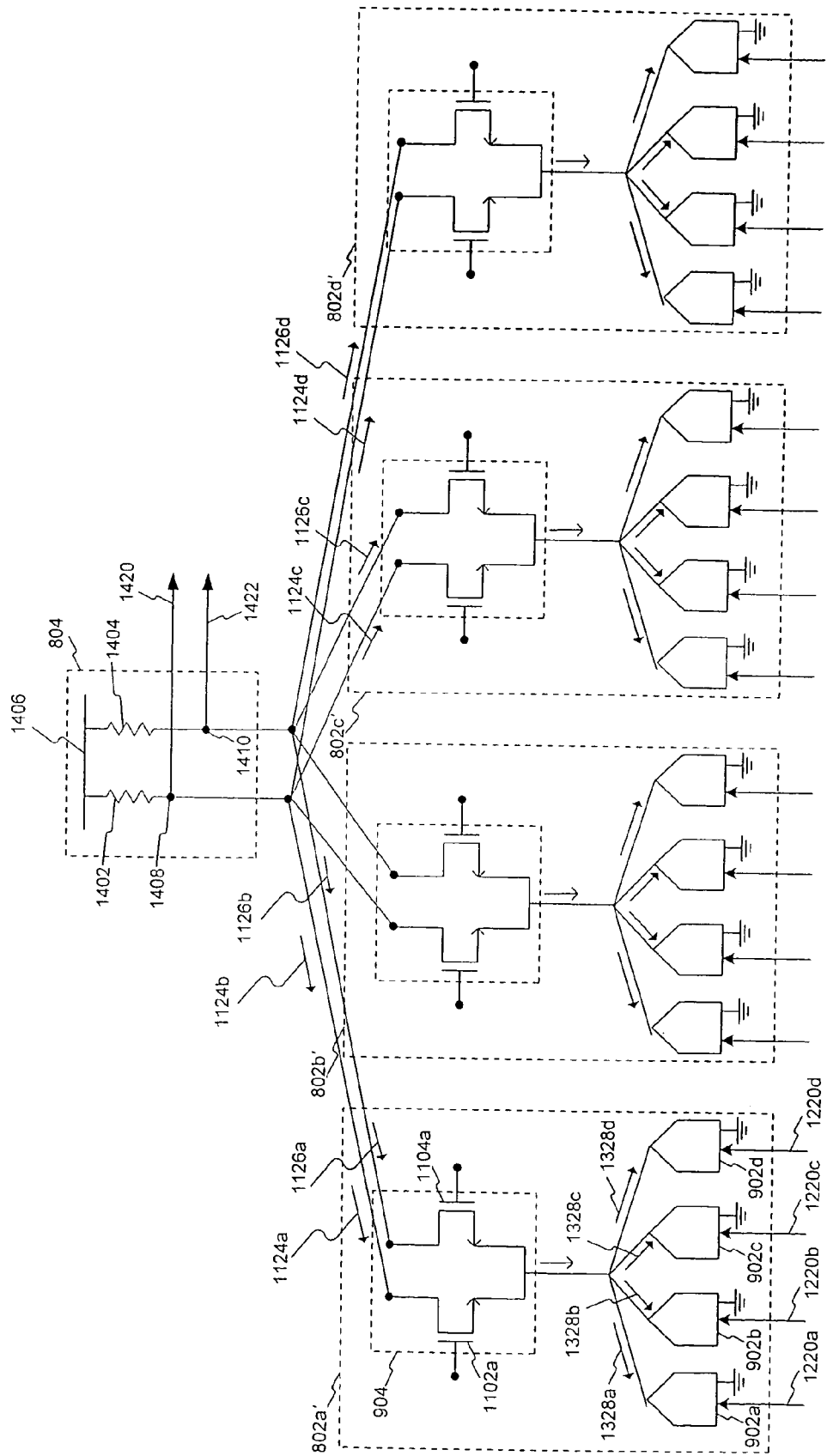

FIGS. 14A and 14B are each schematics of a phase interpolator including a combining node circuit.

Figure 15:
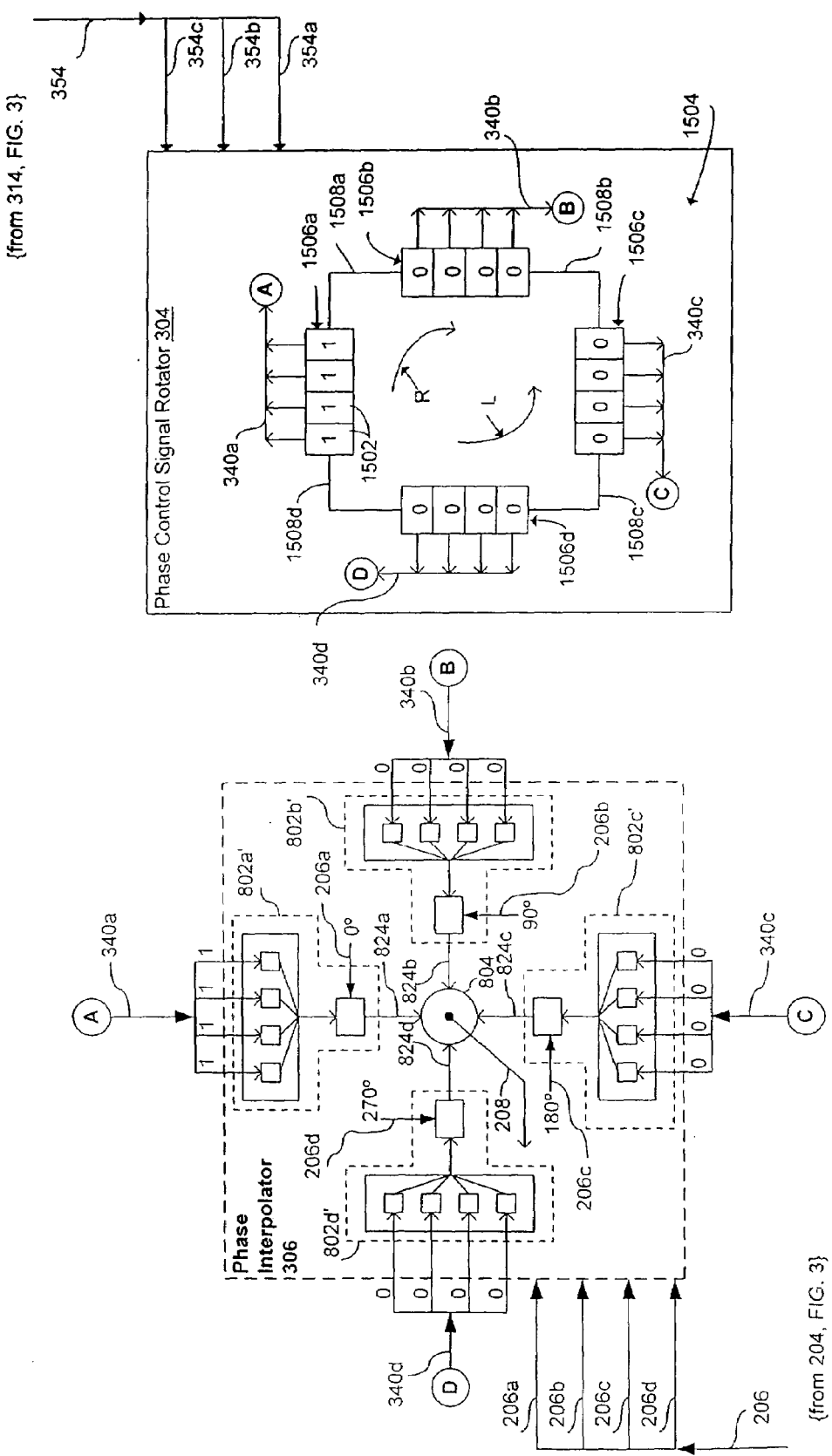

FIG. 15 is a block diagram of a phase interpolator and a phase control signal rotator.

Figure 15A:
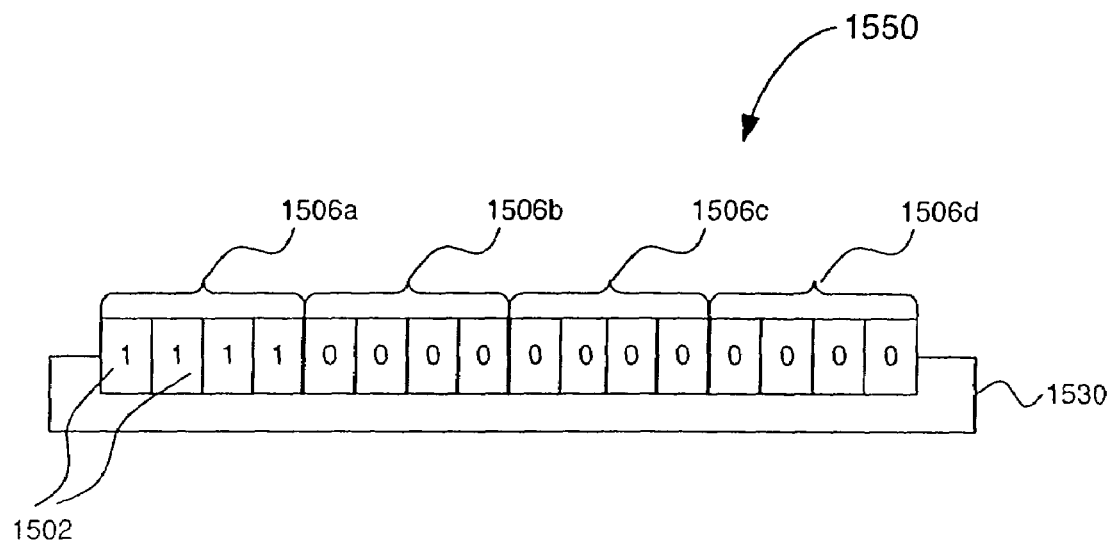
Figure 15B:
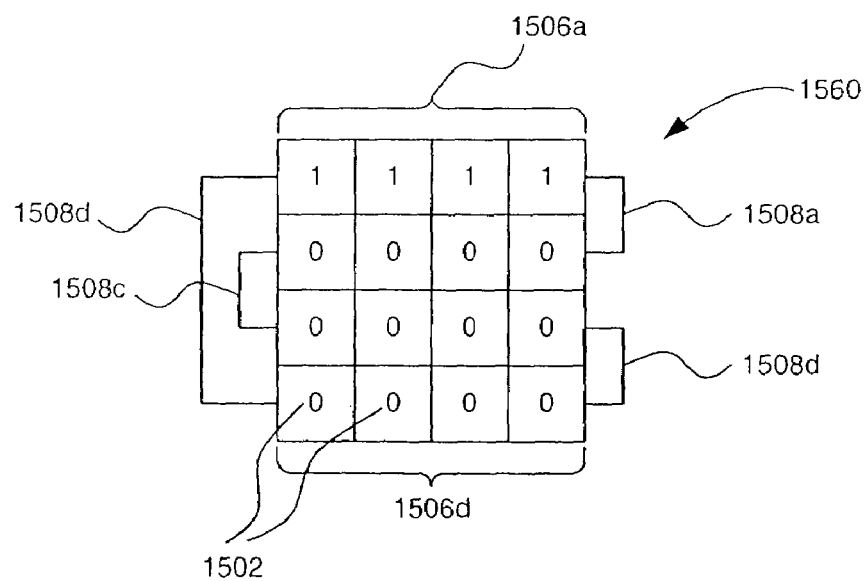

FIGS. 15A and 15B are illustrations of alternative implementations of a ring of storage cells used in the phase control signal rotator of FIG. 15.

Figure 16A:
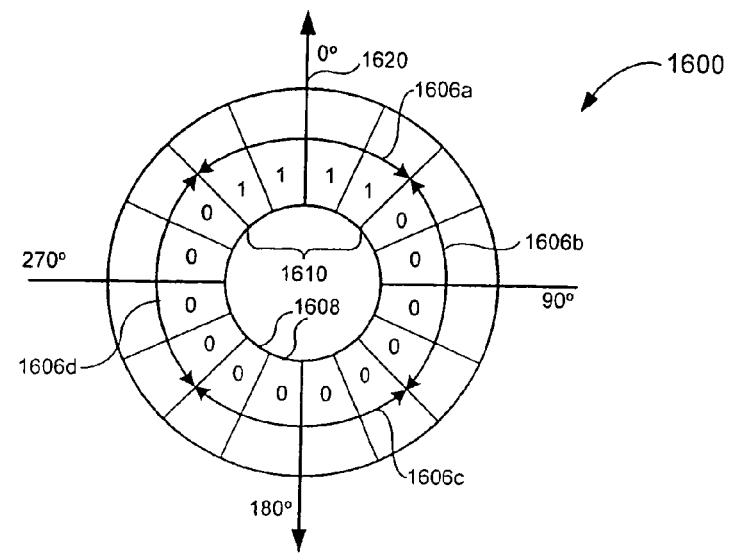
Figure 16B:
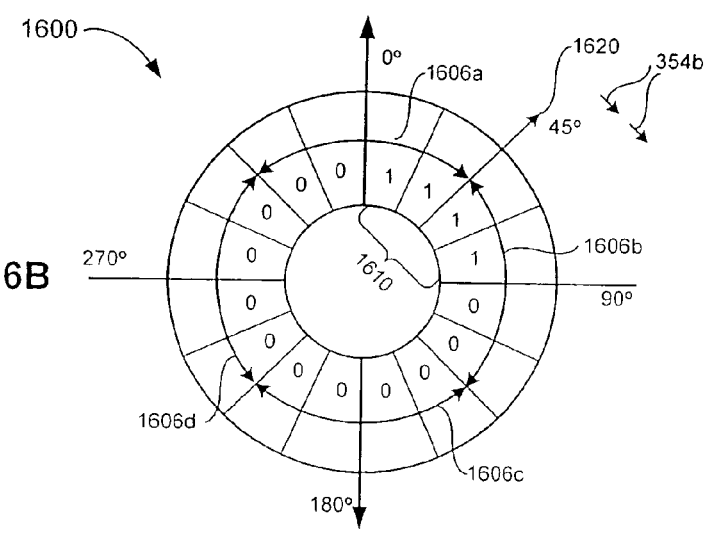
Figure 16C:
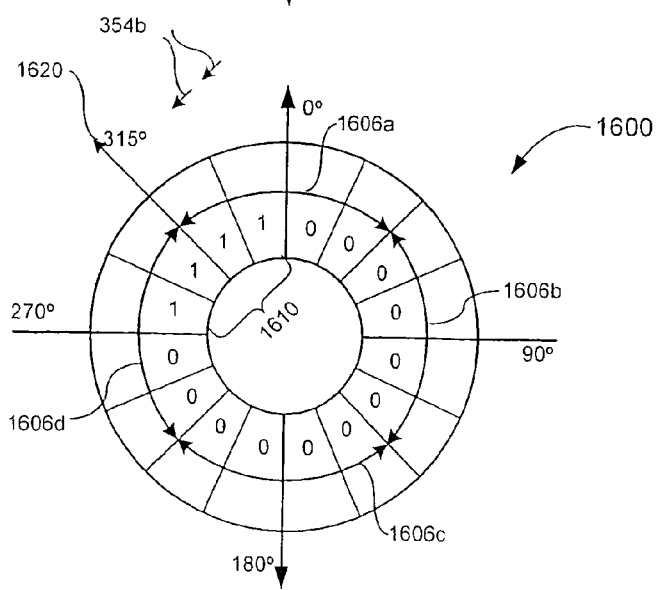

FIGS. 16A–16C are diagrams of phase rings corresponding to the phase interpolator and phase control signal rotator of FIG. 15.

Figure 17:
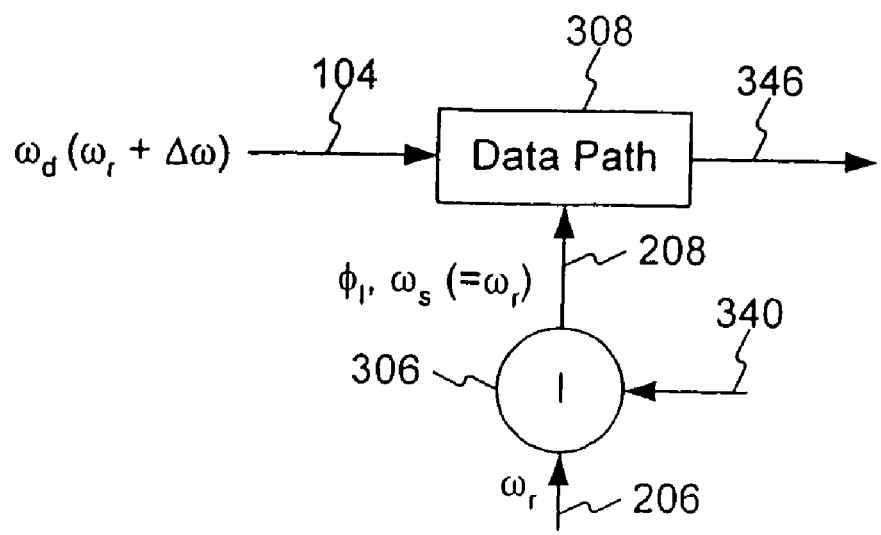

FIG. 17 is an illustration of a frequency offset in a portion of a timing recovery module.

Figure 18:
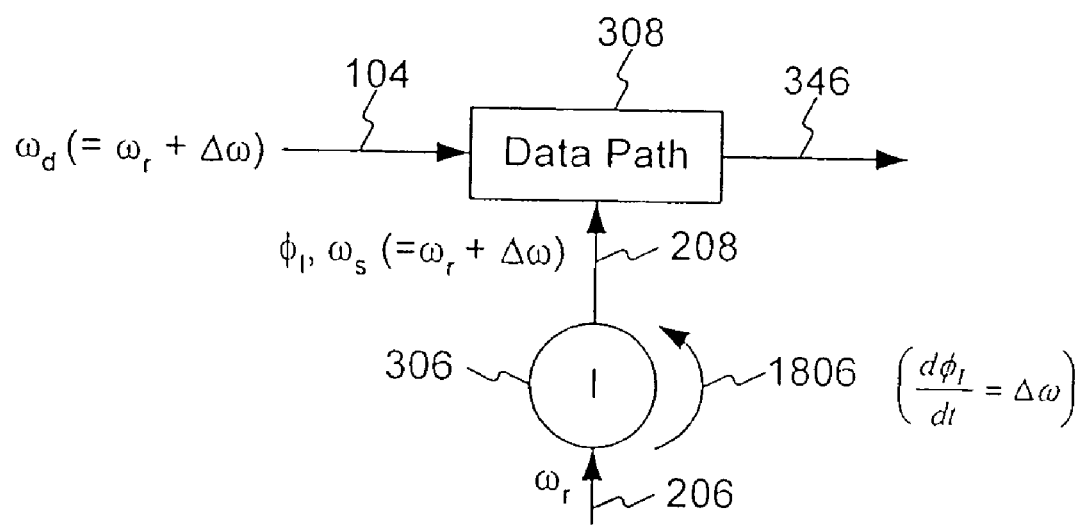

FIG. 18 is an illustration of compensating for the frequency offset of FIG. 17 in the portion of the timing recovery module.

Figure 18A:
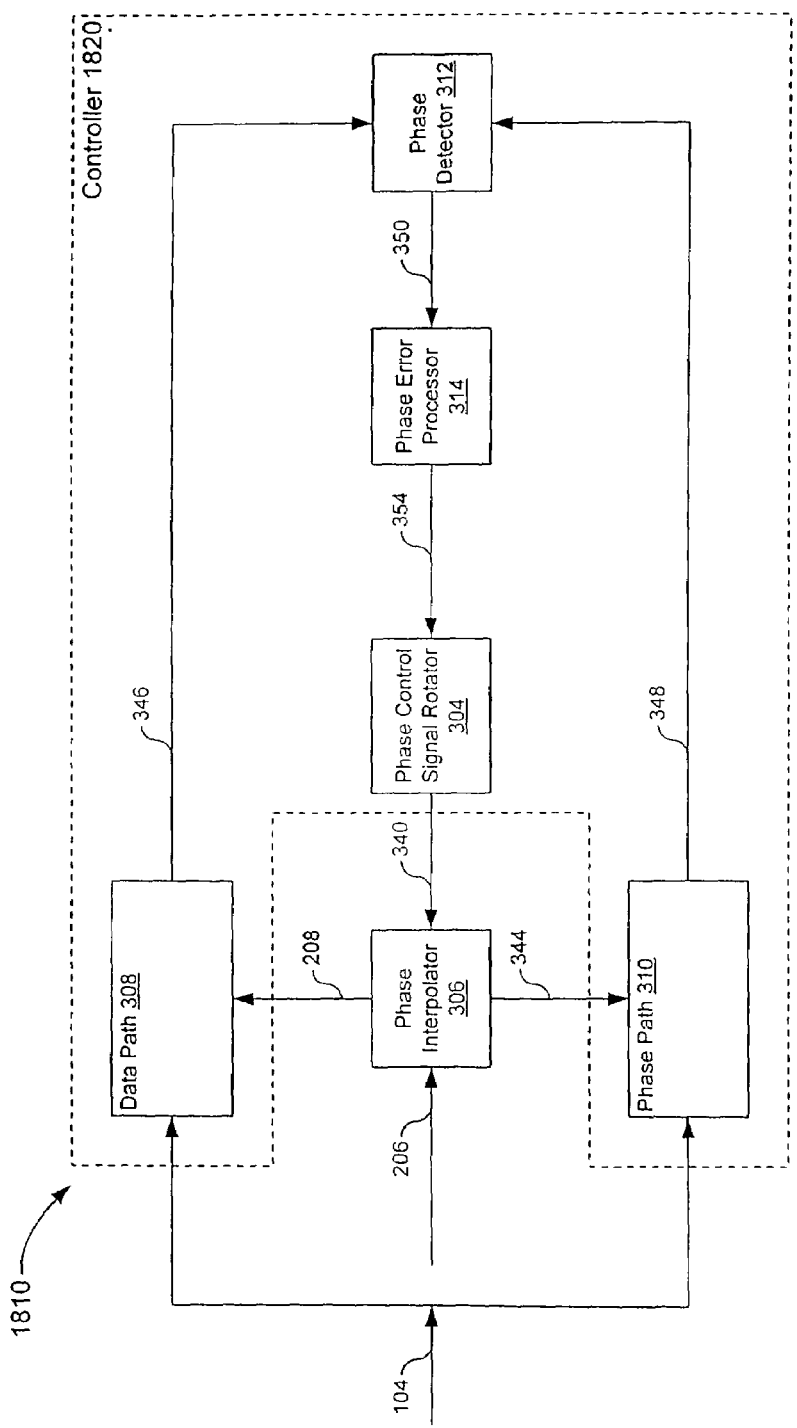

FIG. 18A is a block diagram of a timing recovery system for frequency synchronizing a sampling signal to a serial data signal.

Figure 3:
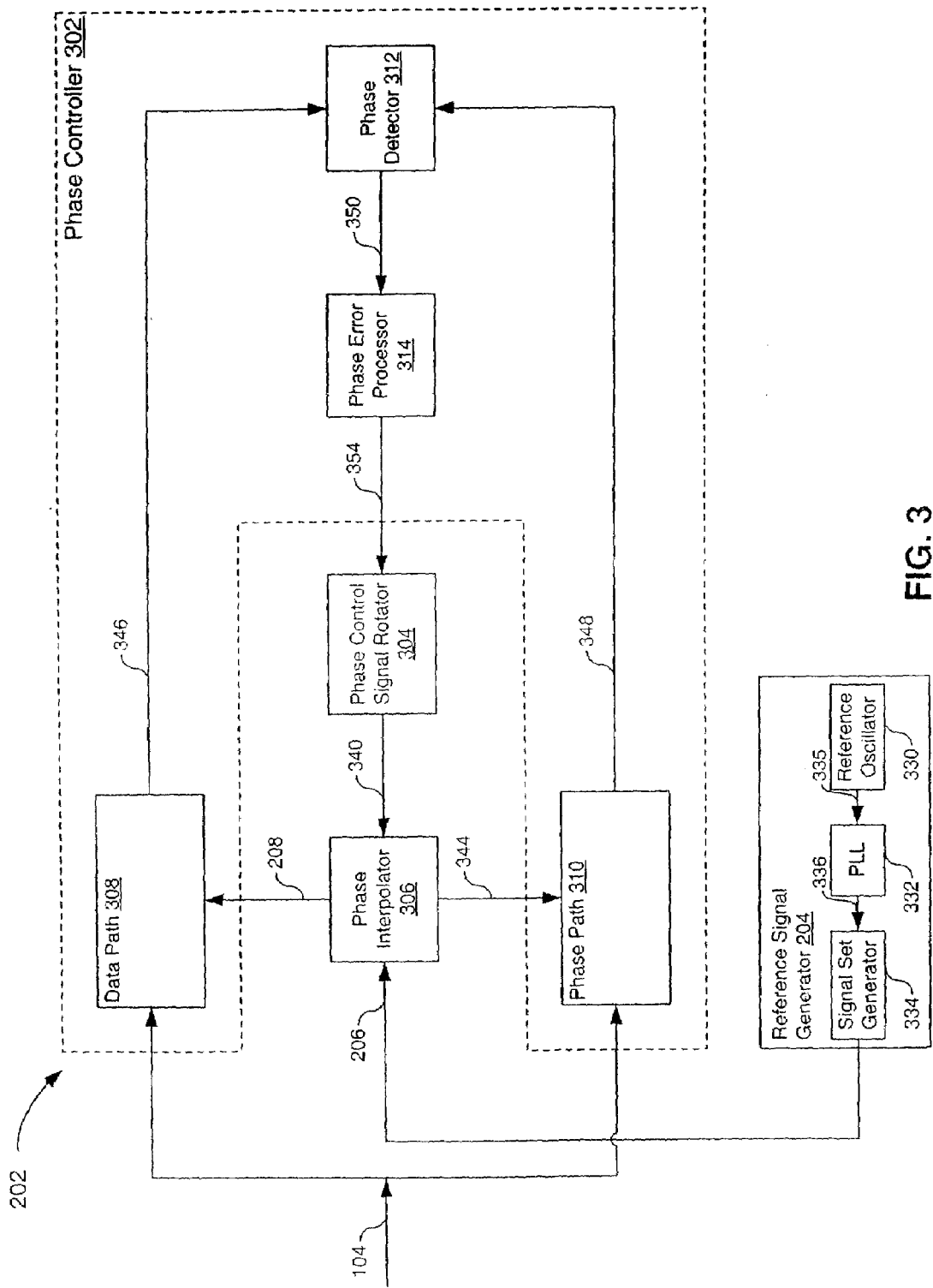
FIG. 3 is a block diagram of a timing recovery module/system.
Figure 19:
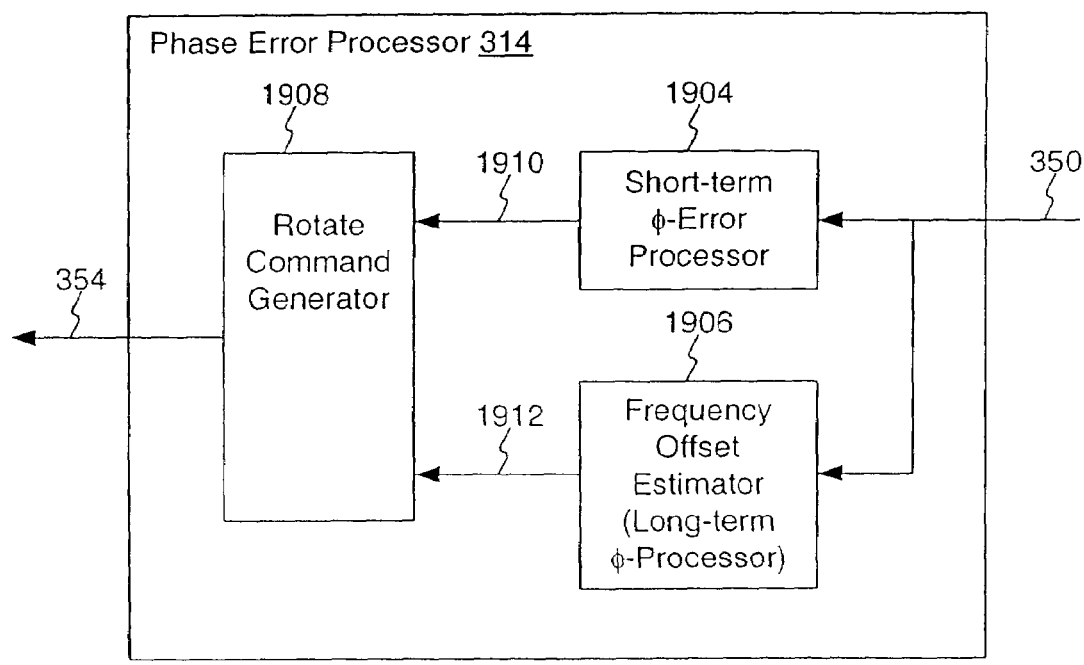

FIG. 19 is a block diagram of a phase error processor of FIG. 18A and FIG. 3.

Figure 20:
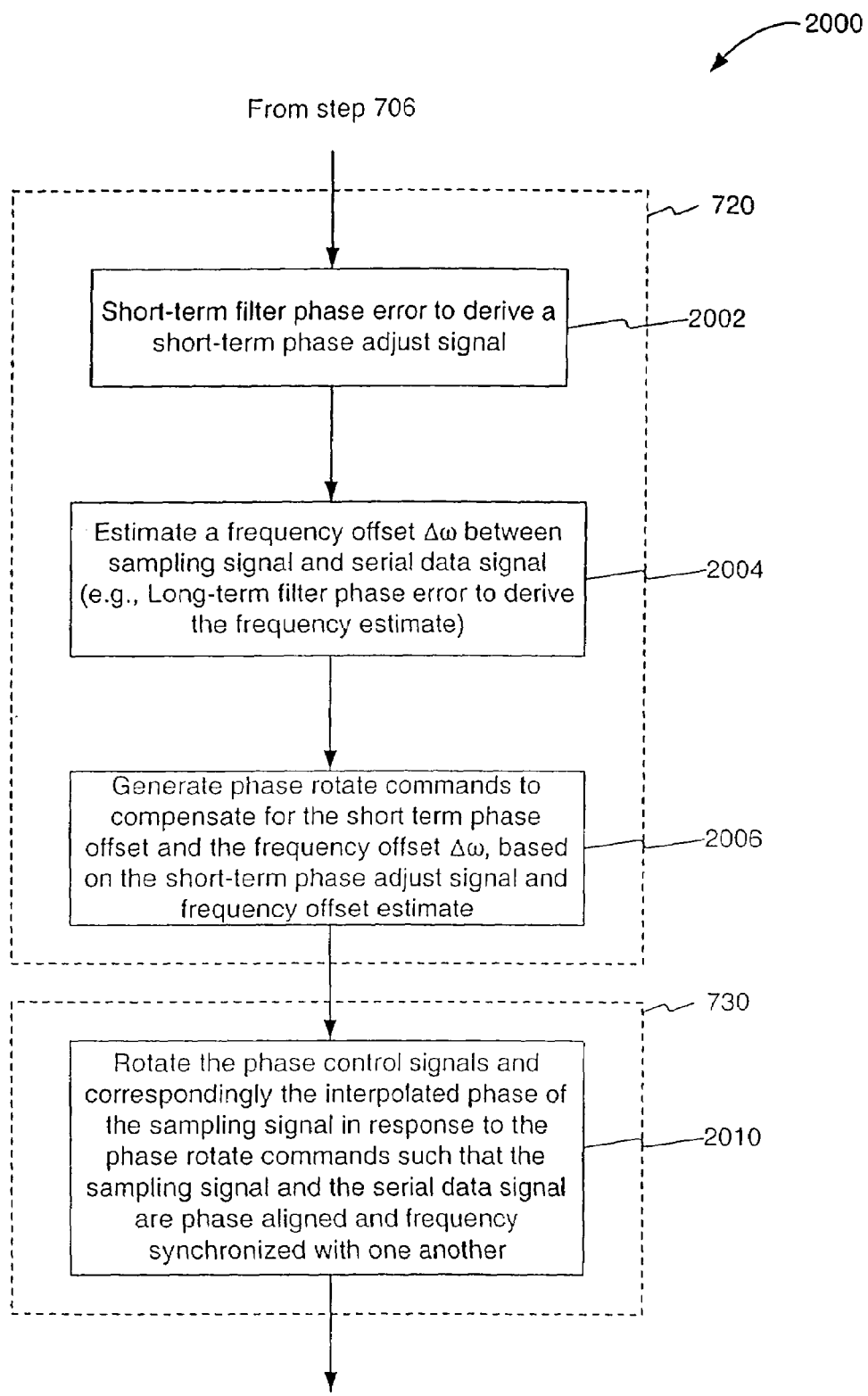

FIG. 20 is a flowchart of a method involving phase and frequency tracking.

Figure 20A:
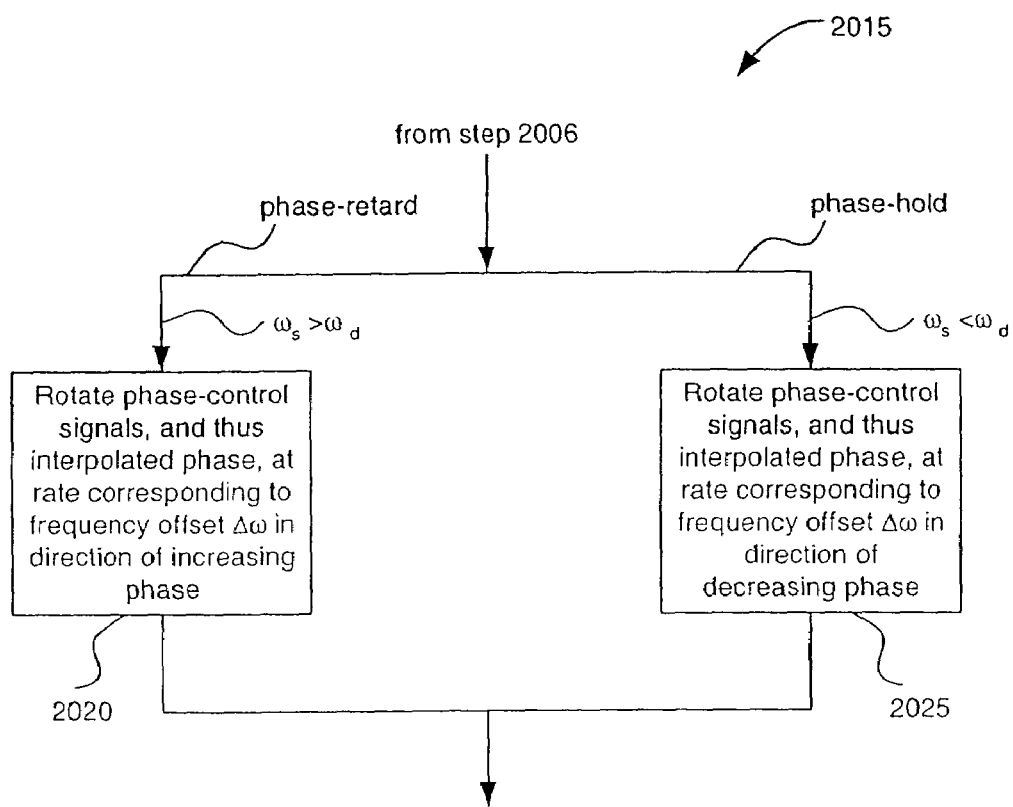

FIG. 20A is a flow chart of an example method expanding on a rotating step of the method of FIG. 20.

Figure 20B:
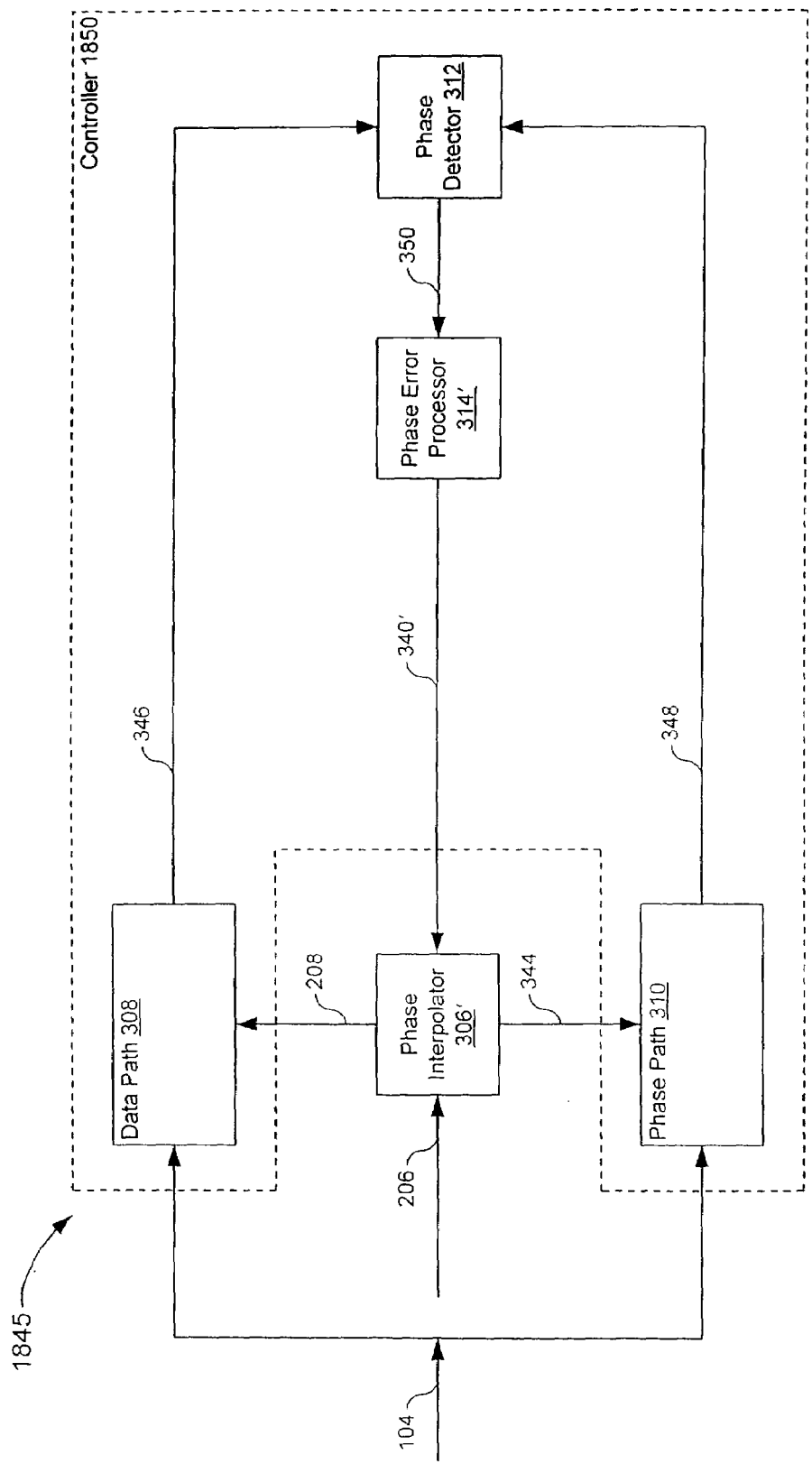

FIG. 20B is a block diagram of an example timing recovery system for synchronizing sampling and serial data signal frequencies without using a control signal rotator.

Figure 20C:
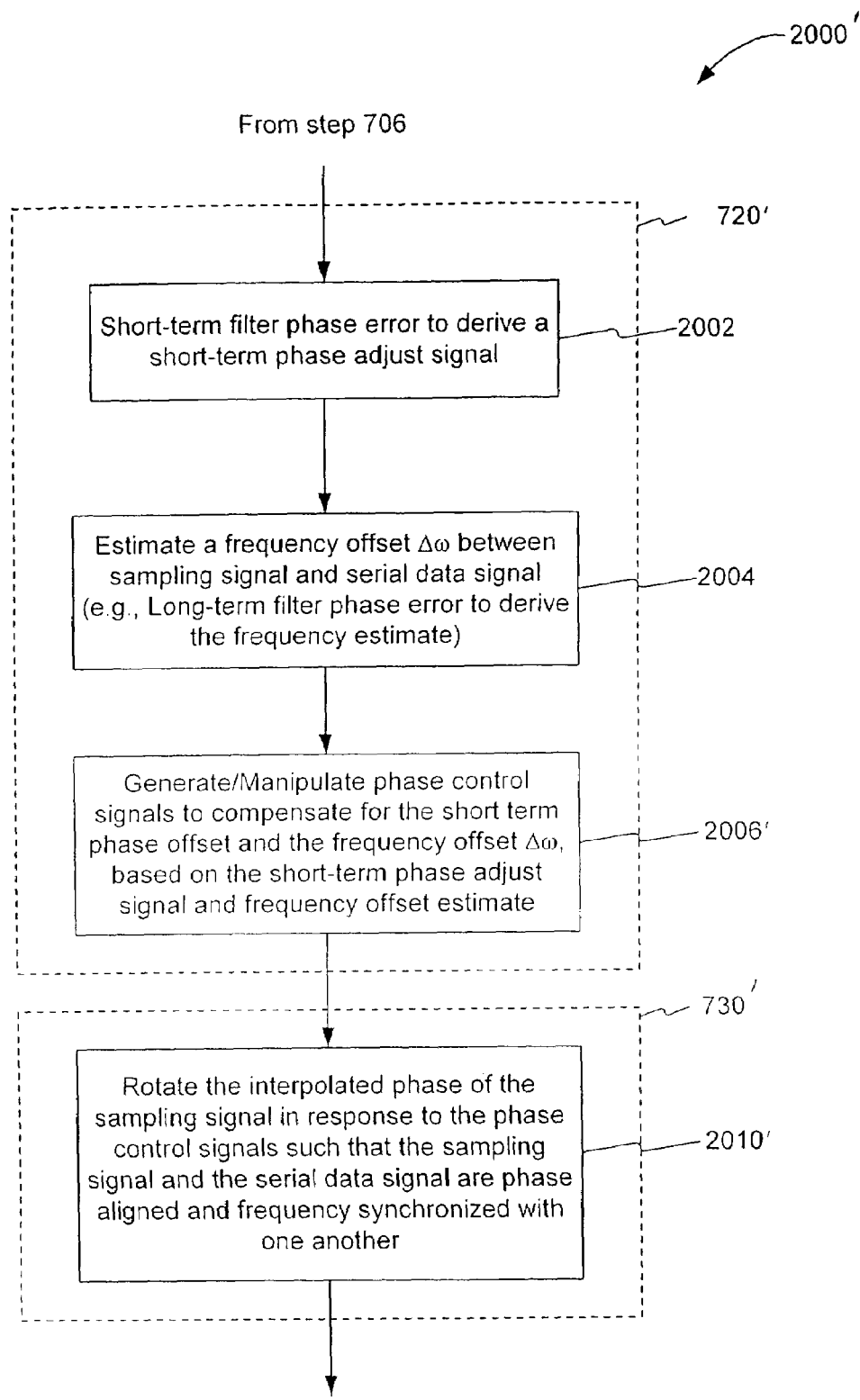

FIG. 20C is a flow chart of an example high level method of controlling a phase interpolator, corresponding to the timing recovery systems of FIGS. 18A and 20B.

Figure 20D:
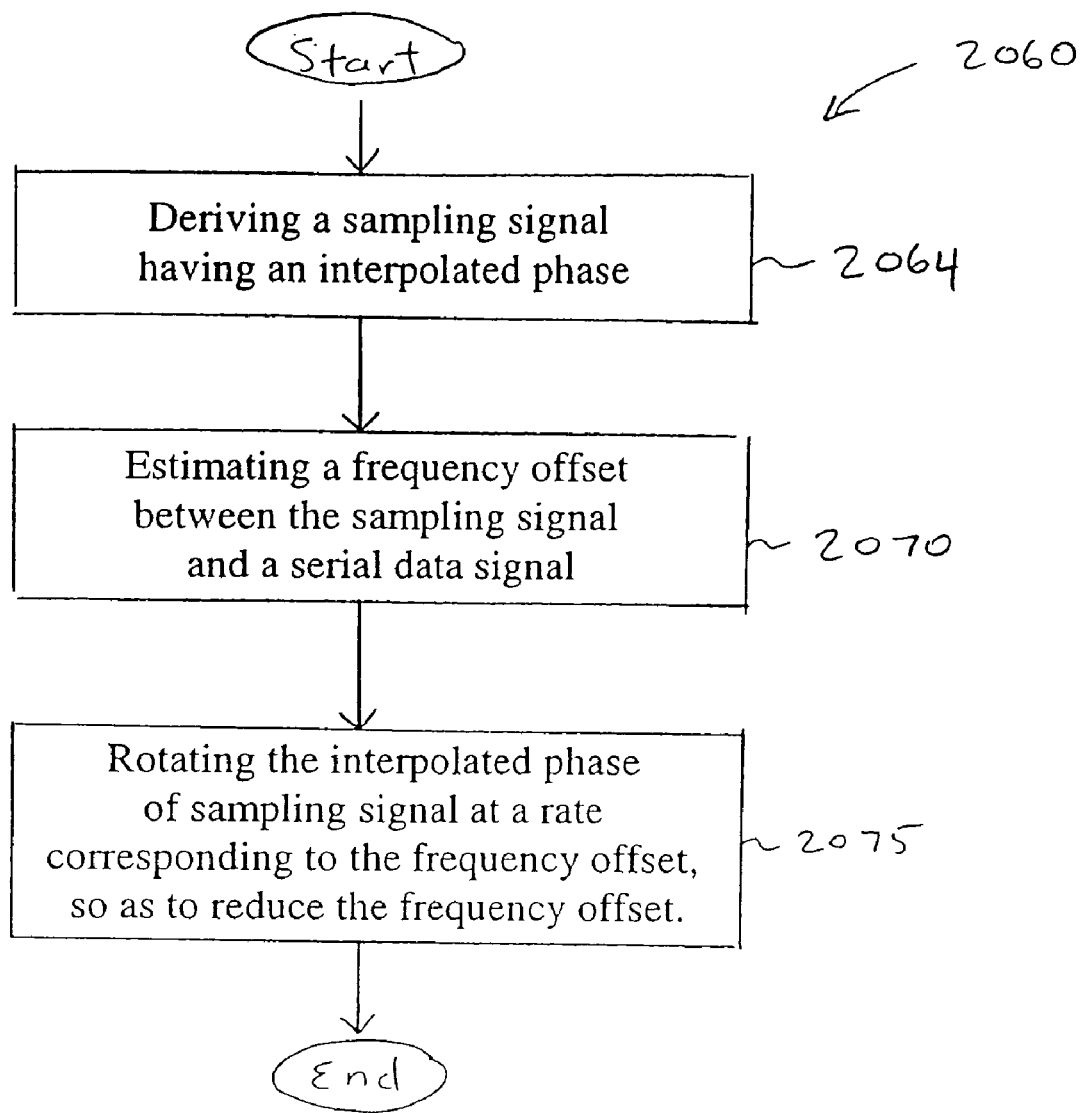

FIG. 20D is a flow chart of an example high level method of frequency synchronizing a sampling signal to a serial data signal.

Figure 21:
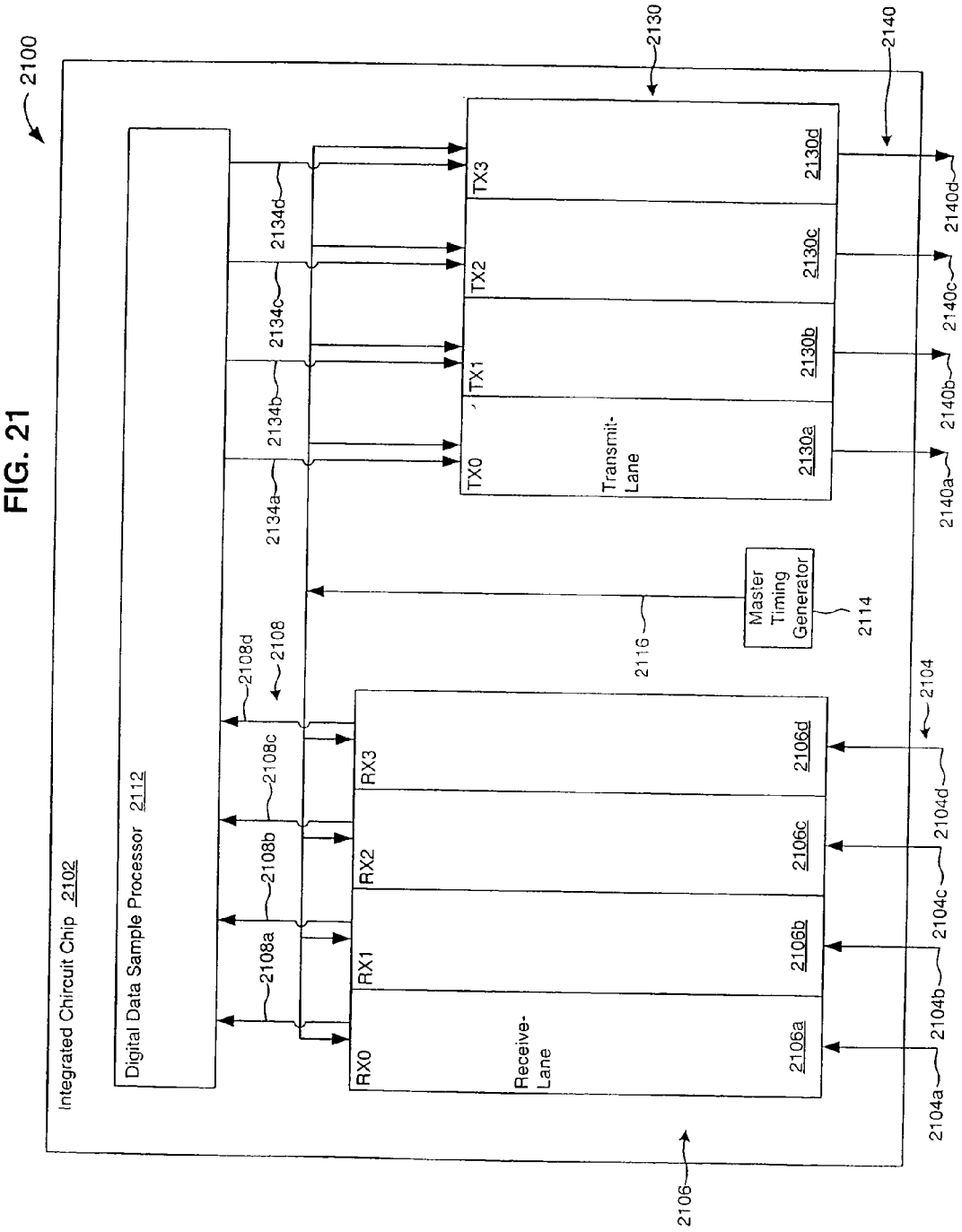

FIG. 21 is an illustration of an example of a multiple channel communication device constructed on an integrated circuit (IC) chip, according to an embodiment of the present invention.

Figure 22:
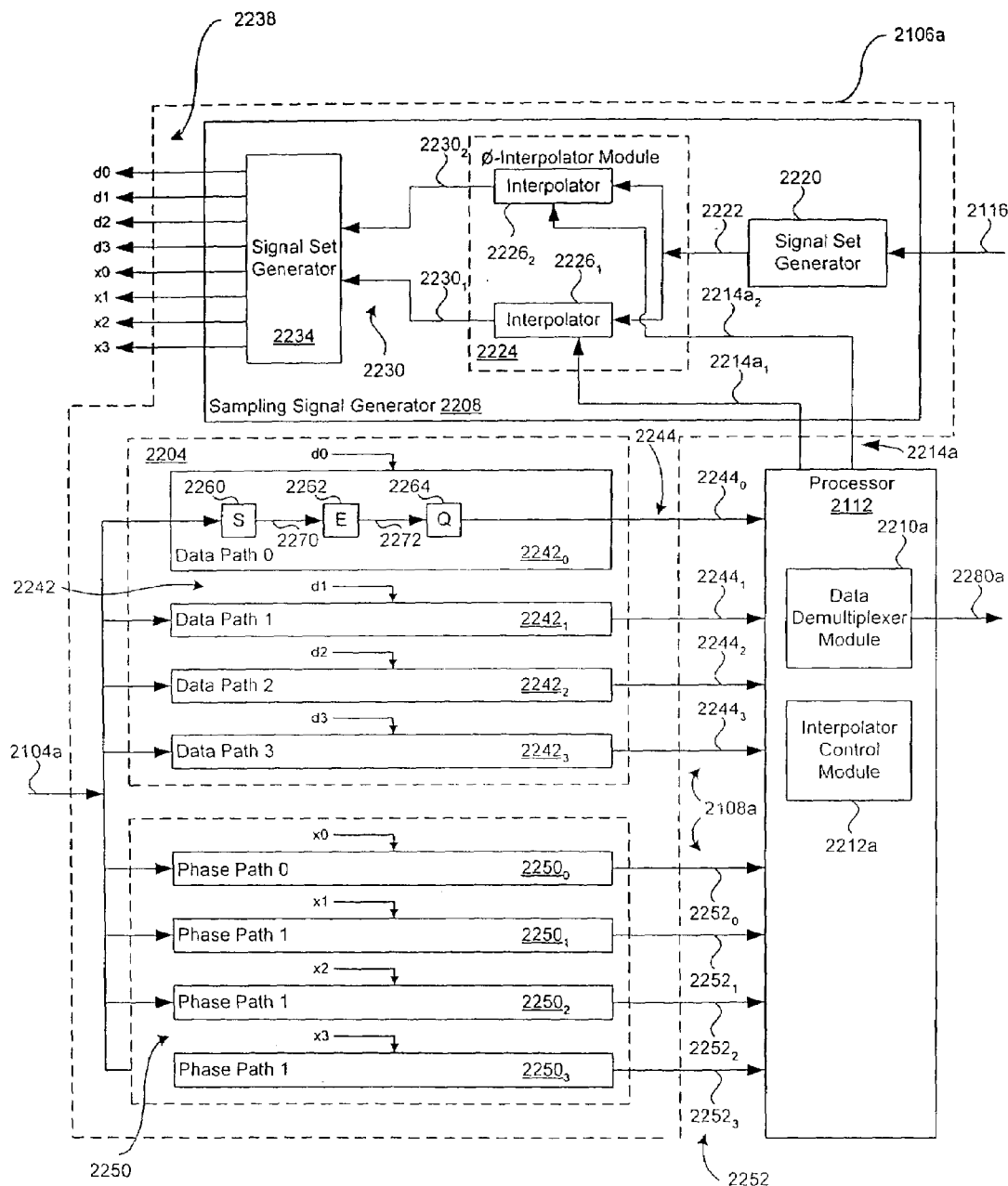

FIG. 22 is an illustration of a receive-lane corresponding to one channel of the multiple channel communication device of FIG. 21, according to an embodiment of the present invention.

Figure 23:
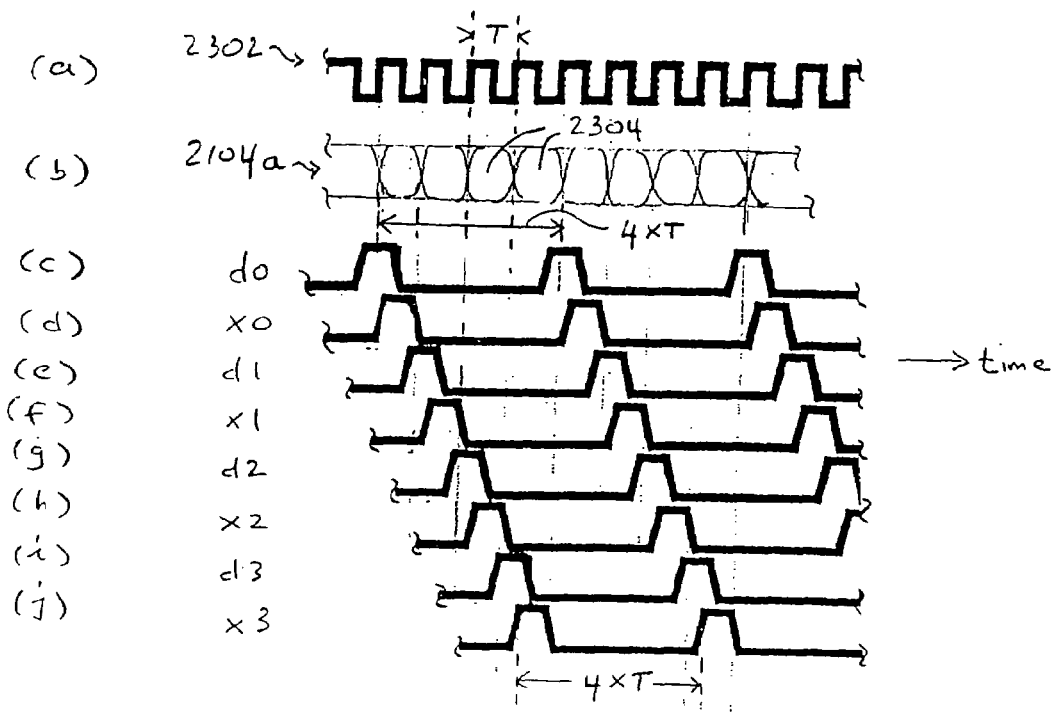

FIG. 23 is an illustration of various example signal waveforms taken from the receive-lane of FIG. 22.

Figure 24:
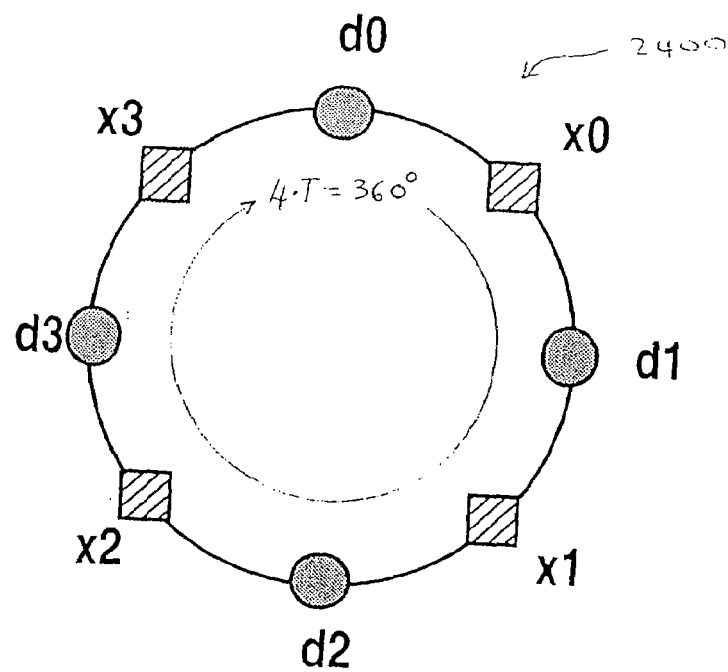

FIG. 24 is a phase circle representing the phases of sampling signals of FIG. 23.

Figure 25:
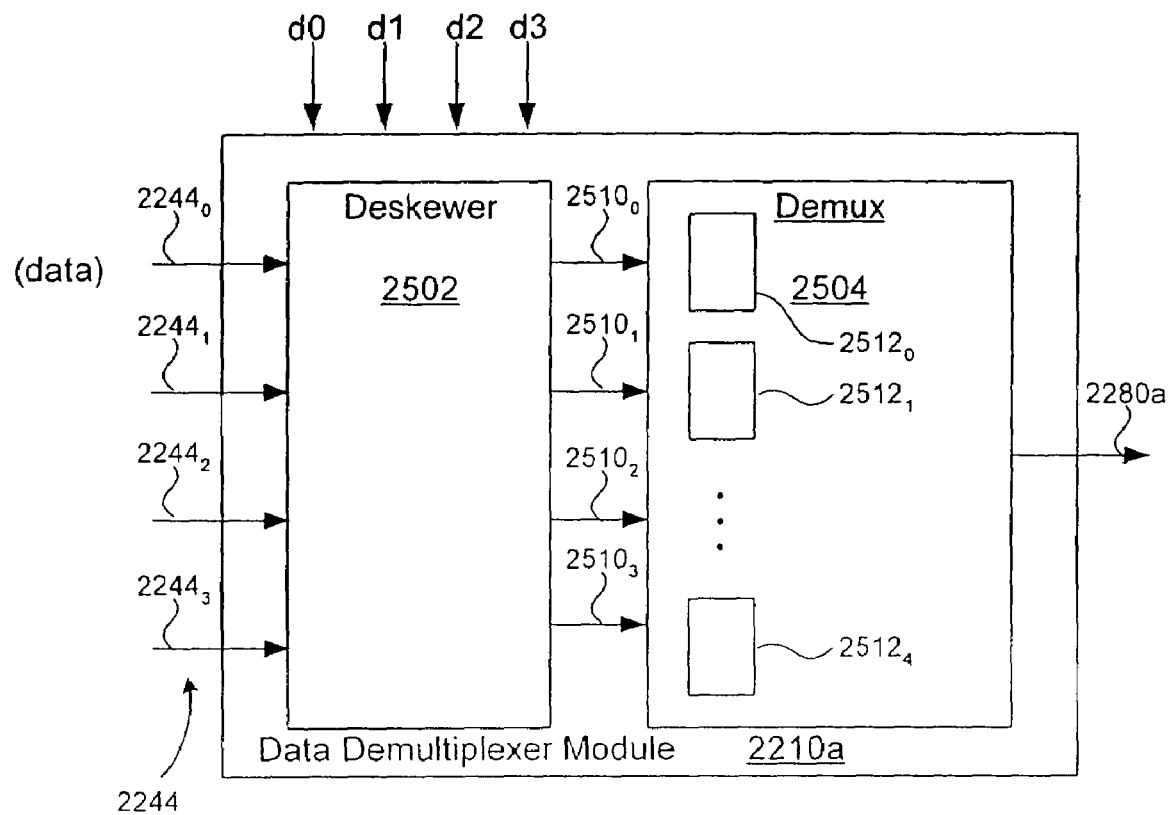

FIG. 25 is a block diagram of a data demultiplexer module from FIG. 22, according to an embodiment of the present invention.

Figure 26:
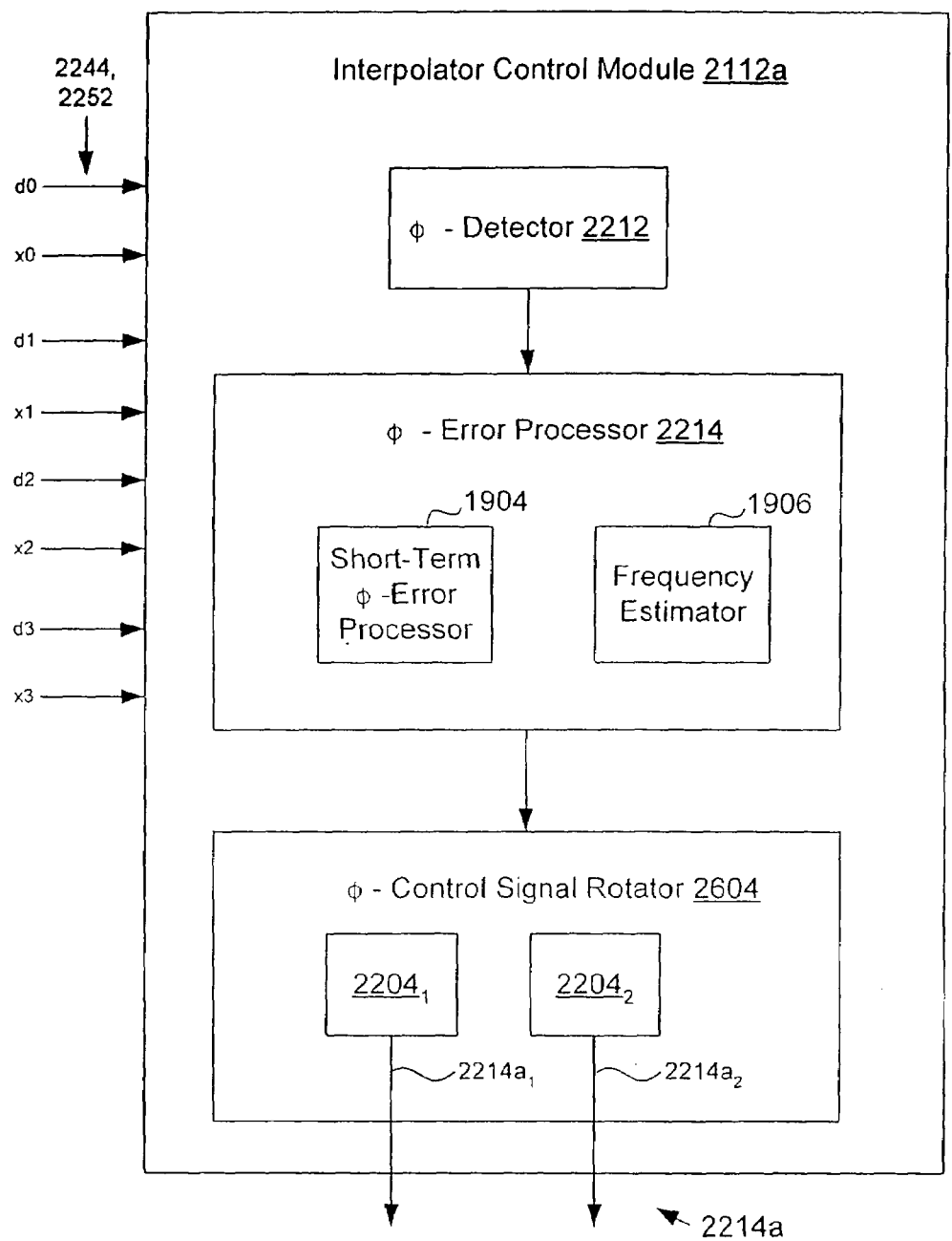

FIG. 26 is a block diagram of an interpolator control module from FIG. 22, according to embodiment of the present invention.

Figure 27:
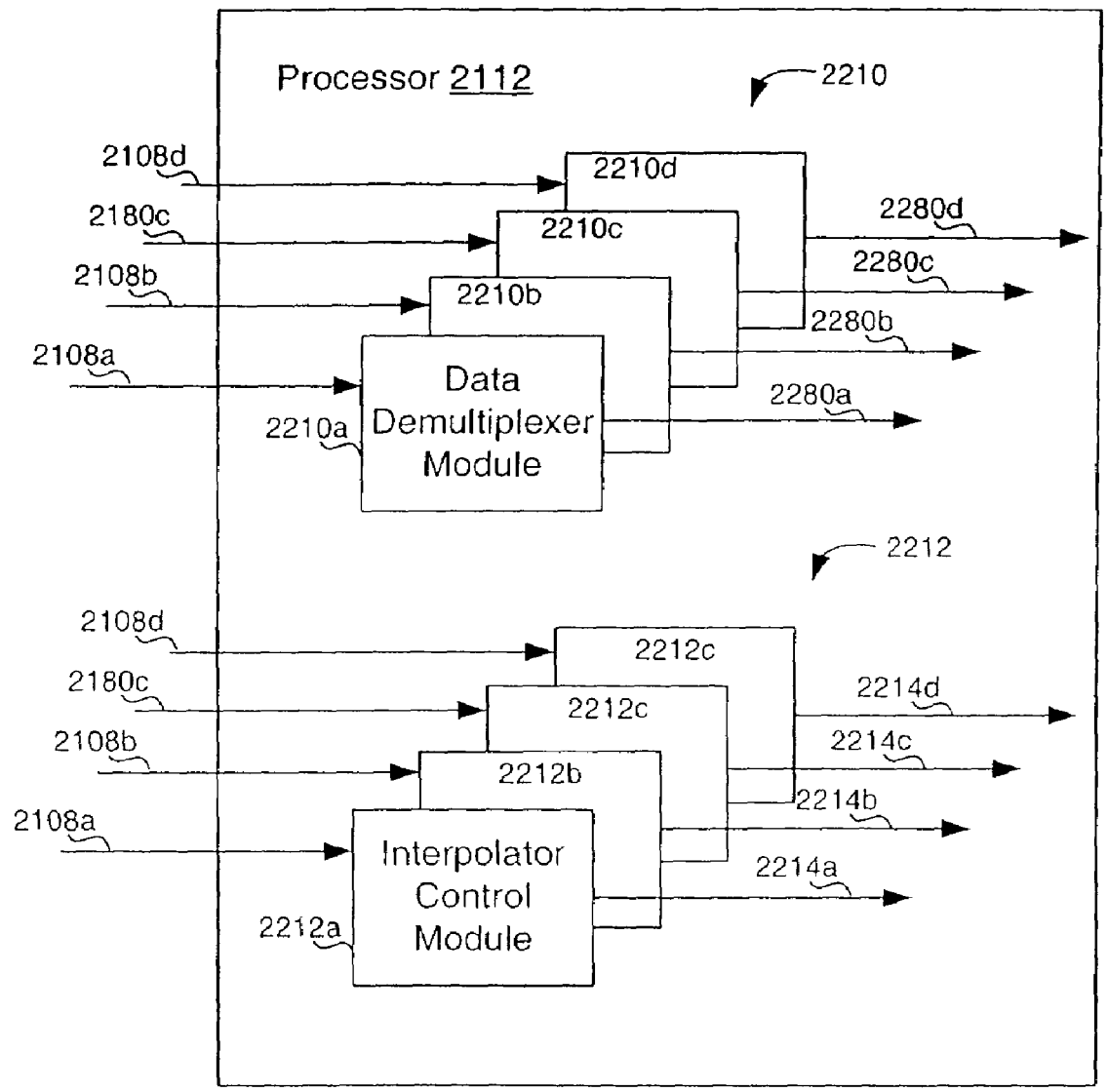

FIG. 27 is a block diagram of a digital data processor of FIGS. 21 and 22, according to an embodiment of the present invention.

Figure 28:
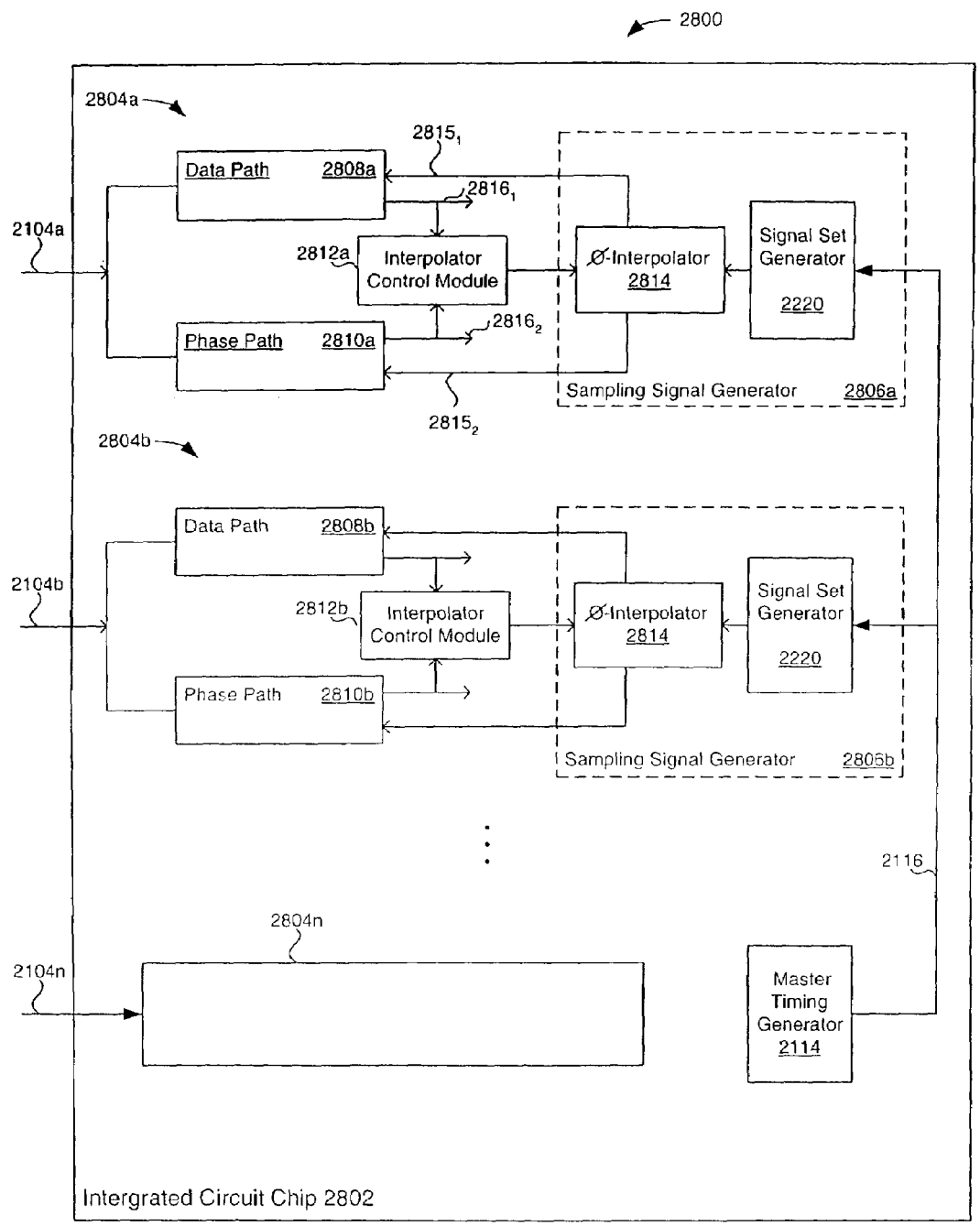

FIG. 28 is a block diagram of a multiple channel communication device, according to an embodiment of the present invention.

Figure 29:
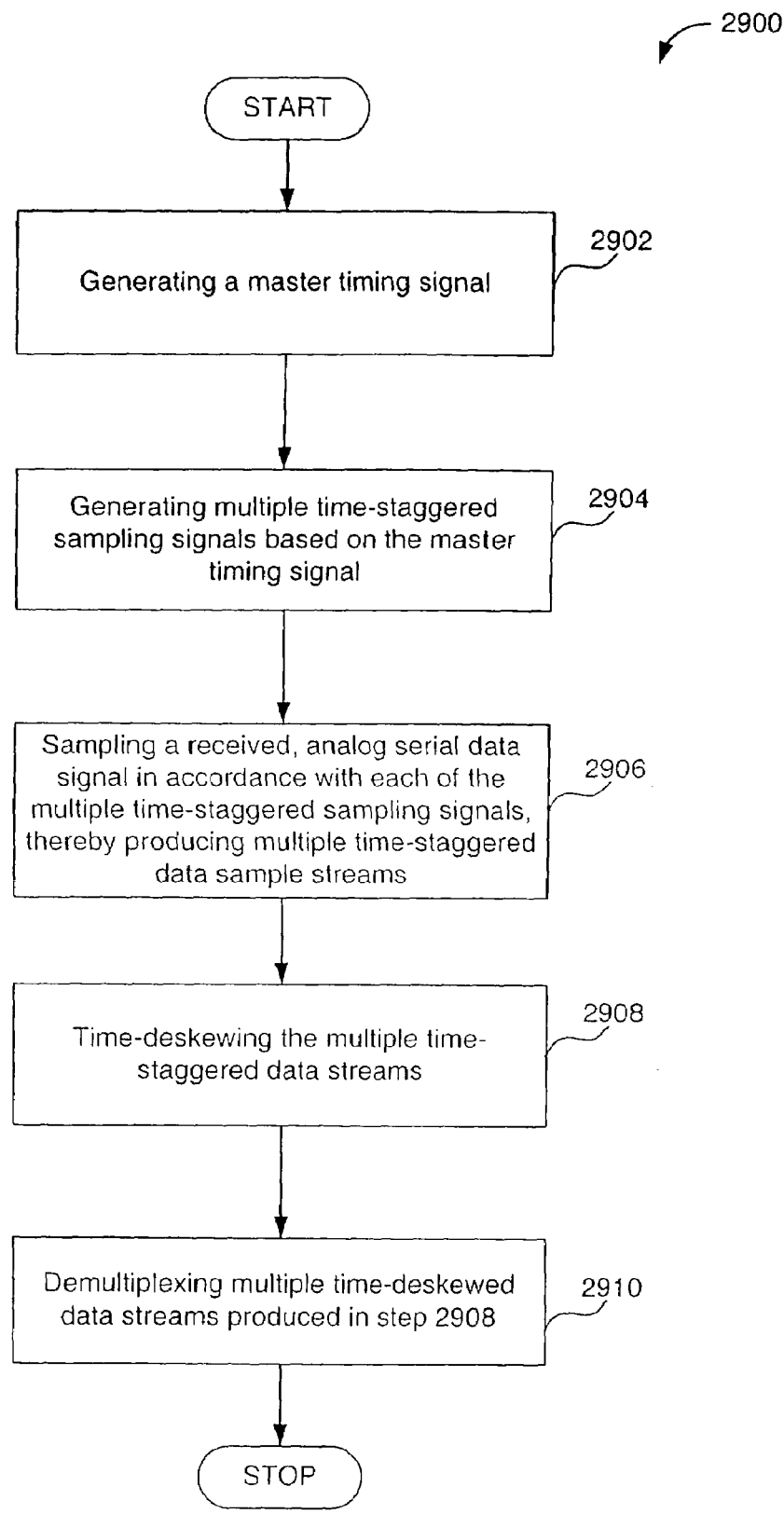

FIG. 29 is a flow chart of an example method of processing a serial data signal in multiple data paths of a single channel of a serial data receiver.

Figure 30:
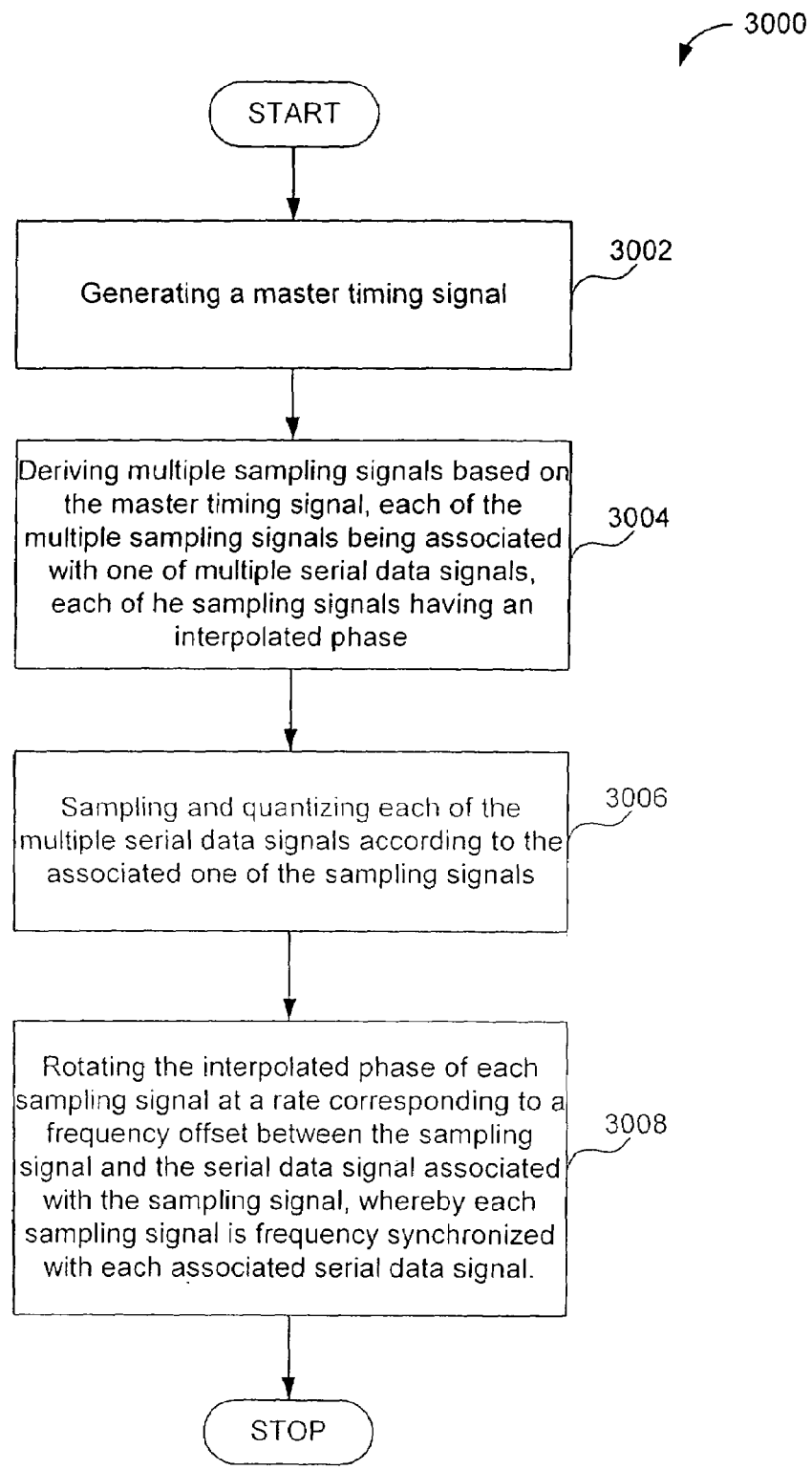

FIG. 30 is a flow chart of an example method of frequency synchronizing multiple data sampling signals to multiple corresponding serial data signals.

Figure 31:
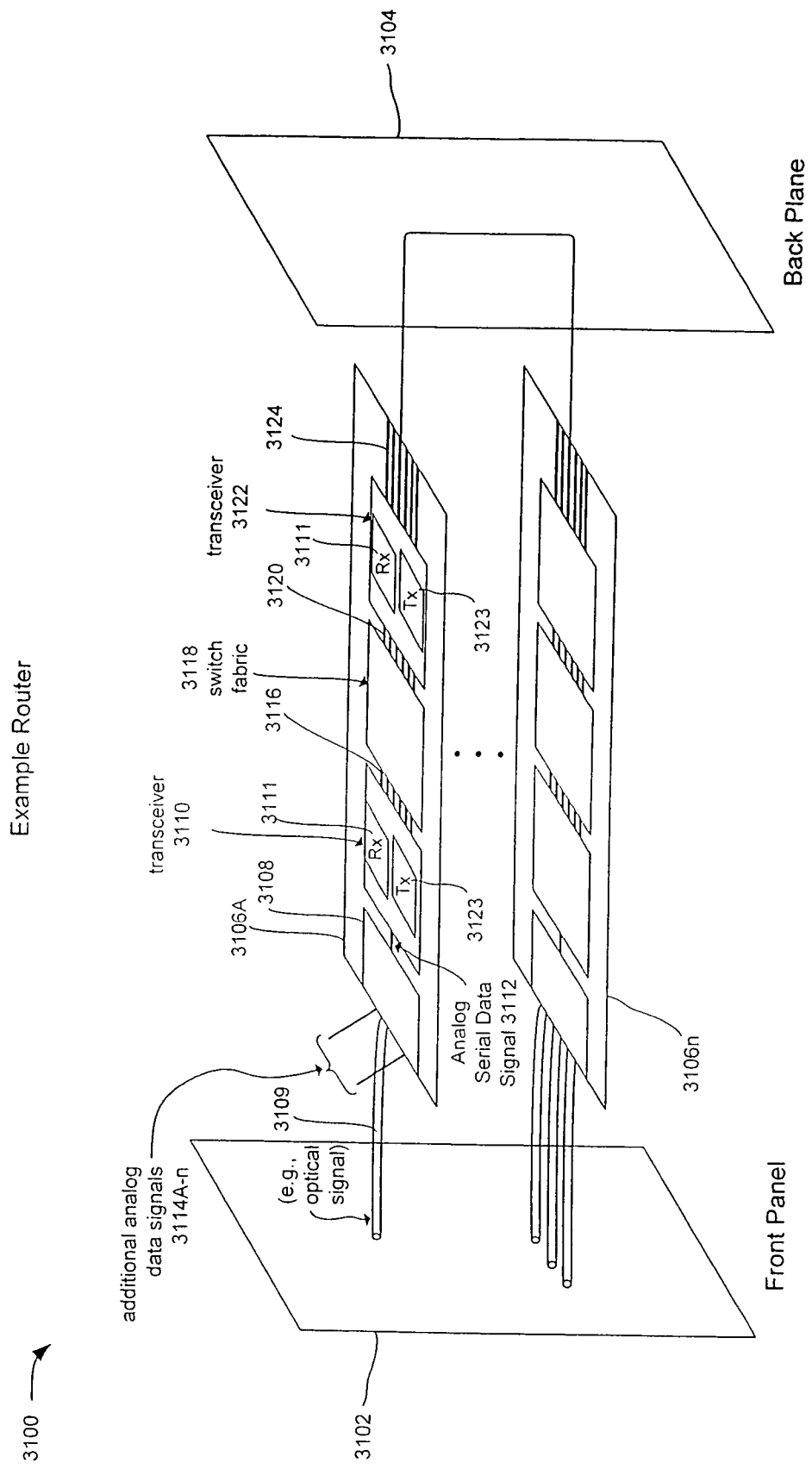

FIG. 31 is an illustration of an example use of a transceiver/communication device of the present invention in an example signal router.

Figure 32:
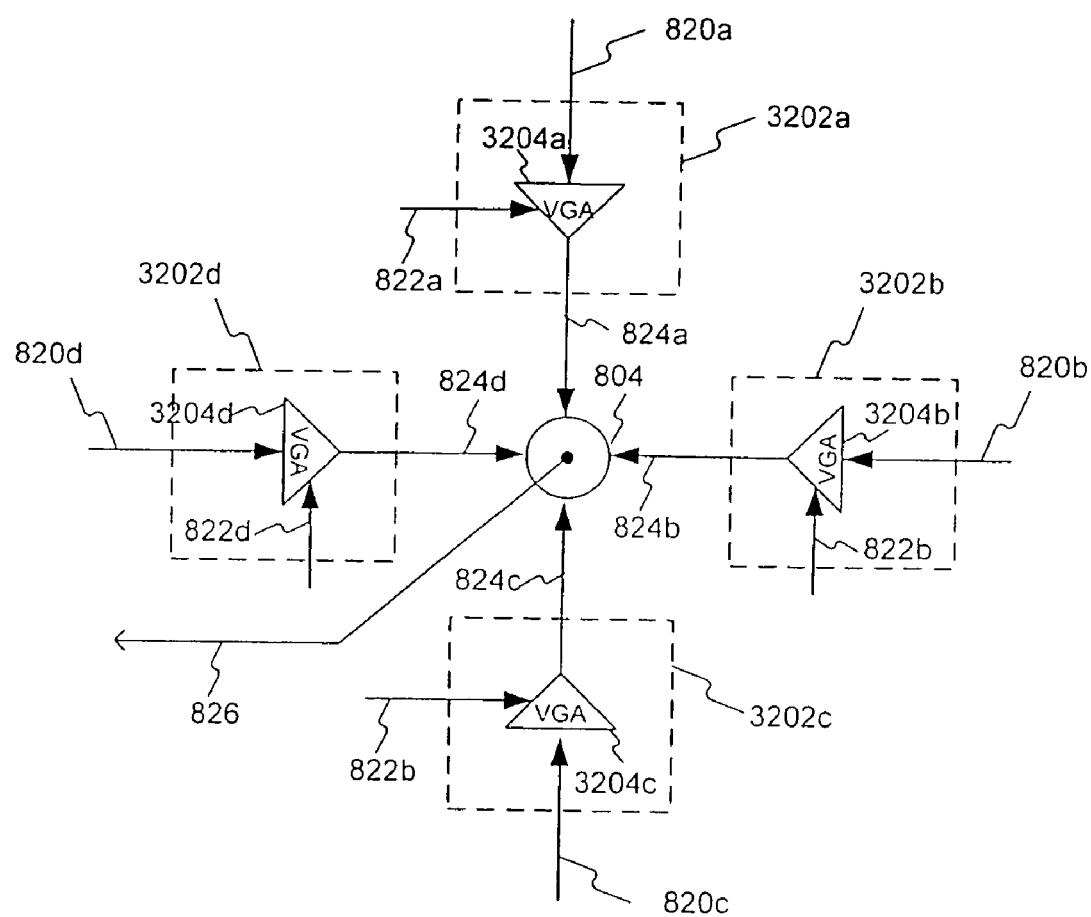

FIG. 32 is a block diagram of an alternative phase interpolator implementation.

Figure 33:
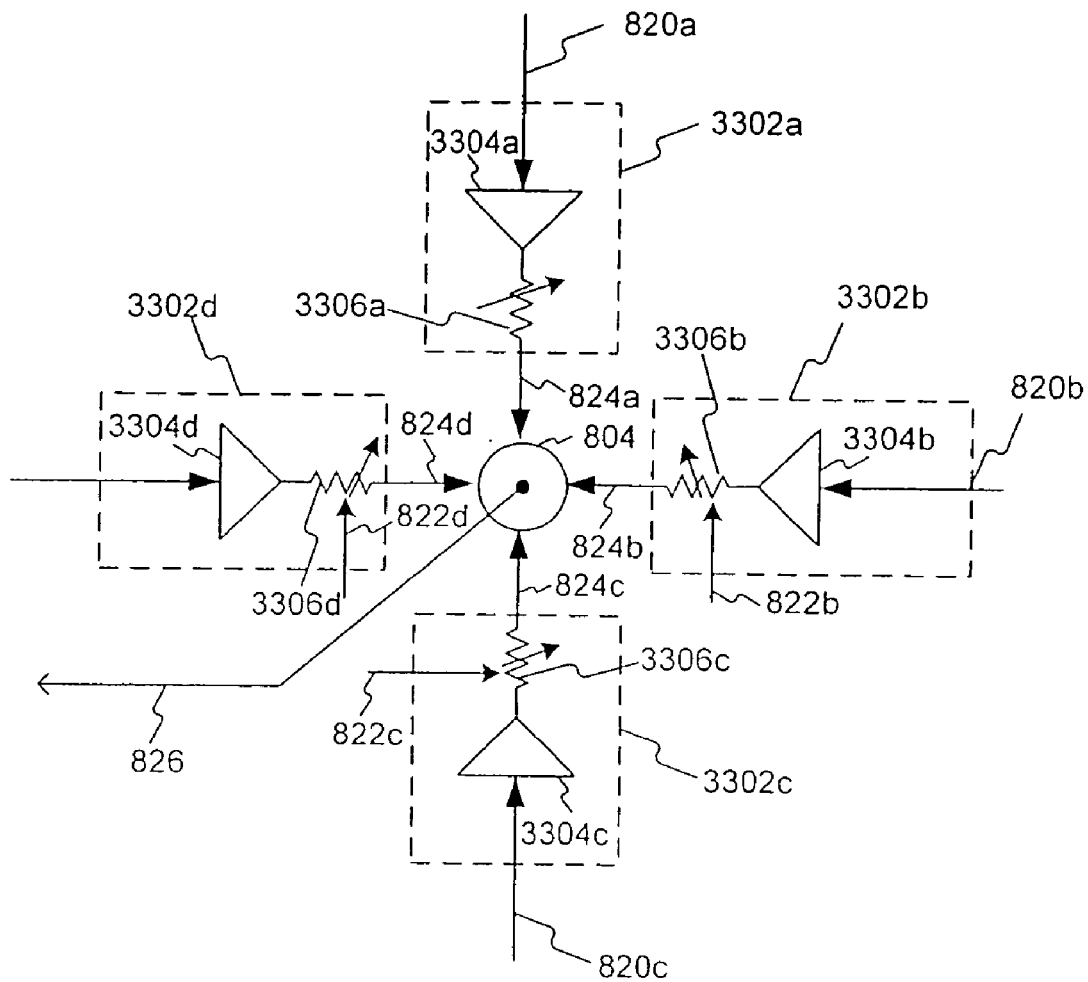

FIG. 33 is a block diagram of another alternative phase interpolator implementation.

DETAILED DESCRIPTION OF THE INVENTION

I. Overview

Figure 1:
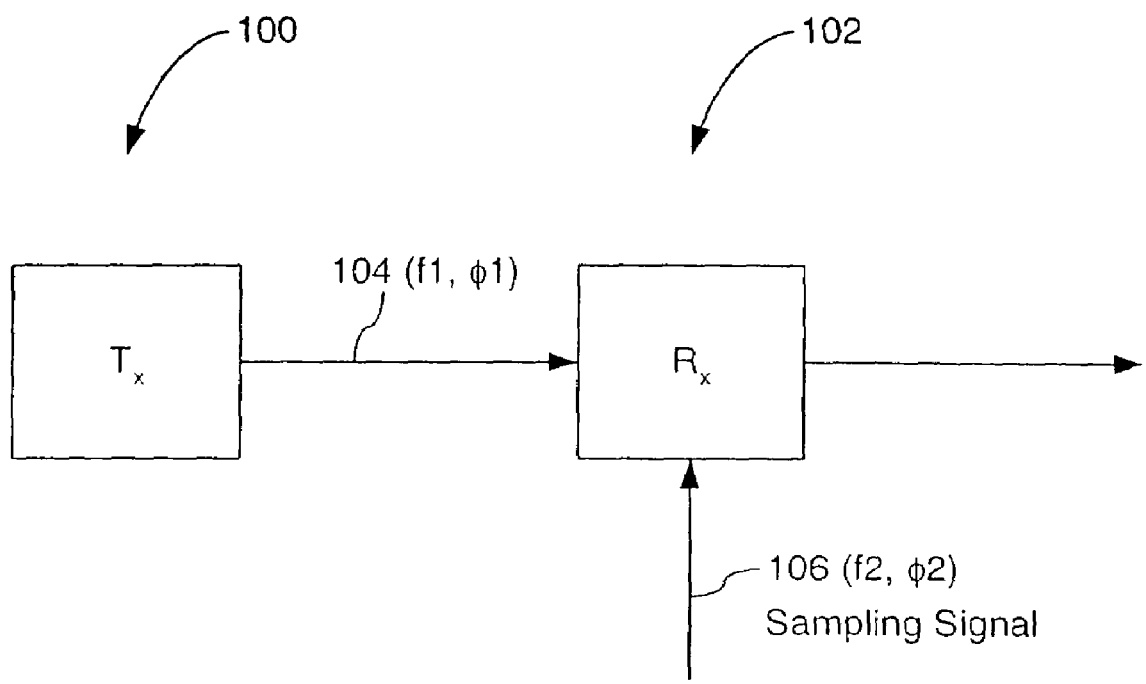
FIG. 1 is a block diagram of a simple communication system.

FIG. 1 is a block diagram of a simple communication system 100 including a transmitter 100 and a receiver 102. Transmitter 100 transmits a serial data signal 104 including, for example, a series of data symbols, to receiver 102. Serial data signal 104 has a frequency f1 (for example, a symbol baud rate f1) and a phase $\phi 1$ both related to a frequency and a phase of an oscillator (not shown) local to transmitter 100.

Receiver 102 samples serial data signal 104 (for example, symbols included in the serial data signal) to recover data from the serial data signal. Receiver 102 samples serial data signal at sample times established by a sampling signal 106 generated locally at receiver 102. Locally generated sampling signal 106 has a frequency f2 and a phase $\phi 2$.

To minimize errors in recovering the data from serial data signal 104, it is desirable that frequencies f2 and f1 match one another, and that phases $\phi 1$ and $\phi 2$ are aligned with one another, such that sampling signal 106 causes receiver 102 to sample serial data signal 104 at optimum sample times coinciding with occurrences of a maximum Signal-to-Noise (S/N) level of the serial data signal. Often, however, frequency f2 and phase $\phi 2$ are respectively offset from frequency f1 and phase $\phi 1$ because of differences between the respective oscillators used in transmitter 100 and receiver 102.

The phase offset between phase $\phi 1$ and phase $\phi 2$ can cause receiver 102 to sample serial data signal 104 at sub-optimal sample times, while the frequency offset between frequencies f1 and f2 tends to cause the serial data signal to "drift" through sampling signal 106. Therefore, such offsets can cause errors in recovering the data from serial data signal 104. Therefore, it is desirable to compensate for such deleterious frequency and phase offsets in receiver 102 in order to optimally recover data from serial data signal 104.

II. Exemplary Receiver

Figure 2:
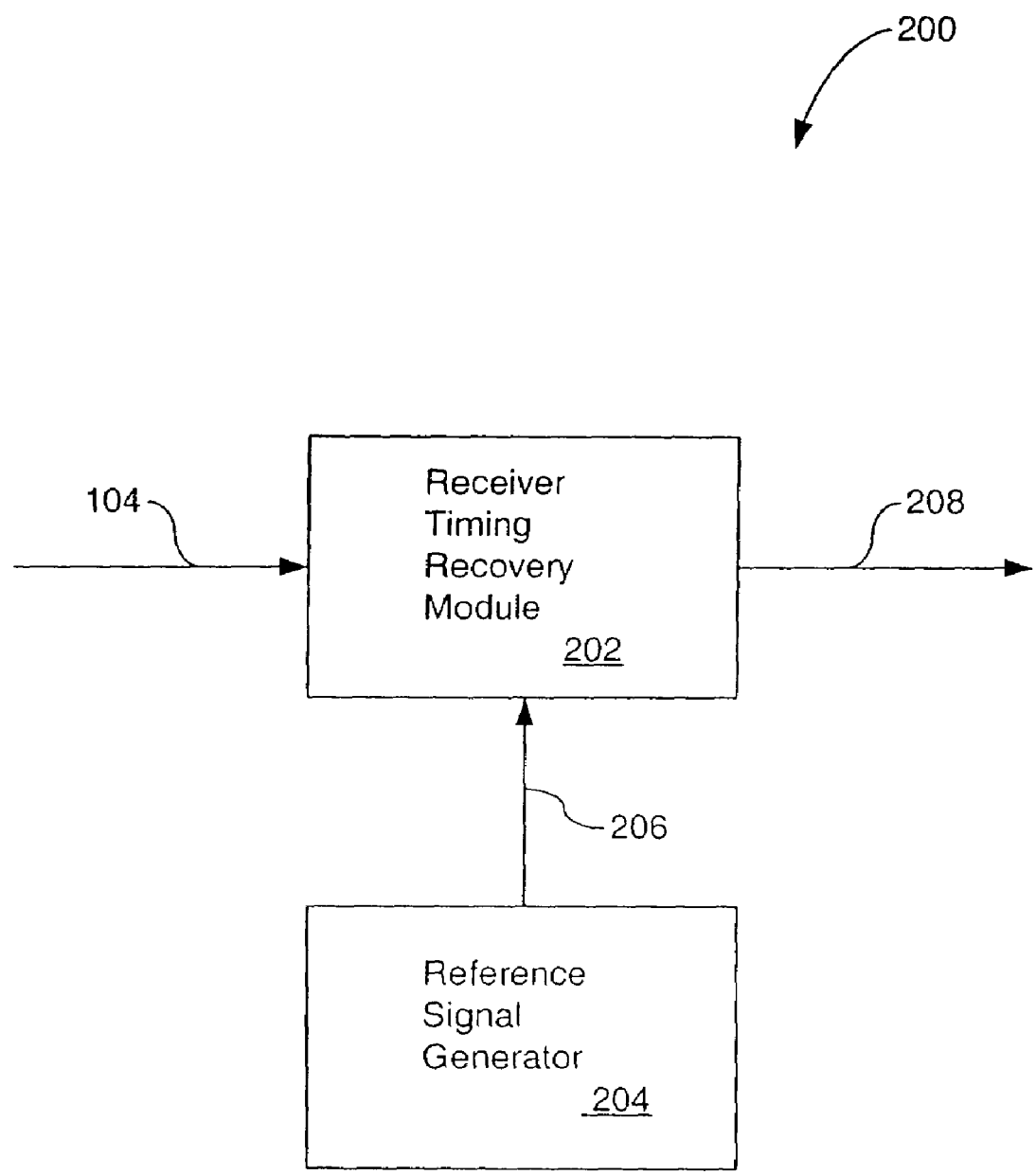
FIG. 2 is a block diagram of a portion of an exemplary receiver.

FIG. 2 is a block diagram of a portion of an exemplary receiver 200 including a timing recovery module 202 of the present invention. Receiver 200 also includes a reference signal generator 204. Timing recovery module 202 receives serial data signal 104, including, for example, a series of data symbols. Reference signal generator 204 generates a set of reference signals 206 and provides the reference signal set to timing recovery module 202.

Based on serial data signal 104 and reference signal set 206, timing recovery module 202 derives a timing/sampling signal 208 used by receiver 200 to recover data from serial data signal 104. Timing/sampling signal 208 is preferably used as a sampling signal in receiver 200 to sample symbols included in serial data signal 104. Timing recovery module 202 derives sampling signal 208 such that the sampling signal is phase-aligned with serial data signal 104 and such that the frequency of sampling signal 208 matches the frequency (such as a symbol baud rate) of serial data signal 104. In this manner, timing recovery module 202 recovers timing information (for example, phase and frequency information) from serial data signal 104 in accordance with the principles of the present invention, as described in detail below.

FIG. 3 is a block diagram of timing recovery module 202 according to an embodiment of the present invention. Timing recovery module 202 includes a phase controller 302, a phase control signal rotator 304, and a phase interpolator 306. Phase controller 302 includes a data path 308, a phase path 310, a phase detector 312 coupled to the data and phase paths, and a phase error processor 314 coupled to the phase detector.

Also depicted in FIG. 3 is an exemplary block diagram of reference signal generator 204. Reference signal generator 204 includes a reference oscillator 330, a Phase Locked Loop (PLL) 332, and a signal set generator 334. Reference oscillator 330 provides an oscillator signal 335 to PLL 332. PLL 332 synthesizes a reference signal 336 based on oscillator signal 335, and provides the reference signal to signal set generator 334. PLL 332 can include an inductance-capacitance (LC), voltage controlled oscillator, for example. Signal set generator 334 generates the set of reference signals 206 based on reference signal 336. The reference signals included in reference signal set 206 all have a same frequency but different predetermined phases. Signal set generator 334 provides reference signal set 206 to phase interpolator 306 of timing recovery module 202. PLL 332 and signal set generator 334 can be implemented as a tapped ring oscillator, for example.

Phase interpolator 306 produces timing/sampling signal 208 (mentioned above in connection with FIG. 2) and a second timing/sampling signal 344 offset in phase from sampling signal 208, based on reference signal set 206 and a plurality of digital phase control signals 340 applied to the phase interpolator. Sampling signals 208 and 344 each have an interpolated phase controlled in accordance with digital control signals 340. Sampling signal 208 and second sampling signal 344 are also referred to herein as data sampling signal 208 and phase sampling signal 344, for reasons that will become apparent from the description below.

Data path 308 includes sampling and quantizing signal processing modules to sample and quantize serial data signal 104 in accordance with sample times established by sampling signal 208. Data path 308 produces a data signal 346 including sampled and quantized data samples representative of serial data signal 104. Data path 308 provides data signal 346 to phase detector 312.

Similarly, phase path 310 includes sampling and quantizing signal processing modules for sampling and quantizing serial data signal 104 at sample times established by phase sampling signal 344. The sampling times established by phase sampling signal 344 are offset in phase from the sample times established by data sampling signal 208. Phase path 310 produces a second data signal 348 (referred to herein as a phase signal 348) including a series of phase samples also indicative of serial data signal 104. Phase path 310 provides phase signal 348 to phase detector 312. Exemplary data and phase paths are described later in connection with FIGS. 22 and 28. However, the present invention is not limited to such implementations.

Phase detector 312 detects a phase error 350 between data sampling signal 208 and serial data signal 104 based on the data samples in data signal 346 and the phase samples in phase signal 348. Phase error 350 arises because of an undesirable phase offset between data sampling signal 208 (and also phase sampling signal 344) and serial data signal 104. Thus phase error 350 can be considered a phase error signal indicative of the phase offset between data sampling signal 208 and serial data signal 104.

Phase detector 312 provides phase error 350 to phase error processor 314. Phase error processor 314 process phase error 350 to derive one of a set of rotator control signals or commands 354. Phase error processor 314 provides the rotator control command to phase control signal rotator 304.

Phase control signal rotator 304 stores the digital phase control signals 340 applied to phase interpolator 306, and manipulates the same in response to the rotator control commands 354. Signal rotator 304 rotates the plurality of digital phase control signals 340 and correspondingly the interpolated phase of data sampling signal 208 relative to serial data signal 104 in response to the rotator control commands 354, such that the sampling signal and the serial data signal become phase aligned with one another.

III. Exemplary Signal Waveforms

FIG. 4A is an illustration of an example waveform 402 of analog serial data signal 104. Waveform 402 represents a Non-Return-to-Zero (NRZ) signal swinging above (i.e., in a positive direction "+") and below (i.e., in a negative direction "−") a zero-line 408, to respectively convey information, such as digital "1s" and "0s." The serial data signal represented by waveform 402 includes a series of consecutive symbols 404 each having a symbol period T. Dashed vertical lines 406 in FIG. 4A represent boundaries between adjacent symbols 404. Received symbols 404 have a "rounded" instead of "squared" appearance because of transmission band-limiting effects on serial data signal 104.

FIG. 4B is an illustration of an example symbol 410 from waveform 402. An optimum sample time $t_o$ at which the receiver can sample symbol 410 coincides with a maximum amplitude 412 and correspondingly a maximum symbol S/N of the symbol. In the depicted example, time $t_o$ coincides with a mid-point of symbol 410. With reference again to FIG. 3, the present invention adjusts the phase of sampling signal 208 to cause data path 308 to sample each symbol in serial data signal 104 at an optimum data sample time, such as at sample time $t_o$ depicted in FIG. 4B.

FIGS. 4C, 4D, and 4E are illustrations of three different data sampling time scenarios. FIG. 4C is an illustration of an on-time data sampling scenario. With reference to FIG. 3 and FIG. 4C, in the on-time scenario, sampling signal 208 causes data path 308 to sample data symbol 410 at a sample time $t_d$ (represented as an upward pointing arrow in FIG. 4C) coinciding with optimum sample time $t_o$, to produce an on-time data sample 414 coinciding with mid-point 412 of symbol 410 (depicted in FIG. 4B). Since sample time $t_d$ coincides with optimum sample time $t_o$, sampling signal 208 is considered to be phase-aligned with symbol 410, that is, with serial data signal 104. In other words, there is a minimum acceptable (or preferably a zero-time) offset between sample time $t_d$ and optimum sample time $t_o$.

FIG. 4D is an illustration of an early or leading data sampling scenario. In the leading data sampling scenario, data sample time $t_d$ defined by sampling signal 208 precedes (that is, leads) optimum sample time $t_o$ because the phase of sampling signal 208 leads the phase of symbol 410 in serial data signal 104. In response to this sub-optimal early phase condition, the present invention retards the phase of sampling signal 208 relative to serial data signal 104 (and thus received symbol 410) so as to align sample time $t_d$ with optimum sample time $t_O$, as depicted in FIG. 4C.

FIG. 4E is an illustration of a late sampling time scenario. In the late sampling scenario, sample time $t_d$ follows optimum sample time $t_O$ because the phase of sampling signal 208 lags the phase of serial data signal 104 (and symbol 410). In response to this sub-optimal lagging phase condition, the present invention advances the phase of sampling signal 208 so as to align sample time $t_d$ with optimum sample time $t_O$, as depicted in FIG. 4C.

Receiver sampling of serial data signal 104 using data path 308 and phase path 310 in accordance with sampling signals 208 and 344 is now further described by way of example with reference to FIGS. 5A, 5B, and 5C. FIG. 5A is a sampled waveform 502 corresponding to serial data signal waveform 402 of FIG. 4A. Sampled waveform 502 includes a series of spaced data samples 504 (depicted as circles superimposed on the waveform trace) produced by data path 308 in accordance with data sampling signal 208. Sampled waveform 504 also includes a series of spaced phase samples 506 (depicted as squares superimposed on the waveform trace) produced by phase path 310 in accordance with phase sampling signal 344.

FIG. 5B is an example data sample timeline 510 established by data sampling signal 208. Data path 308 samples serial data signal 104 at data sample times, for example, at sample times $t_{d1}$, $t_{d2}$, and $t_{d3}$ (referred to generally as sample time(s) $t_d$), to produce corresponding data samples $504_1$, $504_2$, and $504_3$ included in data signal 346. Data sampling signal 208 can be a clock wave having an approximately 50% duty cycle, wherein each sample time $t_d$ coincides with a rising edge of the clock wave, for example. The clockwave can have higher or lower duty cycles.

FIG. 5C is an example phase sample time line 520 established by phase sampling signal 344. Phase path 310 samples serial data signal 104 at phase sample times of, for example, $t_{p1}$, $t_{p2}$, and $t_{p3}$ (represented as downward pointing arrows and referred to generally as phase sample time(s) $t_p$), to produce corresponding phase samples $506_1$, $506_2$, and $506_3$ included in phase signal 348. Phase sampling signal 344 can be a clock wave having an approximately 50% duty cycle, wherein each sample time $t_p$ coincides with a rising edge of the clock wave, for example. The clockwave is not limited to a 50% duty cycle.

When data sampling signal 208 is phase aligned with serial data signal 104 as depicted in FIG. 4C, for example, and when the frequency (that is, pulse repetition interval) of sampling signal 208 matches the frequency (that is, symbol baud rate) of serial data signal 104, adjacent data sampling times (e.g., $t_{d1}$, $t_{d2}$,) and adjacent phase sampling times (e.g., $t_{p1}$, $t_{p2}$,) are separated by symbol period T. Also, adjacent data and phase sample times (e.g., $t_{d1}$, $t_{p1}$,) are separated by a half symbol period T/2.

FIGS. 6A, 6B, and 6C are illustrations of sampling time scenarios corresponding respectively to previously described FIGS. 4C, 4D and 4E, except that phase samples are added to FIGS. 6A, 6B, and 6C. In an on-time sampling scenario illustrated in FIG. 6A, a phase sample 602 (for example $506_1$) precedes data sample 414 (for example $504_2$), and a phase sample 404 (for example, $506_2$) follows data sample 414. First and second phase samples 602 and 604 coincide with zero-line 408 in the on-time scenario depicted in FIG. 6A. This indicates data sample time $t_d$ coincides with optimum sample time $t_O$, and thus, the phases of sampling signal 208 and serial data signal 104 are optimally aligned with one another.

In a leading sampling scenario depicted in FIG. 6B, leading phase sample 602 has a negative value while data sample 414 and trailing phase sample 604 have positive values. This indicates data sample time $t_d$ leads optimum sampling time $t_O$, and thus, the phase of sampling signal 208 correspondingly leads the phase of serial data signal 104.

On the other hand, in a lagging sampling time scenario depicted in FIG. 6C, leading phase sample 602 and data sample 414 have positive values while trailing phase sample 604 has a negative value. This indicates data sample time $t_d$ trails optimum sample time $t_O$, and thus, the phase of sampling signal 208 correspondingly lags the phase of serial data signal 104.

IV. Exemplary Timing Recovery Method

FIG. 7 is a flow diagram of an example method 700 of recovering timing information from an NRZ serial data signal (such as serial data signal 104) that can be implemented using timing recovery module 202.

At a first step 702, phase interpolator 306 receives the reference signals having different phases in reference signal set 206. Interpolator 306 combines in varying relative proportions the reference signals into data sampling signal 208 in response to the plurality of digital phase control signals 340, thereby producing data sampling signal 208 with a digitally controlled interpolated phase. Phase interpolator 306 also produces phase sampling signal 344 in response to the digital phase control signal such that the phase sampling signal and the data sampling signal are offset in phase from one another by a predetermined amount corresponding to a fraction (for example, one-half) of a symbol period of serial data signal 104.

At a next step 704, data path 308 samples serial data signal 104 (i.e., the symbols included in serial data signal 104) at data sample times $t_d$ according to the data sampling signal 208 to produce data samples in data signal 346. Phase path 310 also samples serial data signal 104 at phase sample times $t_p$ offset in phase relative to the data sample times $t_d$ to produce phase samples in phase signal 348.

At a next step 706 (depicted in dotted line in FIG. 7), phase detector 312 detects a phase error or phase offset between data sampling signal 208 and serial data signal 104 based on the data samples in data signals 346 and the phase samples in phase signal 348. Next steps 708, 710 and 712 described below collectively represent step 706. At step 708, phase detector 312 examines the data samples in data signal 346 to detect occurrences of low-to-high and high-to-low data sample transitions. Such transitions occur at symbol boundaries.

At next step 710, phase detector 312 determines whether each of the data sample times $t_d$ near to detected data sample transitions (from step 706) is early or late with respect to optimum symbol sample time $t_O$, based on data and phase samples near the detected data sample transitions.

At next step 712, phase detector 312 derives phase error signal 350 indicative of whether each data sample time $t_d$ is early or late with respect to the optimum symbol sample time $t_O$. Phase detector 312 derives as the phase error signal an Early decision signal indicating the phase of sampling signal 208 leads the phase of serial data signal 104 when the data sample time $t_d$ precedes optimum sample time $t_O$. Therefore, phase detector 312 produces a series of such Early decision signals over time while the phase of sampling signal 208 leads the phase of serial data signal 104.

Alternatively, phase detector 312 derives as the phase error signal 350 a Late decision signal indicating the phase of sampling signal 208 lags the phase of serial data signal 104 when the data sample time $t_d$ follows optimum sample time $t_O$. Therefore, phase detector 312 produces a series of such Late decision signals over time while the phase of sampling signal 208 lags the phase of serial data signal 104.

On the other hand, phase detector 312 tends to produce a series of randomly alternating Late and Early decision signals over time while sampling signal 208 and serial data signal 104 are phase aligned with each other.

At a next step 720, phase error processor 314 processes the phase error over time (i.e., over many data and phase samples, and corresponding Early/Late decision signals) to determine which of the phase control commands 354 needs to be asserted. Phase error processor 314 can include an accumulator and/or a filter for accumulating and/or filtering the Early or Late decision signals included in phase error signal 350, to determined which of the phase control commands 354 needs to be asserted. The set of phase control commands 354 includes a phase-hold command, a phase-retard command, and a phase-advance command. Phase error processor 314 asserts:

a. the phase-hold command when sampling signal 208 and serial data signal 104 are phase aligned with one another;

b. the phase-retard command when the phase of sampling signal 208 leads the phase of serial data signal 104; and c. the phase-advance command when the phase of sampling signal 208 lags the phase of serial data signal 104.

At a next step 730, phase control signal rotator 304 rotates the plurality of digital phase control signals 340, and correspondingly the interpolated phase of data sampling signal 208, in response to the phase-retard/phase-advance control command asserted by phase error processor 314, such that data sampling signal 208 and serial data signal 104 become phase aligned with one another as depicted, for example, in FIG. 6A. Alternatively, signal rotator 304 holds the plurality of digital phase control signals 340 in position, thereby preventing rotation of the phase control signals and correspondingly the interpolated phase of data sampling signal 208, in response to the phase-hold control command when asserted by phase error processor 314.

FIG. 7A is a flow chart of an example method 770 expanding on phase rotating step 730 of method 700. A step 775 is initiated in response to the phase retard command. At step 775, the interpolated phase of sampling signal 208 is retarded relative to serial data signal 104.

A step 780 is initiated in response to the phase advance command. At step 780, the interpolated phase of sampling signal 208 is advanced relative to serial data signal 104.

A step 785 is initiated in response to the phase hold command. At step 785, the interpolated phase of sampling signal 208 is held at a present value.

V. Phase Interpolator

As described above with reference to FIG. 3 and FIG. 7, timing recovery module 202 includes a phase interpolator 306 that combines reference signals 206 to generate sampling signals 208 and 344. These sampling signals are generated by interpolation techniques performed by phase interpolator 306. These interpolation techniques can provide sampling signal phases that span a complete rotation of degrees. These phases are achieved without the use of conventional techniques, such as time-delays.

In addition to the exemplary timing recovery and receiver applications described herein, the phase interpolation techniques of the present invention may be used in other applications.

An exemplary phase interpolator environment is now described. FIG. 8 is a block diagram of a phase interpolation environment 800. Environment 800 includes a phase interpolator 801, such as phase interpolator 306, and a stage controller 806, such as phase control signal rotator 304 or other controller. The controller 806 is not limited to a control signal rotator.

Interpolator 801 includes a plurality of reference stages 802a–d that are each coupled to stage controller 806, and a combining node 804 that is coupled to each of reference stages 802. As shown in FIG. 8, each reference stage 802 receives a corresponding reference signal 820. These reference signals are each periodic waveforms that each have a distinct phase. Examples of periodic waveforms include sinusoid, rectangular waveforms, trapezoidal waveforms, and other similar periodic signals.

In addition, each reference stage 802 receives a corresponding control signal 822 from stage controller 806. As shown in FIG. 8, reference stage 802a receives control signal 822a, reference stage 802b receives control signal 822b, and reference stage 802c receives control signal 822c.

Each reference stage 802 generates a component signal 824 from its corresponding reference signal 822 according to a scaling factor that is the ratio of a component signal 824 magnitude to its corresponding reference signal 820 magnitude. A reference stage 802 scaling factor is determined by its corresponding control signal 822. For example, reference stage 802a generates component signal 824a from reference signal 820a according to a scaling factor determined by control signal 822a.

These scaling factors control the magnitude of corresponding component signals 824. This controlled magnitude may be zero. Thus, control signals 822 may scale as well as activate and deactivate corresponding component signals 824.

Component signals 824 are each sent to combining node 804. As shown in FIG. 8, reference stage 802a generates a component signal 824a, reference stage 802b generates a component signal 824b, reference stage 802c generates a component signal 824c, and so on.

Combining node 804 combines each of component signals 824 to produce an output signal 826. This combining includes summing each of the individual component signals 824 (some of which may have a magnitude equal to zero). As a result of this combining, output signal 826 is a periodic waveform having a phase that is derived from the phases of component signals 824. This derivation is referred to herein as phase interpolation.

Stage controller 806 generates stage control signals 822 in response to an interpolation command 828 that is received from a master system controller (not shown), such as rotator control commands 354 received from phase error processor 314. Exemplary details regarding interpolation command 828 are provided in greater detail below.

As described above, each reference stage 802 generates a component signal 824 from a reference signal 820 having a distinct phase. These generated component signals 824 each have a distinct phase that is determined by the corresponding reference signal 820 phase. For example, a component signal 824 may have the same or substantially the same phase as its corresponding reference signal 820. Alternatively, a component signal 824 may have a phase that is offset by a predetermined phase shift from the corresponding reference signal 820 phase.

Through phase interpolation, the present invention can provide a complete range of phases (i.e., degrees) for output signal 826. This complete range is provided through the deployment of more than two reference stages 802 and a strategic predetermined selection of reference signal 820 phases.

FIG. 9 is a block diagram of a first phase interpolator 801 implementation. This implementation includes four reference stages 802*a–d* that receive reference signals 820*a–d*, respectively. Each of reference signals 820*a–d* has a distinct, predetermined phase. As shown in FIG. 9 by way of example, reference signal 820*a* has a phase 910*a* of zero degrees, reference signal 820*b* has a phase 910*b* of 90 degrees, reference signal 820*c* has a phase 910*c* of 180 degrees, and reference signal 820*d* has a phase 910*d* of 270 degrees. Thus, the implementation of FIG. 9 includes four reference signals 820 having phases 910 that are separated at intervals of 90 degrees.

In addition, FIG. 9 illustrates that each reference stage 802 includes a scaling module 902, and a conversion module 904 that is coupled to scaling module 902. Each conversion module 904 receives and converts a reference signal 820 into a corresponding component signal 824 according to a scaling factor. Scaling module 902 establishes this scaling factor in response to its corresponding control signal 822. Details regarding implementations of scaling module 902 and conversion module 904 are provided below.

The phase interpolator 801 implementation shown in FIG. 9 receives binary control signals 822 that are capable of having two distinct values (i.e., 0 and 1). Accordingly, FIG. 9 shows phase interpolator 801 having an operational state where control signals 822*a*, 822*c*, and 822*d* have values of 0, and control signal 822*d* has a value of 1.

FIG. 10 is a phasor diagram that illustrates the phase interpolation capabilities of the phase interpolator 801 implementation shown in FIG. 9. This implementation is capable of generating output signal 826 having one of eight possible phases. These eight possible phases are spaced at intervals of 45 degrees, and span a complete rotation of degrees. Phasor diagram 1000 includes phasors 1002, 1006, 1010, and 1014. These phasors have the same phases as reference signal phases 910*a*, 910*b*, 910*c*, and 910*d*, respectively.

In addition, phasor diagram 1000 includes phasors 1004, 1008, 1012, and 1016. These phasors have phases that are between reference phases 910*a–d*. As shown in FIG. 10, phasor 1004 has a phase of 45 degrees, phasor 1008 has a phase of 135 degrees, phasor 1012 has a phase of 225 degrees, and phasor 1016 has a phase of 315 degrees. These "between" phases are established through combining two component signals 824 at combining node 804. Table 1, below, shows how the values of control signals 822*a* through 822*d* determine which of the phasors in FIG. 3 represents output signal 826.

TABLE 1

| Control Signals | | | | Output Signals | |
|---|---|---|---|---|---|
| 2922a | 2922b | 2922c | 2922d | Phasor | Phase |
| 0 | 0 | 0 | 1 | 1002 | 0 |
| 0 | 0 | 1 | 1 | 1004 | 45 |
| 0 | 0 | 1 | 0 | 1006 | 90 |

TABLE 1-continued

| Control Signals | | | | Output Signals | |
|---|---|---|---|---|---|
| 2922a | 2922b | 2922c | 2922d | Phasor | Phase |
| 0 | 1 | 1 | 0 | 1008 | 135 |
| 0 | 1 | 0 | 0 | 1010 | 180 |
| 1 | 1 | 0 | 0 | 1012 | 225 |
| 1 | 0 | 0 | 0 | 1014 | 270 |
| 1 | 0 | 0 | 1 | 1016 | 315 |

Thus, the phase interpolator 801 implementation of FIG. 9 can adjust output signal 826 among eight distinct phases.

FIG. 11 is an exemplary schematic of a reference stage 802 circuit that receives a binary control signal 822. Thus, this circuit may be employed in the phase interpolator 801 implementation of FIG. 9. In this circuit, reference signals 820 and component signals 824 are each differential signal pairs that have an in-phase signal and a 180 degrees out-of-phase signal. Except for a 180 degrees phase shift, these signals are the same. As shown in FIG. 11, reference signal 820 includes an in-phase signal 1120 and an out-of-phase signal 1122. Similarly, component signal 824 includes an in-phase signal 1124 and an out-of-phase signal 1126. These signals are time varying voltage signals.

As described above with reference to FIG. 9, reference stage 802 includes a scaling module 902 and a conversion module 904. As shown in FIG. 11, conversion module 904 includes two N channel metal oxide semiconductor (NMOS) field effect transistors (FETs) 1102 and 1104 that each have drain, source, and gate terminals. However, conversion module 904 may employ other transconductance devices.

Scaling module 902 includes a current digital to analog converter (IDAC) 1106 that is coupled to the source terminals of FETs 1102 and 1104.

Scaling module 902 receives binary control signal 822. When binary control signal 822 has a value of 1, IDAC 1106 operates as a current generator that enables a current 1128 to flow through the drain and source terminals of FETs 1102 and 1104. However, when binary control signal 822 has a value of 0, IDAC 1106 does not enable current 1128 to flow (i.e., current 1128 has zero magnitude).

The flow of current 1128 enables reference signal 820 to be converted into corresponding component signal 824. That is, source current 1128 enables the conversion of differential reference signals 1120 and 1122 into differential component signals 1124 and 1126, respectively. This conversion is performed according to a specific scaling factor.

Differential component signals 1124 and 1126 are electrical current signals that are combined at combining node 804 with differential component signals from other reference stages 802. This combining generates output signal 826. An exemplary combining node 804 circuit schematic is described below with reference to FIG. 14.

As described above, the phase interpolator 801 implementation of FIG. 9 is capable of producing eight different phases for control signal 826 at a granularity of 45 degrees. However, the present invention may achieve finer phase granularity through implementations where each control signal 822 is capable of having more than two distinct values.

FIG. 12 is a block diagram showing an implementation of phase interpolator 801 that receives control signals 822 capable of having more than two distinct values. This implementation enables output signal 826 to have a greater number of phases than the implementation of FIG. 9. The FIG. 12 implementation of phase interpolator 801 includes a plurality of reference stages 802'.

Unlike reference stages 802 of FIG. 9, each reference stage 802' receives a composite control signal 822' that includes a plurality of binary subsignals 1220. For example, reference stage 802a' receives composite control signal 822a', which includes subsignals 1220a–d. These subsignals 1220 each contribute to the value of the corresponding composite control signal 822'. For example, subsignals 1220a–d contribute to the value of composite control signal 822a'.

For purposes of convenience, only reference stage 802a' will be described in detail. However, the other reference stages 802' shown in FIG. 12 may include identical or similar features. Reference stage 802a' includes a plurality of scaling modules 902. In particular, the implementation of FIG. 12 shows four scaling modules 902a–902d. However, any number may be employed. In addition, reference stage 802a' includes a conversion module 904 that is coupled to each of scaling modules 902a–d.

Scaling modules 902a–d each receive a respective one of subsignals 1220a–d. As shown in FIG. 12, scaling module 902a receives subsignal 1220a, scaling module 902b receives subsignal 1220b, scaling module 902c receives subsignal 1220c, and scaling module 902d receives subsignal 1220d.

Each of scaling modules 902a–d provide an individual contribution to the reference stage 802' scaling factor. These individual contributions are based on the value of the corresponding control subsignal 1220. As described above, scaling factor is the ratio of a component signal 824 magnitude to its corresponding reference signal 820 magnitude. Accordingly, the aggregate sum of control signals 1220a–d (also referred to herein as the value of composite control signal 822') determines the reference stage 802a' scaling factor according to a predetermined relationship. According to one such relationship, the reference stage 802a' scaling factor increases with the value of composite control signal 822'.

Since subsignals 1220a–d are each binary signals, aggregate control signals 822' can have five distinct values. Thus, reference stage 802a' can generate component signal 824a from reference signal 820a according to five different scaling factors. One of these scaling factors may be equal to zero, thereby causing corresponding component signal 824a to also have a magnitude of zero. Thus, the phase interpolator 801 implementation of FIG. 11 generates component signals 824a–d that each may have one of five different magnitudes. These five different magnitudes advantageously provide a number of attainable control signal 826 phases across a degrees range that is greater than the eight phases achievable with the phase interpolator 801 implementation of FIG. 9.

FIG. 13 is a schematic of a reference stage 802' circuit that receives a control signal having multiple binary subsignals. Thus, this circuit may be employed in the phase interpolator 801 implementation of FIG. 12, which receives a plurality of control subsignals 1220a–d. In this circuit, reference signals 820 and component signals 824 are each differential signal pairs that have an in-phase signal and a 180 degrees out-of-phase signal. Except for a 180 degrees phase shift, these signals are the same. As shown in FIG. 13, reference signal 820 includes an in-phase signal 1320 and an out-of-phase signal 1322. Similarly, component signal 824 includes an in-phase signal 1324 and an out-of-phase signal 1326. These signals are time varying voltage signals.

As described above with reference to FIG. 12, reference stage 802 includes a plurality of scaling modules 902a–d and a conversion module 904. Conversion modules 904 includes two N channel metal oxide semiconductor (NMOS) field effect transistors (FETs) 1302 and 1304 that each have drain, source, and gate terminals. However, conversion modules 904 may employ other transconductance devices.

Scaling modules 902a–d each include an IDAC 1306, shown in FIG. 13 as IDACs 1306a–d. IDACs 1306a–d are each coupled to the source terminals of FETs 1302 and 1304.

Each of IDACs 1306a–d receives a respective one of binary control subsignals 1220a–d and, enables a corresponding current 1328 to flow from the source terminals of FETs 1302 and 1304 when the respective control subsignal 1220 has a value of 1. For example, IDAC 1306a enables a current 1328a to flow when subsignal 1220a equals 1. However, when a control subsignal 1220 has a value of 0, the corresponding IDAC 1306 does not enable corresponding current 1328 to flow (i.e., corresponding current 1328 has zero magnitude).

Currents 1328a–d each contribute to an aggregate current 1330. The value of aggregate current 1330 depends on the number of IDACs 1306 that are receiving a subsignal 1220 having a value of 1. As aggregate current 1330 increases, so does the scaling factor associated with the conversion of differential reference signals 1320 and 1322 into differential component signals 1324 and 1326, respectively.

Component signals 1324 and 1326 are electrical current signals. These current signals are combined at combining node 804 with component signals from other reference stages 802. This combining generates output signal 826. An exemplary combining node 804 circuit schematic is described below with reference to FIGS. 14A and 14B.

FIGS. 14A and 14B are schematics illustrating a combining node 804 circuit coupled to various reference stage 802 implementations. FIG. 14A, illustrates this combining node 804 coupled to the four reference stage 802 circuit of FIG. 11. However, FIG. 14B illustrates this combining node 804 circuit coupled to four reference stage 802' circuits of FIG. 13.

The combining node 804 circuit of FIGS. 14A and 14B includes a first resistor 1402, and a second resistor 1404. Resistors 1402 and 1404 are each coupled to a voltage node 1406, such as a Vdd rail. In addition, resistors 1402 and 1404 are coupled to reference stages 820a–d. As shown in FIGS. 14A and 14B, resistor 1402 is coupled to a FET 1102 within each reference stage 820. Similarly, resistor 1404 is coupled to a FET 1104 within each reference stage 120.

The combining node 804 circuit of FIGS. 14A and 14B also includes a first output node 1408 and a second output node 1410. Output nodes 1408 and 1410 provide output signal 826 in the form of a differential signal having an in-phase output signal 1420 and an out-of-phase output signal 1422. Output signals 1420 and 1422 are voltage signals measured in relation to a reference voltage, such as ground.

As described above with reference to FIGS. 11 and 13, each reference stage 802 includes a conversion module 904 that can generate a corresponding component signal 824 in the form of electrical current signals. Examples of such electrical current signals include signals 1124 and 1126, and signals 1324 and 1326.

In the FIG. 14A combining node 804 circuit, current signals 1124a–d and 1126a–d contribute to a voltage drop across resistors 1402 and 1404, respectively. Similarly, in the FIG. 14B combining node 804 circuit, current signals 1324a–d and 1326a–d contribute to a voltage drop across resistors 1402 and 1404, respectively. In FIGS. 14A and 14B, output signal 826 (i.e., output signals 1420 and 1422), is based on these voltage drops.

VI. Phase Rotation

FIG. 15 is a block diagram of phase interpolator 306 and phase control signal rotator 304 according to an embodiment of the present invention. For exemplary purposes, the embodiment of phase interpolator 306 depicted in FIG. 15 corresponds to the phase interpolator described in connection with FIGS. 12 and 14B. Also, the embodiment of control signal rotator 304 depicted in FIG. 15 is compatible with the depicted phase interpolator embodiment. Other embodiments of phase interpolator 306 (and correspondingly, of control signal rotator 304) are possible, as would be apparent to one of ordinary skill in the relevant art(s) after reading the description provided herein. For example, phase interpolator 306 can be implemented in accordance with the phase interpolator embodiments described above in connection with FIGS. 9, 11, and 14A, and below in connection with FIGS. 32 and 33.

Phase control signal rotator 304 (also referred to as signal rotator 304) receives phase control command set 354 from phase error processor 314. As mentioned above, and as depicted in FIG. 15, phase control command set 354 includes a phase-advance command 354a, a phase-retard command 354b, and a phase-hold command 354c. Phase-advance command 354a can be considered as a rotate-left command (that is, as a command to rotate the phase of sampling signal 208 in a counter-clockwise direction to advance its phase). Phase-retard command 354a can be considered as a rotate-right command (that is, as a command to rotate the phase of sampling signal 208 in a clockwise direction to retard its phase).

Signal rotator 304 manipulates the digital phase control signals 340 in accordance with an asserted one of phase control commands 354, and provides the so manipulated digital phase control signals 340 to phase interpolator 306, as will be described in further detail below. Signal rotator 304 includes a plurality of storage cells 1502 arranged in a ring configuration, generally referred to as a ring of storage cells 1504. The ring of storage cells 1504 includes a plurality of ring segments 1506a, 1506b, 1506c, and 1506d connected to one another by signal lines 1508a–1508d in the ring configuration, as depicted in FIG. 15. Each of the ring segments includes a plurality of the individual storage cells 1502. Each of the storage cells 1502 stores a corresponding one of the plurality of digital phase control signals 340. In one arrangement, the ring of storage cells 1504 is implemented as a circular shift register responsive to a shift-left, a shift-right, and a shift-enable control input (corresponding to commands 354a, 354b, and 354c, for example).

Each one of the digital phase control signals 340 can be a digital (i.e., logical) "1" or a digital "0," for example. Therefore, each of the storage cells 1504 can store a digital "1" or a digital "0," representing one of the digital phase control signals at any given time. An exemplary arrangement of digital phase control signals stored in ring 1504 is depicted in FIG. 15, wherein each of the storage cells 1502 included in ring segment 1506a is a logical "1," while the remainder of the digital phase control phase signals stored in the storage cells of the other ring segments 1506b–1506d are all logical "0s."

In the arrangement described above, digital phase control signals 340 are divided among a plurality of digital phase control signal sets 340a, 340b, 340c, and 340d. Each of the signal sets 340a–340d corresponds to a respective one of ring segments 1506a, 1506b, 1506c, and 1506d. In other words, the storage cells included in ring segment 1506a collectively provide digital phase control signal set 340a to phase interpolator 306, and so on.

Phase interpolation is described above in connection with FIGS. 8–14, and is now described briefly again for purposes of convenience. Phase interpolator 306 is capable of bringing about phase shifts having granularity that is finer than 45 degrees. Thus, phase interpolator 306 includes reference stages 802a', 802b', 802c', and 802d', as described above with reference to FIGS. 12, 13, and 14B.

Each of the reference stages 802a'–802d' receives a corresponding one of the set of digital phase control signals 340a–340d (for example, ring segment 1506a of ring 1504 provides digital phase control signal set 340a to reference stage 802a', and so on). These phase control signal sets are discrete signals capable of having more than two distinct values. Control signals sets 340 correspond to control signals 822' in FIG. 12.

Phase interpolator 306 also receives reference signal set 206 (820 in FIG. 12) from reference signal generator 216 (see FIG. 3). Reference signal set 206 includes reference signals 206a, 206b, 206c, and 206d. Reference signals 206a, 206b, 206c and 206d each have respective relative reference phases of 0°, 90°, 180°, and 270°, for example. Reference stages 802a'–802d' respectively derive component signals 824a–824d, each having a phase based on (for example, equal to) a corresponding one of the reference signals 206a–206d. For example, each of reference stages 802a'–802d' scales an amplitude of a corresponding one of reference signals 206a–206d in response to the corresponding one of signal sets 340a–340d, to produce a corresponding one of the component signals 824a–824d, in the manner described previously. Combining node 804 combines the component signals 802a'–802d' (representing scaled versions of respective reference signals 206a–206d) into output signal 826, which is sampling signal 208 in this context.

Therefore, phase interpolator 306 can be considered as combining the signals in reference signal set 206, having the different phases, into sampling signal 208 having the interpolated phase. Phase interpolator 306 varies the relative proportions of the reference signals so combined in response to the plurality of digital phase control signal 340 applied to the interpolator. More specifically, each of signal sets 340a–340d controls the relative proportion of the corresponding one of the reference signals 206a–206d combined into sampling signal 208 by interpolator 306. It is to be understood that "relative proportion" refers to a proportion value ranging between a minimum value (such as zero, whereby a reference signal does not contribute to the interpolated phase) and a maximum value.

When phase error processor 314 asserts rotate-left command 354a (that is, the phase-advance command), signal rotator ring 1504 concurrently shifts-left (that is, in the direction indicated by an arrow L) each one of the digital phase control signals 340 from a present storage element to an adjacent next storage element to the left of the present storage element, in response to the command. Therefore, ring 1504 rotates all of the digital phase control signals 340 in counter-clockwise direction L. In response, phase interpolator 306 correspondingly rotates the interpolated phase of sampling signal 208 in the counter-clockwise direction (in a direction of decreasing phase), thereby advancing the phase of sampling signal 208 relative to serial data signal 104.

When phase error processor 314 asserts rotate-right command 354b (that is, the phase-retard command), ring 1504 concurrently shifts-right (that is, in a clockwise direction indicated by an arrow R) each one of the digital phase control signals 340 from the present storage element to an adjacent next storage element to the right of the present storage element, in response to the command. Therefore, ring 1504 rotates all of the digital phase control signals 340 in clockwise direction R. In response, phase interpolator 306 correspondingly rotates the interpolated phase of sampling signal 208 in the clockwise direction (in a direction of increasing phase), thereby retarding the phase of sampling signal 208 relative to serial data signal 104.

Phase-hold command 354c overrides either of commands 354a and 354b. Therefore, when phase error processor 314 asserts phase-hold command 354c, ring 1504 holds all of the digital control signals in each present storage element, in response to the command. In other words, phase-hold command 354c prevents all of the digital phase control signals and correspondingly the interpolated phase of sampling signal 208 from rotating.

Phase-advance and -retard commands 354a and 354b can be implemented as pulsed commands. As such, a single, pulsed phase-advance command 354a (also referred to as a phase-advance pulse 354a) causes an incremental shift-left of one position, and correspondingly, an incremental phase advance, as described above. Similarly, a single, pulsed phase-retard command 354b causes an incremental shift-right of one position, and correspondingly, an incremental phase retardation, as is also described above. Thus, the interpolated phase of sampling signal 208 can be incrementally rotated clockwise or counter-clockwise through a range of ° by successively pulsing phase-retard and phase-advance commands 354b and 354a, respectively. The rate at which the interpolated phase of sampling signal 208 rotates corresponds to the repetition rate of pulsed phase-retard and phase-advance commands 354b and 354a.

FIGS. 15A and 15B, described below, are illustrations of alternative implementations of ring 1504. FIG. 15A is a block diagram of ring 1504 implemented as a circular shift register 1550. Shift register 1550 includes linearly arranged storage cells 1502 linked together to collectively form the ring configuration. Shift register 1550 includes left and right end cells (not labeled), and a signal line 1530 coupling the end cells together.

FIG. 15B is a block diagram of ring 1504 implemented as an array of storage cells 1560. Array 1560 includes storage cells 1502 arranged as a matrix of rows and columns, as depicted in FIG. 15B. Alternative implementations of ring 1504 are possible, as would be apparent to one of ordinary skill in the relevant art after reading the description provided herein.

VII. Phasor Diagrams

FIG. 16A is an illustration of an exemplary phase ring 1600 useful for describing phase rotation in the present invention. Phase ring 1600 includes phase segments 1606a, 1606b, 1606c, and 1606d corresponding to ring segments 1506a–1506d of ring 1504, and to interpolator stages 802a'–802d', depicted in FIG. 15. Each of the phase segments 1606a–1606d is divided into individual, contiguous phase cells 1608, each representative of a discrete phase value. The phase cells 1608 of each of phase. segments 1606a, 1606b, 1606c, and 1606d straddle respective phase values of 0°, 90°, 180°, and 270° (corresponding to the phases of reference signals 206a–206d) superimposed around phase ring 1600. The distribution of digital phase control signals (logical "1s" and "0s") depicted within phase cells 1608 corresponds to the exemplary distribution of the same control signals stored in ring 1504 of signal rotator 304, depicted in FIG. 15.

The distribution of digital phase control signals within phase cells 1608 illustrated in FIG. 16A indicates the relative proportion of the reference phases 0°, 90°, 180°, and 270° included in a resultant phasor 1620 representing the resultant phase of interpolated sampling signal 208. As depicted in FIG. 16A, a set of four contiguous logical "1s" 1610 resides in phase segment 1606a, while logical "0s" reside elsewhere. Therefore, reference or component phase 0° is turned full-on, while all of the other phases are turned-off. That is, the relative proportions of the reference phases are such that phase 0° is at a maximum value in sampling signal 208, while the other phases are at minimum values (of zero, for example). Therefore, the phase of sampling signal 208 output by interpolator 306 is 0°.

FIG. 16B is an illustration of phase ring 1600 after signal rotator 304 shifts phase control signals 340 from the positions depicted in FIG. 15 (and correspondingly, in FIG. 16A) two positions to the right (that is, clockwise) in response to two consecutive phase-retard pulses (i.e., commands) 354b. The consecutive phase-retard pulses 354b are represented as consecutive clockwise pointing arrows 354b in FIG. 16B. In accordance with the distribution of control signals 340 depicted in FIG. 16B, each of component phases 0° and 90° is at half of its maximum value (since the four logical "1s" 1610 are distributed such that two are within phase segment 1606a corresponding to phase 0° while the other two are within phase segment 1606b corresponding to phase 90°), while all other phases are turned off. Therefore, interpolator 314 produces sampling signal 208 with an interpolated phase 1620 of 45°(half-way between 0° and 90°).

FIG. 16C is an illustration of phase ring 1600 after signal rotator 304 shifts phase control signals 340 from the positions depicted in FIG. 15 (and correspondingly, in FIG. 16A) two positions to the left (that is, counter-clockwise) in response to two consecutive phase-advance pulses (i.e., commands) 354a. The consecutive phase-advance pulses 354a are represented as consecutive counter-clockwise pointing arrows 354a in FIG. 16C. In accordance with the distribution of control signals 340 depicted in FIG. 16C, each of component phases 0° and 270° is at half of its maximum value (since the four logical "1s" 1610 are distributed such that two are within phase segment 1606a while the other two are within phase segment 1606d), while all other phases are turned off. Therefore, interpolator 314 produces sampling signal 208 with an interpolated phase 1620 of 315° (half-way between 0° and °).

In the exemplary configurations depicted in FIGS. 15 and 16A–16C, phase interpolator 314 can produce sixteen different phases ranging from 0° to 270° with a phase resolution of approximately 22° (360°/16≈22°).

The density of phase control signal logical "1s" within the phase ring remains constant as the digital phase control signals 340 and correspondingly the interpolated phase is rotated. As a result, sampling signal 208 advantageously maintains a constant amplitude as the phase of the sampling signal varies over a range of °. For example, with reference to the exemplary circuits shown in FIGS. 13 and 14B, a constant density of logical "1s" maintains a constant number of currents 1328. This, in turn, provides constant amplitude output signals 826.

VIII. Frequency Synchronization

Interpolator 306 produces sampling signal 208 at a sampling frequency $\omega_s$ (where angular frequency $\omega_s=2\pi f_s$)

based on a frequency $\omega_r$ common to each reference signal in the set of reference signals 206 from reference signal generator 304 (that is, each of the reference signals has the reference frequency $\omega_r$). In the embodiment of interpolator 306 described above in connection with FIG. 15, frequency $\omega_s$ of interpolated sampling signal 208 is equal to reference frequency $\omega_r$ of each of the reference signals in reference signal set 206 (that is, $\omega_s=\omega_r$).

FIG. 17 is an illustration of a portion of timing recovery module 202 corresponding to when an undesirable angular frequency offset $\Delta\omega$ exists between serial data signal 104 and sampling signal 208. As depicted in FIG. 17, serial data signal 104 has an angular frequency $\omega_d$ established by a transmit oscillator (not shown) remote from and independent of reference signal generator 304 in the present invention. Because of differences between the remote transmit oscillator and reference oscillator 304, frequency $\omega_d$ and reference frequency $\omega_r$ may be offset from one another by frequency offset $\Delta\omega$ (for example, $\omega_d=\omega_r+\Delta\omega$), as depicted in FIG. 17. Therefore, serial data frequency $\omega_d$ and sampling frequency $\omega_s$ are correspondingly offset from one another by the same frequency offset, $\Delta\omega$).

As mentioned above, it is desirable for sampling frequency $\omega_s$ to match serial data frequency $\omega_d$ (for example, such that $\omega_d=n\cdot\omega_s$, where n is an integer greater than zero), whereby once serial data signal 104 and sampling signal 208 are phase aligned with each other, they remain phase aligned over time. Therefore, timing recovery module 202 of the present invention adjusts sampling frequency $\omega_s$ to compensate for the above mentioned frequency offset $\Delta\omega$, to thereby match the frequency of sampling signal 208 to that of serial data signal 104. The present invention adjusts sampling frequency $\omega_s$ in the manner described below.

Interpolated sampling signal 208 has a frequency $\omega_s$ (based on reference frequency $\omega_r$) and an interpolated phase $\phi_I$ (for example, see phasor 1620 in FIGS. 16A–16C). While the interpolated phase $\phi_I$ of sampling signal 208 is maintained at or dithered around a constant/average phase value, sampling signal frequency $\omega_s$ is correspondingly maintained at a base frequency equal to reference frequency $\omega_r$. However, since frequency is the derivative of phase (that is, $\omega=d\_/dt$, where $\_$ is phase), interpolator 306 can repetitively rotate interpolated phase $\phi_I$ through 360° at a predetermined rate to frequency shift sampling frequency $\omega_s$ away from the base frequency $\omega_r$. The magnitude of the frequency shift, $\Delta\omega_I$, is governed by the equation:

$$\Delta\omega_I = d\phi_I/dt,$$

where d $\phi_I$/dt represents the rate at which phase $\phi_I$ is rotated.

Accordingly, the sampling frequency $\omega_s$ of sampling signal 208 is governed by the equation:

$$\omega_s=\omega_r\pm d\ \phi_I/dt, \text{ or equivalently}$$

$$\omega_s=\omega_r\pm\Delta\omega_I.$$

Therefore, the present invention can rotate phase $\phi_I$ of sampling signal 208 at different rates to correspondingly produce different sampling frequencies $\omega_s$.

FIG. 18 is an illustration of a portion of timing recovery module 202, wherein phase rotation as described above is used to compensate for a frequency difference between serial data signal 104 and reference signals 206 (that is, phase rotation is used to match the frequency of sampling signal 208 to that of serial data signal 104). Serial data signal 104 has a frequency $\omega_d=\omega_r+\Delta\phi$. Timing recovery module 202 causes interpolator 306 to rotate interpolated phase $\phi_I$ counter-clockwise in the direction indicated by an arrow 1806 at a rate corresponding to $\Delta\omega$, such that d $\phi_I/dt=\Delta\omega_I=\Delta\omega$. Therefore, interpolator 306 produces sampling signal 208 at frequency $\omega_s=\omega_r+d\ \phi_I/dt$, or equivalently $\omega_s=\omega_r+\Delta\omega$, such that sampling signal 208 and serial data signal 104 have matching frequencies.

FIG. 18A is a block diagram of a timing recover system 1810 for frequency synchronizing sampling/timing signal 208 with serial data signal 104, according to an embodiment of the present invention. FIG. 18A is similar to FIG. 3. Timing recover system 1810 includes phase interpolator 306 coupled to a controller 1820 for controlling the phase interpolator. Controller 1820 includes data and phase paths 308 and 310, phase detector 312, phase error processor 314, and phase control signal rotator 304. Controller 1820 applies control signals 340 to phase interpolator 306 to control the interpolated phase of sampling signal 208 (and 344). Controller 1820 includes phase error processor 314 to derive an estimate of a frequency effort between sampling signal 208 and serial data signal 104, as will be described in further detail below. Controller 1820 manipulates control signals 340 in response to the frequency offset, to cause phase interpolator 306 to rotate the interpolated phase of sampling signal 208 at a rate corresponding the frequency offset, so as to reduce the frequency offset between serial data signal 104 and sampling signal 208.

FIG. 19 is a block diagram of phase error processor 314 according to an embodiment of the present invention. Phase error processor 314 includes a short-term phase error processor 1904, a frequency offset estimator 1906 (also referred to as a long-term phase processor 1906), and a rotate command generator 1908. Short-term processor 1904 and frequency offset estimator 1906 receive phase error 350 from phase detector 312.

Short-term processor 1904 integrates phase errors over a relatively short time period, and thus responds relatively rapidly to changes in phase between sampling signal 208 and serial data signal 104. Processor 1904 derives a phase adjust signal 1910 in response to the aforementioned short-term phase changes. Processor 1904 provides the phase adjust signal 1910 to rotate command generator 1908.

On the other hand, frequency estimator 1906 integrates phase errors over a relatively long period of time (for example, in comparison to short-term processor 1904), and thus, responds relatively slowly to changes in phase between sampling signal 208 and serial data signal 104. Frequency estimator 1906 examines changes in phase error 350 over time to derive an estimate of a frequency offset, for example, $\Delta\omega$, between serial data signal 104 and sampling signal 208 (which may result from a corresponding frequency offset between serial data signal 104 and reference signals 206). Frequency estimator 1906 provides a signal 1912 indicative of frequency offset estimate $\Delta\omega$ to rotate command generator 1908.

In alternative arrangements, the functions performed by frequency estimator 1906 and short-term processor 1904 can be combined into a single logic block. Alternatively, frequency estimator 1906 can integrate signal 1910 output by short-term processor 1904, to produce signal 1912. Also, short-term processor 1904 and frequency estimator 1906 can be implemented as accumulators, such that signals 1910 and 1912 include accumulator over- and under-flow conditions.

Other embodiments of phase error processor 314 are possible as would be apparent to one of ordinary skill in the relevant art(s), after reading the description provided herein.

Rotate command generator 1908 derives rotate commands 354 (described above) based on phase adjust signal 1910 and frequency offset estimate signal 1912. Rotate command generator 1908 can be part of one or both of blocks 1904 and 1906. In one embodiment, rotate command generator 1908 generates pulsed phase-advance and phase-retard commands 354*a* and 354*b* (described above) in response to signals 1910 and 1912. In such an embodiment, rotate command generator 1908 generates pulsed commands 354 at a repetition rate based on the frequency offset estimate $\Delta\omega$ provided in signal 1912. This causes digital control signals 340 and correspondingly the phase of sampling signal 208 to rotate at a rate based on (for example, equal to) the frequency offset $\Delta\omega$. On the other hand, phase adjust signal 1910 tends to perturbate the above mentioned repetition rate and correspondingly the phase rotation rate of sampling signal 208, in response to short-term phase errors. In the above described manner, timing recovery module 202 can adjust sampling signal frequency $\omega_s$ to match serial data frequency $\omega_d$.

Other embodiments of rotate command generator 1908 are possible as would be apparent to one of ordinary skill in the relevant art(s), after reading the description provided herein.

Timing recovery module 202 implements a phase and frequency locked (that is, tracking) loop, including phase controller 302, phase control signal rotator 304, and phase interpolator 306, all described previously. The phase and frequency locked loop causes the sampling signal phase and frequency to track the serial data signal phase and frequency, whereby sampling signal 208 and serial data signal 104 remain phase-aligned and frequency synchronized over time.

Short-term phase error processor (for example, short-term filter) 1904 in phase error processor 314 establishes a phase tracking bandwidth of the phase and frequency locked loop. Long-term phase processor (for example, filter) 1906 establishes a frequency tracking bandwidth of the phase and frequency locked loop. Short-term filter 1904 responds more quickly to phase changes in serial data signal 104 than does long-term filter 1906. As a result, short-term absences of serial data signal 104 (caused by signal drop-outs and the like, for example) can cause the phase and frequency locked loop to loose track of the serial data signal phase, since short-term filter 1904 is responsive to such short-term signal losses. Therefore, after such signal losses, the phase and frequency locked loop must re-acquire the serial data signal phase so as to re-establish the phase locked condition.

On the other hand, such short-term signal absences have less of an adverse affect on long-term filter 1906. Therefore, once the phase and frequency locked loop begins rotating the sampling signal phase at an initial rate to frequency synchronize the sampling and serial data signals 208 and 104, the phase and frequency locked loop tends to continue rotating the sampling signal phase at the same initial rate during the short-term signal losses. Therefore, when serial data signal 104 returns after such a signal loss, sampling signal 208 tends to still be frequency synchronized with serial data signal 104 (assuming the serial data signal frequency does not change substantially during the signal loss). Thus, the phase and frequency locked loop need only re-establish the phase locked condition mentioned above, since the loop is still frequency synchronized with serial data signal 104. This advantageously reduces the time required to re-acquire the phase locked condition.

FIG. 20 is a flow chart of an example method 2000 of tracking the frequency of serial data signal 104 using phase rotation according to the present invention.

Method 2000 expands on steps 720 and 730 of method 700 described above in connection with FIG. 7. Step 720 includes steps 2002, 2004, and 2006. At step 2002, short-term phase error processor 2002 derives short-term phase adjust signal 1910 by, for example, short-term filtering phase error signal 350.

At next step 2004, frequency estimator 1906 estimates the frequency offset $\Delta\omega$ between sampling signal 208 and serial data signal 104. Frequency estimator 1906 derives the frequency offset estimate by, for example, long-term filtering of phase error 350.

At a next step 2006, rotate command generator 1908 generates phase rotate commands (for example, commands 354*a* and/or 354*b*) to compensate for both the short-term phase offset and the frequency offset $\Delta\omega$.

Next step 730 includes a step 2010. At step 2010, phase control signal rotator 304 rotates digital phase control signals 340 and correspondingly interpolated phase $\phi_I$ of sampling signal 208 in response to phase rotate commands (such as commands 354*a* and 354*b*), such that sampling signal 208 and serial data signal 104 become phase aligned and frequency synchronized with one another.

The term "frequency synchronized" means sampling frequency $\omega_s$ and serial data signal frequency $\omega_d$ are matched to one another, such that data sample times $t_d$ established by the frequency of sampling signal 208, and coinciding with optimum symbol sample times $t_O$, do not "drift" relative to the symbol sample times $t_O$, over time. For this to be the case in the present invention, sampling frequency $\omega_s$ and serial data signal frequency $\omega_d$ need to be related to one another, but not necessarily equal to one another, such that the frequencies are synchronized. For example, frequencies $\omega_s$ and $\omega_d$ are considered synchronized to one another when $\omega_d = n \cdot \omega_s$, where n is an integer greater than one.

To decrease frequency $\omega_s$ relative to reference frequency $\omega_r$ (and serial data frequency $\omega_d$) in the present invention, sampling signal phase $\phi_I$ is rotated in the clockwise direction (that is, in the direction of increasing phase) at the necessary rate. On the other hand, to increase frequency $\omega_s$, phase $\phi_I$ is rotated in the counter-clockwise direction (that is, in the direction of decreasing phase) at the necessary rate (for example, at a rate equal to the frequency offset $\Delta\omega$). For example, with reference again to example phase ring 1600 of FIG. 16A, the present invention rotates phasor or phase value 1620 in the clockwise direction around phase ring 1600 to decrease frequency $\omega_s$ by an amount equal to the rate of rotation. On the other hand, the present invention rotates phasor or phase value 1620 in the counter-clockwise direction around phase ring 1600 to increase frequency $\omega_s$ by an amount equal to the rate of rotation.

FIG. 20A is a flow chart of an example method 2015 expanding on rotating step 2010 of method 2000. A step 2020 is initiated when the frequency $\omega_s$ of sampling signal 208 is greater than the frequency $\omega_d$ of serial data signal 104 (i.e., when $\omega_s > \omega_d$), whereby step 2020 decreases the frequency of the sampling signal, and correspondingly, reduces frequency offset $\Delta\omega$.

On the other hand, a step 2025 is initiated when the frequency of sampling signal 208 is less than the frequency of serial data signal 104 (i.e., when $\omega_s < \omega_d$), whereby step 2025 increases the frequency of the sampling signal, and correspondingly, reduces frequency offset $\Delta\omega$.

Example timing recovery systems 202 and 1810 include control signal rotator 304 for rotating phase control signals 340, and correspondingly, the interpolated phase of sampling signals 208 and 344. However, the present invention is not limited to such embodiments. For example, FIG. 20B is a block diagram of an example timing recovery system 1845 for synchronizing sampling and serial data signal frequencies, without using a control signal rotator. Instead, timing recovery system 1845 includes a phase interpolator 306' and a controller 1850. Phase interpolator 306' can be any known phase interpolator capable of adjusting the interpolated phase of sampling signal 208 in response to an interpolator control signal 340' (which may be a signal set 340') compatible with the phase interpolator. For example, in a conventional configuration of phase interpolator 306' including multiplexer selectors for selecting between different signal phase to produce interpolated phases of sampling signal 208, control signal set 340' may include multiplexer select signals, and so on.

Timing recovery system 1845 also includes phase detector 312 coupled to a phase error processor 314'. Phase error processor 314' includes a frequency estimator to derive a frequency estimate (that is, a frequency measurement) of the frequency offset between sampling signal 208 and serial data signal 206, as described above, for example. In an alternative arrangement, phase detector 312 and phase error processor 314' are combined into a single logic block for detecting the frequency offset. Phase error processor 314' provides control signal 340', indicative of the frequency offset, to phase interpolator 306'. In response to control signal(s) 340', phase interpolator 306' rotates the interpolated phase of sampling signal 208 to reduce the frequency offset between the sampling signal and serial data signal 104.

FIG. 20C is a flow chart of a high level example method 2000' of frequency synchronizing and phase-aligning sampling signal 208 to serial data signal 104. Method 2000' is similar to method 2000, and can be implemented by either of timing control systems 202 and 1845. Method 2000' includes a step 720' similar to step 720 of method 2000. However, step 720' includes a generalized sub-step 2006'. In step 2006', controller 1820/1850 (of timing system 202/1845) manipulates phase control signals 340/340', applied to phase interpolator 306/306', in response to the detected phase and frequency offsets, so as to control the interpolated phase of sampling signal 208. For example, controller 1820 rotates phase control signals 340 using rotator 304 (rotating control signals 340 was previously described as part of step 730/2010 in FIG. 20, but is moved into step 720' of method 2000').

On the other hand, controller 1850 can manipulate phase control signals 340' in other ways, as would be apparent to one of ordinary skill in the art after reading the description provided herein. For example, controller 1850 can modify the values (for example, logic "1" or "0") of various ones of the phase control signals in accordance with the phase and frequency offset, instead of rotating the phase control signals, so as to correspondingly rotate the interpolated phase of sampling signal 208. Phase error processor 314' can include formatting/generating logic to generate and/or manipulate phase control signals 340' such that the phase control signals are compatible with phase interpolator 306'.

A next step 730' is similar to step 730 of method 2000. In step 730', interpolator 306/306' rotates the interpolated phase of sampling signal 208 in response to phase control signals 340/340'. Step 730' is similar to step 730 to the extent phase interpolator 306 rotates the interpolated phase of sampling signal 208 in response to phase control signals 340. However, step 730' does not include rotating phase control signals 340, since this step is subsumed by previous step 720' in method 2000', as described above.

FIG. 20D is a flow chart of a high level example method 2060 of frequency synchronizing sampling signal 208 to serial data signal 104.

An initial step 2064 includes deriving sampling signal 208 having an interpolated phase (using phase interpolator 306/306', for example).

A next step 2070 includes estimating a frequency offset between sampling signal 208 and serial data signal 104 (using phase error processor 314/314', for example).

A next step 2075 includes rotating the interpolated phase of sampling signal 208 at a rate corresponding to the frequency offset, so as to reduce the frequency offset.

IX. High-Speed Serial Transceiver

FIG. 21 is an illustration of an example multiple channel communication device 2100 constructed on an integrated circuit (IC) chip 2102, according to an embodiment of the present invention. Communication device 2100 is a multiple channel (that is, multi-channel) transceiver, including multiple receivers and multiple transmitters, as described below. Each of the serial data signals is associated with a different channel. Communication device 2100 receives multiple analog serial data signals 2104a, 2104b, 2104c, and 2104d (collectively referred to as multiple serial data signals 2104). Communication device 2100 includes multiple receive-lanes 2106a, 2106b, 2106c, and 2106d (collectively referred to as multiple receive-lanes 2106, and each being associated with a receiver/receive-channel of communication device 2100). Each of receive-lanes 2106 receives a corresponding one of multiple serial data signals 2104, as depicted in FIG. 21. Each of receive-lanes 2106 processes the corresponding one of serial data signals 2104 to produce a corresponding one of multiple digital data streams 2108a, 2108b, 2108c, and 2108d (collectively referred to as digital data streams 2108). Receive-lanes 2106 provide data streams 2108 to a digital data sample processor 2112. Communication device 2100 is referred to as a multiple receiver or multi-channel communication device because of the multiple receive-lanes 2106 and associated circuits, described below.

Communication device 2100 includes a master timing generator 2114 for generating a master timing signal 2116. Master timing generator 2114 can include a reference oscillator and a PLL, such as reference oscillator 330 and PLL 332, described above in connection with FIG. 3. Master timing generator 2114 provides master timing signal 2116 to each of the multiple receive-lanes 2106. In one arrangement, to minimize signal crosstalk and interference in the present invention, master timing signal 2116 includes a pair of differential (that is, complementary) clock signals/waves routed to each of receive-lanes 2106 over a pair of clock lines.

Communication device 2100 also includes multiple transmit-lanes 2130a, 2130b, 2130c, and 2130d (collectively referred to as multiple transmit-lanes 2130). Data sample processor 2112 provides multiple transmit data streams 2134a, 2134b, 2134c, and 2134d (collectively referred to as multiple transmit digital data streams 2134) to corresponding ones of transmit-lanes 2130, as depicted in FIG. 21. Master timing generator 2114 provides master timing signal 2116 to each of the multiple transmit-lanes 2130. Transmit-lanes 2130 each transmit a corresponding one of multiple analog serial data signals 2140a, 2140b, 2140c, and 2140d (collectively referred to as multiple transmit analog serial data signals 2140). In alternative embodiments, communication device 2100 may include more or fewer receive-lanes 2106 and transmit-lanes 2130. Communication device 2100 can include more or less than four receiver and/or transmit lanes in other embodiments.

FIG. 22 is an illustration of receive-lane 2106a, according to a multiple data path per receive-lane embodiment of the present invention. In an embodiment, exemplary receive-lane 2106a is substantially identical to the other receive-lanes 2106b–d, therefore the following description of receive-lane 2106a shall suffice for the others. Receive-lane 2106a includes a data module 2204, a phase module 2206, and a sampling signal generator 2208. Also depicted in FIG. 22 is digital data sample processor 2112. As depicted, processor 2112 includes a data demultiplexer module 2210a and an interpolator control module 2212a, both corresponding to receive-lane 2106a. Processor 2112 provides interpolator phase control signals 2214a, including a first phase control signal set $2214a_1$ and a second phase control signal set $2214a_2$, to sampling signal generator 2208.

Sampling signal generator 2208 derives a plurality of timing signals required to operate receive-lane 2106a from master timing signal 2116, as described below. An advantage of deriving such timing signals locally within receive-lane 2106a, is to reduce signal/clock cross-talk and interference across IC chip 2102, and to reduce the number of signal traces or tracks distributed across the IC chip.

Sampling signal generator 2208 includes a first signal set generator 2220. First signal set generator 2220 derives a set of reference signals 2222 having different predetermined phases from master timing signal 2116. Signal set 2222 can be the same as or similar to reference signal set 206 described above in connection with FIG. 15, for example. Signal set generator 2220 provides signal set 2222 to a phase interpolator module 2224.

Phase interpolator module 2224 receives signal set 2222 and phase control signals 2214a from processor 2220. In the embodiment depicted in FIG. 22, phase interpolator module 2224 includes first and second phase interpolators $2226_1$ and $2226_2$. Each of phase interpolators $2226_1$ and $2226_2$ receives signal set 2222, together with a respective one of phase control signal sets $2214a_1$ and $2214a_2$ included in phase control signals 2214a. In response to these signal inputs, phase interpolators $2226_1$ and $2226_2$ respectively derive interpolated timing signals $2230_1$ and $2230_2$ (collectively referred to as interpolated timing signals 2230). Phase interpolator module 2224 provides interpolated timing signals 2230 to a second signal set generator 2234.

Second signal set generator 2234 derives multiple time-staggered data and phase sampling signals 2238 from interpolated timing signals 2230. Therefore, time-staggered data and phase sampling signals 2238 each has an interpolated phase corresponding to the interpolated phase of timing signals 2230. Time-staggered data and phase sampling signals 2238 include time-staggered data sampling signals d0, d1, d2, and d3, and time-staggered phase sampling signals x0, x1, x2, and x3. Signal set generator 2234 generates the multiple time-staggered data and sampling signals 2238 such that data sampling signal d0 and phase sampling signal x0 are paired with one another, data sampling signal d1 and phase sampling signal x1 are paired with one another, and so on.

In the example embodiment depicted in FIG. 22, master timing signal 2116 has a frequency equal to the symbol frequency B (that is, baud rate B) of serial data signal 2104a. First signal set generator 2220 includes four-phase clock generator divide-by-two divider circuits, such that generator 2220 generates four signals in signal set 2222, each at a frequency B/2. Thus, phase interpolators $2226_1$ and $2226_2$ produce respective interpolated timing signals $2230_1$ and $2230_2$ each at a corresponding frequency of B/2. In an embodiment, timing signals $2230_1$ and $2230_2$ have respective phases offset from each other by 90°. Second signal set generator 2234 includes eight-phase clock generator divide-by-two divider circuits, to produce each of the eight data and sampling signals 2238 at a frequency B/4.

Data module 2204 includes multiple parallel data paths $2242_0$, $2242_1$, $2242_2$, and $2242_3$ (collectively referred to as data paths 2242). Each of the data paths $2242_0$, $2242_1$, $2242_2$, and $2242_3$ receives serial data signal 2104a. Each of data paths $2242_0$, $2242_1$, $2242_2$, and $2242_3$ samples serial data signal 2104a according to a corresponding one of time-staggered data sampling signals d0, d1, d2, and d3, thereby producing corresponding multiple time-staggered data sample streams $2244_0$, $2244_1$, $2244_2$, and $2244_3$ (collectively referred to as multiple time-staggered data sample streams 2244), as depicted in FIG. 22. Therefore, multiple data paths 2242 provide multiple data streams 2244 to processor 2112. The use of multiple parallel data sampling paths within a receive-lane in the present invention, as depicted in FIG. 22, for example, facilitates processing of high frequency serial data signals, such as a serial data signal having a multi-gigabit symbol rate, because each of the parallel data paths can sample the serial data signal at a rate below the multi-gigabit symbol rate, as will be further described below.

Phase module 2206 includes multiple phase paths $2250_0$, $2250_1$, $2250_2$, and $2250_3$ (collectively referred to as multiple phase paths 2250). Each of the phase paths in multiple phase paths 2250 samples serial data signal 2104a according to a corresponding one of time-staggered phase sampling signals x0, x1, x2, and x3, as depicted in FIG. 22, thereby producing multiple time-staggered phase sample streams $2252_0$, $2252_1$, $2252_2$, and $2252_3$ (collectively referred to as phase sample streams 2252). Data streams 2244 and phase streams 2252 collectively form data stream 2108a depicted in FIG. 21. In alternative embodiments, receive-lane 2106a can include more or fewer data and phase paths 2242 and 2250. Also, different ones of receive-lanes 2106 can have different numbers of data paths and different numbers of phase paths. Also, sampling signal generator 2208 in each receive-lane can derive more or less time-staggered data and phase sampling signals according to the number of parallel data and phase paths in the receive-lane. Sampling signal generator 2208 can include less or more phase interpolators, as the need arises to generate more or less timing and sampling signals in the receive-lane.

In an embodiment, each of data paths 2242 and phase paths 2250 are substantially identical, and therefore, the following description of exemplary data path $2242_0$ shall suffice for the other data and phase paths in such an embodiment. Data path $2242_0$ includes a sampler 2260, an equalizer 2262 following sampler 2260, and a quantizer 2264 following the equalizer. Sampler 2260 samples analog serial data signal 2104a at sample times established by data sampling signal d0, to produce a sampled analog data signal 2270 representative of serial data signal 2104a. Equalizer 2262 equalizes sampled analog data signal 2270 to produce an equalized, sampled analog data signal 2272. Thus, equalizer 2262 reduces inter-symbol interference present in serial data signal 2104a. Quantizer 2264 quantizes analog samples of sampled analog signal 2272 into corresponding, quantized digital data samples. Quantizer 2264 provides signal $2242_0$, including the quantized digital data samples, to processor 2112. Exemplary further details of data and phase paths including equalizers are provided in U.S. Non-Provisional application Ser. No. 09/844,283, filed Apr. 30, 2001, entitled "Methods and Systems for Adaptive Receiver Equalization," incorporated herein by reference in its entirety.

Data demultiplexer module 2210a receives multiple time-staggered (that is, time-skewed) data streams 2244. Data demultiplexer module 2210a time-deskews and then demultiplexes/deserializes multiple time-staggered data streams 2244, to produce a demultiplexed data sample stream 2280a representative of serial data signal 2104a. Demultiplexed data sample stream 2280a includes quantized digital data samples arranged in a parallel word format. Therefore, data demultiplexer module 2210a can be considered a deserializer or serial-tO-parallel converter module.

Interpolator control module 2212a receives multiple data streams 2244 from data module 2204 and multiple phase streams 2252 from phase module 2206. Interpolator control module 2212a detects phase and frequency offsets between multiple time-staggered data sampling signals d0–d3 and serial data signal 2104a. Interpolator control module 2212a derives interpolator phase control signals 2214a in response to the detected phase and frequency offsets, as described above. In response to phase control signals 2214, phase interpolator module 2224 rotates the interpolated phase of timing signals 2230, and correspondingly of time-staggered data and phase sampling signals 2238, to compensate for the detected phase offset and at a rate corresponding to the detected frequency offset, as described above. In this manner, interpolator control module 2212a causes time-staggered data sampling signals d0–d3 to be phase-aligned and frequency-synchronized with serial data signal 2104a.

FIG. 23 is an illustration of various example signal waveforms (b)–(j) from receive-lane 2106a depicted in FIG. 22.

Waveform (a) represents a clock wave 2302 having a frequency B=1/T corresponding to a symbol rate of serial data signal 2104a.

Waveform (b) represents serial data signal 2104a, including consecutive NRZ symbols 2304, each having a symbol period T.

Waveforms (c)–(j) respectively represent time-staggered data and phase sampling signals d0, x0, d1, x1, d2, x2, d3, and x3. As depicted in FIG. 23, each sampling signal (for example, d0) is offset in time (that is, time-staggered or time-skewed) from the next sampling signal (for example, x0) by a half symbol period (that is, by a time offset=T/2). Therefore, consecutive data sampling signals (for example, d0, d1, and d1, d2) are time-staggered by a symbol period T. Each of the sampling signals d0–d3, and x0–x3 has a sampling signal period=4·T (that is, a sampling signal frequency of one-quarter the symbol rate of serial data signal 2104a). As a result, in each sampling signal period 4·T, data sampling signals d0–d3 cause data paths $2242_{0-3}$ to collectively sample four consecutive symbols of serial data signal 2104a, such that each data path samples a different one of the four consecutive symbols. In an example implementation of the present invention, serial data signal 2104a has a symbol rate=3.125 GHz, and each of sampling signals d0–x3 has a sampling signal rate=781.25 MHz.

FIG. 24 is a phase circle 2400 representing the evenly spaced phases of sampling signals d0–x3 depicted in FIG. 23. A phase rotation of 360° corresponds to a sampling signal period of 4·T.

FIG. 25 is a block diagram of data demultiplexer module 2210a, according to an embodiment of the present invention. Data demultiplexer module 2210a includes a data deskewer 2502 followed by a data demultiplexer/deserialize 2504. Data deskewer 2502 receives multiple time-staggered data sample streams 2244 and multiple data sampling signals d0–d3. Data deskewer 2502 time-deskews (that is, removes the time offset between) multiple data sample streams 2244, and presents corresponding deskewed data sample streams $2510_{0-3}$ to demultiplexer 2504. For example, in each data sampling period, data deskewer 2502 receives four time-staggered symbol samples from data sample streams 2244, collectively. Data deskewer 2502 time-deskews the four data samples, and presents four corresponding deskewed data samples to demultiplexer 2504 (in multiple deskewed data streams $2510_{0-3}$).

Data demultiplexer 2504 deserializes/demultiplexes the deskewed data sample streams $2510_{0-3}$ to produce deserialized/demultiplexed data sample stream 2280a. Demultiplexer 2504 includes a set, such as five, four-bit registers $2510_{0-4}$, for example. During five consecutive data sampling periods, data demultiplexer module 2210a consecutively transfers five sets of four deskewed data samples from deskewer 2502 (that is, from data sample streams $2510_{0-3}$) into corresponding consecutive ones of the five four-bit registers $2512_{0-4}$. Thus, twenty serialized data samples are transferred to registers $2512_{0-4}$ in demultiplexer 2504. Demultiplexer 2504 constructs a twenty-bit wide parallel word including the twenty serialized data samples mentioned above. Demultiplexer 2504 outputs the twenty-bit parallel word representative of the twenty serialized data samples in demultiplexed data sample stream 2280a. Demultiplexer 2504 can transfer the twenty-bits as two ten-bit parallel words, for example.

FIG. 26 is a block diagram of interpolator control module 2212a, according to embodiment of the present invention. Interpolator control module 2212a receives the multiple data streams 2244 and the multiple phase streams 2252. Interpolator control module 2212a includes phase detector 2212, phase error processor 2214, and a phase control signal rotator 2604. Phase control signal rotator 2604 includes a first phase control signal rotator $2204_1$ and a second phase control signal rotator $2204_2$ to correspondingly produce first and second phase control signal sets $2214a_1$ and $2214a_2$ of phase controls signals 2214a. Other embodiments of interpolator control module 2212a are possible, as would be apparent to one of ordinary skill in the relevant art(s). For example, and as described above in connection with FIG. 20B, the interpolator control module is not limited to an embodiment including a control signal rotator.

Multiple data paths 2242, multiple phase paths 2250, phase detector 2212, phase error processor 2214, and the signal rotators of phase control signal rotator 2604, operate together in a manner consistent with the description of the same or similar elements described previously in connection with timing recovery module 202, for example. Therefore, receive-lane 2106a includes a timing recovery system/module (such as timing recovery module 202) associated with the receive-lane, to phase and frequency track serial data signal 2104a. In other words, the timing recovery module associated with receive-lane 2106a adjusts the interpolated phases of time-staggered data sampling signals d0–d3 such that each of the sampling signals d0–d3 causes the corresponding one of data paths 2242 to optimally sample consecutive symbols in serial data signal 2104a. In accordance with the operation of the timing recovery module associated with receive-lane 2106a, sampling signal d0 causes data path $2242_0$ to sample a mid-point of a first symbol of serial data signal 2104a, sampling signal d1 causes data path $2242_1$ to sample a mid-point of a next symbol of serial data signal 2104a, and so on.

In addition, the timing recovery module associated with receive-lane 2106a frequency synchronizes data sampling signals d0–d3 with serial data signal 2104a. In other words, the timing recovery module associated with receive-lane 2106 causes the interpolated phases of data sampling signals d0–d3 to rotate at a rate that synchronizes a common frequency, $f_s$, of sampling signals d0–d3 to the symbol baud rate B of serial data signal 2104a. In the example embodiment depicted in FIG. 21, the timing recovery module associated with receive-lane 2106a rotates the interpolated phases of data sampling signals d0–d3 at a rate such that the common sampling frequency $f_s$=B/4.

FIG. 27 is a block diagram of processor 2112, according to an embodiment of the present invention. Processor 2112 includes multiple data demultiplexer modules 2210a, 2210b, 2210c, and 2210d (collectively referred to as data demultiplexer modules 2210), each corresponding to the data sample streams (that is, data streams 2244) of one of data streams 2108a–12108d. Processor 2112 also includes multiple interpolator control modules 2212a, 2212b, 2212c, and 2212d (collectively referred to as interpolator control modules 2210), each corresponding to one of data streams 2108a, 2108b, 2108c, and 2108d. In other words, processor 2112 includes a data demultiplexer module and an interpolator control module for each receive channel of communication device 2100.

Therefore, each of the receive-lane is associated with a separate timing recovery module (such as timing recovery module 202), wherein each timing recovery module operates independently of each other timing module. This means the timing recovery module associated with receive-lane 2106a tracks a phase and a frequency of serial data signal 2104a, while the timing recovery module associated with receive-lane 2106b can track a different phase and a different frequency of serial data signal 2104b, and so on. For example, the interpolated phases of the sampling signals (d0–d3) associated with receive-lane 2106a can be rotated independently of and at a rate different from the interpolated phases of the sampling signals associated with the other receive-lanes 2106b–c.

FIG. 28 is a block diagram of a communication device 2800, corresponding to communication device 2100, according to another embodiment of the present invention. Unlike the communication device embodiment depicted in FIG. 22, communication device 2800 does not include multiple parallel sampling paths within a receive-lane of the communication device, as will be described below.

Communication device 2800 is constructed on an IC chip 2802. Communication device 2800 includes multiple receive-lanes 2804a–n. Receive-lane 2804a includes a sampling signal generator 2806a, a data path 2808a, and a phase path 2810a. An interpolator control module 2812a is included as part of a digital data processor, not shown. Sampling signal generator 2806a includes signal set generator 2220 (as described in connection with FIG. 22, for example), and a phase interpolator 2814. Interpolator control module 2812a includes phase detector 2212, phase error processor 2214, and phase control signal rotator 2204, as described previously. Phase interpolator 2814 provides interpolated sampling signals $2815_1$ and $2815_2$ to respective data and phase paths 2808a and 2810a. Data path 2808a and phase path 2810a can include the same elements as are included in data path $2242_0$, described in connection with FIG. 22. If this is the case, then data path 2808a and phase path 2810a each provide serial, quantized, digital data samples ($2816_1$ and $2816_2$, respectively) to the digital data processor. Alternatively, a data demultiplexer/deserializer can be added to each of data path 2802a and phase path 2810a, after quantizer 2264 in each path. Such a data demultiplexer after quantizer 2264 supplies demultiplexed data samples (in parallel word format) to the digital data processor.

FIG. 29 is a flow chart of an example method of processing a serial data signal in multiple parallel data paths, using receive-lane 2106a depicted in FIG. 22, for example. An initial step 2902 includes generating a master timing signal (for example, using master timing generator 2114).

A next step 2904, includes generating multiple time-staggered sampling signals (such as signals d0–d3) based on the master timing signal.

A next step 2906 includes sampling a received, analog serial data signal (such as serial data signal 2104a) in accordance with each of the multiple time-staggered sampling signals (for example, d0–d3), thereby producing multiple time-staggered data sample streams (such as data sample streams 2244).

A next step 2908 includes time-deskewing the multiple time-staggered data streams (for example, using deskewer 2502).

A next step 2910 includes demultiplexing multiple time-deskewed data streams produced in step 2908 (using, for example, demultiplexer 2504 depicted in FIG. 25).

FIG. 30 is a flow chart of an example method 3000 of frequency synchronizing multiple data sampling signals (channels) to corresponding ones of multiple serial data signals using communication device 2100. Method 3000 can be implemented using the communication device embodiments depicted in both FIGS. 22 and 28.

An initial step 3002 includes generating a master timing signal (using master timing generator 2114, for example).

A next step 3004 includes deriving multiple sampling signals (such as a sampling signal d0 in receive-lane 2106a, sampling signal d0 in received-lane 2106b, and sampling signal d0 in received-lane 2106c) based on the master timing signal (for example, master timing signal 2116). Each of the multiple sampling signals is associated with one of multiple serial data signals (for example, sampling signal d0 in receive-lane 2106a is associated with serial data signal 2104a, sampling signal d0 in receive-lane 2106b is associated with serial data signal 2104b, and so on). Each of the sampling signals has an interpolated phase.

A next step 3006 includes sampling and quantizing each of the multiple serial data signals (2104a, 2104b, and so on) according to the associated one of the sampling signals (for example, sampling signal d0 in receive-lane 2104a, and sampling signal d0 in receive-lane 2104b, and so on).

A next step 3008 includes rotating the interpolated phase of each sampling signal at a rate corresponding to a frequency offset between the sampling signal and the serial data signal associated with the sampling signal (such as between sampling signal d0 in receive-lane 2106a and serial data signal 2104a), whereby each sampling signal is frequency synchronized with each associated serial data signal.

X. Example Transceiver Use

In an embodiment, the present invention is implemented as a signal router. A signal router can be used to route one or more information signals between a plurality of components.

FIG. 31 is an illustration of an example use of a transceiver of the present invention. The transceiver of the present invention is used in an example signal router 3100, including a front panel 3102, a back plane 3104 and one or more interfacing circuit boards 3106. Front panel 3102 typically includes a plurality of connectors or "jacks," to which external devices, such as computers, servers, terminals, communications devices, other routers, and the like, can be coupled. The router 3100 receives and transmits (i.e., routes) signals between the external devices.

Each interfacing circuit board 3106 includes a finite number of connections to the front panel 3102 for receiving and/or transmitting signals from/tO external devices. Additional interfacing circuit boards 3106 can be utilized to accommodate additional external devices. The backplane 3104 permits the router 3100 to route signals between multiple interfacing circuit boards 3106. In other words, the backplane 3104 permits the router 3100 to route signals between external devices that are coupled to different interfacing circuit boards 3106.

Interfacing circuit boards 3106 can include a variety of digital and/or analog components. When multiple interfacing circuit boards 3106 are utilized, two or more of them can be similar and/or dissimilar. The interfacing circuit boards 3106 illustrated in FIG. 31 are provided for illustrative purposes only. Based on the description herein, one skilled in the relevant art(s) will understand that additional and/or alternative components/features can be provided with the interfacing circuit boards 3106.

Example interfacing circuit board 3106 is now described. Interfacing circuit board 3106A optionally includes one or more interface components 3108 that receive and/or buffer one or more signals received from external devices through the front panel 3102. In the illustrated example, the interface component 3108 receives an optical signal 3109 from the front panel 3102. Accordingly, in this embodiment, interfacing component 3108 includes one or more optical converters that convert the optical signal 3109 to an electrical analog data signal, illustrated here as an analog serial data signal 3112. Additionally, or alternatively, interfacing component 3108 sends and/or receives one or more other analog data signals 3114A–n to/from other external devices through the front panel 3102. Additionally, or alternatively, interfacing component 3108 sends and/or receives one or more of the signals 3114A–n to/from somewhere other than the front panel 3102.

The serial analog data signal 3112 is provided from the interfacing component 3108 to a transceiver 3110, which can be implemented as one or more of transceivers 2100 (FIG. 21), for example. Transceiver 3110 permits the router 3100 to both receiver and transmit analog serial data 3112 from and to external devices.

Within the transceiver 3110, a receiver portion 3111 (including receive-lanes 2106, master timing generator 2114, and digital data sample processor 2112, for example) converts the serial analog data signal 3112 to one or more digital data signals, illustrated here as parallel digital data signals 3116.

The parallel digital data signals 3116 are optionally provided to a switch fabric 3118, which can be a programmable switching fabric. The optional switching fabric 3118 provides any of a variety of functionalities.

The optional switching fabric 3118 outputs parallel digital data signals 3120 to second transceiver 3122, which can be implemented as one or more of transceivers 2100 (FIG. 21), for example. A transmitter portion 3123 (including transmit-lanes 2130 and digital data sample processor 2112, for example) within the transceiver 3122 converts the parallel digital data signals 3120 to serial analog data signals 3124 and transmits them across the back plane 3104 to other interface circuit boards 3106n, and/or back to interface circuit board 3106A.

A receiver portion 3111 within the transceiver 3122 receives analog data signals 3124 from the back plane 3104 and converts them to parallel digital data signals 3120. The parallel digital data signals 3120 are provided to the switch fabric 3118, which provides any of a variety of functionalities. The switch fabric 3118 outputs parallel digital data signals 3116 to a transmitter 3123 within the transceiver 3110, which converts them to analog data signals for transmission to an external devices, possibly through the interface component 3108 and the front panel 3102.

Additional interface circuit boards 3106n operate in a similar fashion. Alternatively, one or more of the interface circuit boards 3106A–n are configured with more or less than the functionality described above. For example, in an embodiment, one or more of the interface circuit boards 3106A–n are configured to receive analog data signals from the front panel 3102 and to provide them to the back plane 3104, but not to receive analog data signals 3124 from the back plane 3104. Alternatively, one or more of the interface circuit boards 3106A–n are configured to analog data signals 3124 from the back plane 3104 and provide them to the front panel, but not to receive analog data signals from the front panel 3102.

XI. Further Phase Interpolator Implementations

As described herein, embodiments of the present invention include a phase interpolator 306 that may be implemented in the manner described above with reference to FIGS. 8–14B. However, other implementations may be employed for phase interpolators 306, 306', 2226, and 2814. Two alternative example implementations are illustrated in FIGS. 32 and 33.

FIG. 32 is a block diagram of a phase interpolator implementation 3200. Implementation 3200 includes four reference stages 3202a–d. Like the phase interpolator 801 implementations of FIGS. 8–14B, reference stages 3202a–d receive reference signals 820a–d, respectively. Further, reference stages 802a–d also receive control signals 822a–d, respectively.

Like the phase interpolator implementations described above with reference to FIGS. 8–14B, each reference stage 3202 generates a component signal 824 from its corresponding reference signal 820 according to a scaling factor that is the ratio of its component signal 824 magnitude to its corresponding reference signal 820 magnitude. This scaling factor is determined by corresponding control signal 822, through the use of variable gain amplifiers (VGAs) 3204. Each component signal 824 is combined (e.g., summed) at combining node 804 to produce output signal 826, having an interpolated phase.

As shown in FIG. 32, each reference stage 3202 includes a VGA 3204 that receives a corresponding reference signal 820 and a corresponding control signal 822. For example, reference stage 3202a receives reference signal 820a and control signal 822a. Each VGA 3204 has a gain that determined by the value of it corresponding control signal 822 according to a predetermined relationship. In one such relationship, gain increases as the control signal 822 increases. In an alternative relationship, gain decreases as the control signal 822 increases.

The scaling factor of each reference stage 3202 is determined by the gain of its VGA 3204. In particular, for example, as the gain increases, so does the corresponding reference stage 3202 scaling factor.

FIG. 33 is a block diagram of a phase interpolator implementation 3300. Like implementation 3200, implementation 3300 includes amplifiers. However, implementation 3300 provides adjustable scaling factors through variable resistance.

As shown in FIG. 33, implementation 3300 includes four reference stages 3302a–d that each include a constant gain amplifier 3304 that is coupled to a variable resistance 3306. Like the phase interpolator 801 implementations of FIGS. 8–14B, reference stages 3302a–d receive reference signals 820a–d, respectively. Further, reference stages 802a–d also receive control signals 822a–d, respectively. For each reference stage 3302, its amplifier 3304 receives the corresponding reference signal 820 and its variable resistance 3306 receives the corresponding control signal 822.

Each reference stage 3302 generates a component signal 824 from its corresponding reference signal 822 according to a scaling factor that is the ratio of its component signal 824 magnitude to its corresponding reference signal 820 magnitude. This scaling factor is determined by corresponding component signal 822, through the use of variable resistances 3306. Each component signal 824 is combined (e.g., summed) at combining node 804 to produce output signal 826, having the interpolated phase.

The scaling factor of each reference stage 3302 is determined by the value of its variable resistance 3306. As shown in FIG. 33, each variable resistance 3306 receives a corresponding control signal 822. The value of each variable resistance 3306 is determined by the value of its corresponding control signal 822 according to a predetermined relationship. In one such relationship, resistance decreases as the control signal 822 increases. Alternatively, resistance increases as the control signal 822 increases.

The scaling factor of each reference stage 3302 is determined by the value of its variable resistance 3306. In particular, as the resistance increases, the corresponding reference stage 3202 scaling factor decreases.

Each of the phase interpolators described above are responsive to digital phase control signals for controlling the interpolated phase produced by the interpolator. Thus, such phase interpolators can be advantageously used in digital timing recovery systems implemented as "all" digital timing recovery systems including all digital control loops. This can advantageously improve reliability in producing and operating such timing recovery systems. However, it is to be understood that the present invention can also include phase interpolators responsive to analog phase control signals for controlling the interpolated phase. For example, the present invention can include reference stages (including VGAs, variable resistances, IDACs, and the like) responsive to phase control signals, each having multiple analog levels, to control the magnitudes of corresponding component signals, and thus, the interpolated phase.

Each of phase interpolators 306, 306', $2226_1$, $2226_2$, and 2814, described above, can be implemented in many ways, as would be apparent to one of ordinary skill in the relevant art(s) after reading the description provided herein.

XII. Conclusion

While various embodiments of the present invention have been described above, it should be understood that they have been presented by way of example only, and not limitation. For example, aspects of the present invention are described above in the context of a phase interpolator having four reference stages. However, the present invention may include phase interpolators having any number of reference stages.

For instance, the present invention may include a three reference stage phase interpolator. In this embodiment, each reference stage receives one of three reference signals that are offset in phase by 120 degrees. Alternatively, the present invention may include a two reference stage phase interpolator, each reference stage receiving one of two reference signals having spaced phases.

Finally, it will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A phase interpolation method, comprising:
   (a) producing a plurality of binary control signals in response to a phase control input;
   (b) scaling each of a plurality of reference signals into a corresponding component signal in response to a corresponding plurality of binary control signals, wherein each of the reference signals has a distinct phase; and
   (c) combining the component signals into an output signal having an interpolated phase,
   wherein step (b) comprises converting each of four reference signals into a corresponding component signal in response to a respective plurality of binary control signals, wherein phases of the four reference signals are separated at substantially 90 degrees intervals.

2. A phase interpolation method, comprising:
   (a) producing a plurality of binary control signals in response to a phase control input;
   (b) scaling each of a plurality of reference signals into a corresponding component signal in response to a corresponding plurality of binary control signals, wherein each of the reference signals has a distinct phase; and
   (c) combining the component signals into an output signal having an interpolated phase,
   wherein a value of each binary control signal is a sum of a plurality of control signals.

3. A phase interpolation method, comprising:
   (a) producing a plurality of binary control signals in response to a phase control input;
   (b) scaling each of a plurality of reference signals into a corresponding component signal in response to a corresponding plurality of binary control signals, wherein each of the reference signals has a distinct phase; and
   (c) combining the component signals into an output signal having an interpolated phase,
   wherein a value of a scaling factor used for scaling each of a plurality of reference signals increases with values of corresponding binary control signals.

4. The method of claim 1, wherein each of the component signals has a distinct phase determined by the corresponding reference signal phase.

5. The method of claim 1, wherein step (b) comprises:
   scaling each reference signal into the corresponding component signal according to a scaling factor; and
   adjusting the scaling factor in response to values of the corresponding binary control signals.

6. The method of claim 1, wherein step (c) comprises summing the component signals into an output signal having an interpolated phase.

7. The method of claim 1, wherein step (b) comprises converting a differential reference signal into a corresponding differential component signal; and wherein step (c) comprises combining the differential component signals into a differential output signal having an interpolated phase.

8. The method of claim 1, wherein step (a) comprises adjusting the plurality of binary control signals such that the output signal produced in step (c) is phase aligned with a serial data signal.

9. A phase interpolation circuit, comprising:

stage controller means for producing binary control signals in response to a phase control input;

converting means for converting each of the plurality of reference signals into a corresponding component signal in response to a scaling factor, wherein each of the reference signals has a distinct phase;

scaling means, coupled to the converting means, for scaling the reference signals in response to values of the corresponding binary control signals; and combining means for combining the component signals into an output signal having an interpolated phases, wherein a value of a scaling factor used by the scaling means for scaling the reference signals increases with values of the corresponding binary control signals.

10. The circuit of claim 9, wherein each of the component signals has a distinct phase determined by the corresponding reference signal phase.

* * * * *